United States Patent [19]
Taguchi et al.

[11] Patent Number: 5,475,210
[45] Date of Patent: Dec. 12, 1995

[54] NOISE REDUCTION SYSTEM FOR OPTICAL RECORD AND REPRODUCTION APPARATUS USING AUTO-POWER CONTROLLED SEMICONDUCTOR LASER DEVICE

[75] Inventors: Toyoki Taguchi, Yokohama; Toshihiro Sugaya, Ibaraki; Hisashi Yamada, Yokohama; Kei Shimura, Yokohama; Isao Hoshino, Yokohama; Masahiko Tanaka, Yokohama; Teruo Murakami, Yokohama; Hiroharu Satoh, Tokyo; Hiromichi Kobori, Yokohama; Sadanari Fujimoto, Tokyo, all of Japan

[73] Assignee: Kabushiki Kaisha Toshiba, Kawasaki, Japan.

[21] Appl. No.: 73,320

[22] Filed: Jun. 8, 1993

Related U.S. Application Data

[63] Continuation-in-part of Ser. No. 942,463, Sep. 9, 1992, Pat. No. 5,250,796.

[30] Foreign Application Priority Data

| Sep. 9, 1991 | [JP] | Japan | 3-229148 |
| Mar. 25, 1992 | [JP] | Japan | 4-066849 |
| Aug. 25, 1992 | [JP] | Japan | 4-225491 |
| Mar. 12, 1993 | [JP] | Japan | 5-052247 |
| Mar. 15, 1993 | [JP] | Japan | 5-053797 |

[51] Int. Cl.$^6$ .................................................. G01J 1/32
[52] U.S. Cl. .............................. 250/205; 250/201.5
[58] Field of Search .......................... 369/44.26, 44.11, 369/116; 250/205, 201.5

[56] References Cited

U.S. PATENT DOCUMENTS

| 4,908,815 | 3/1990 | Gregg et al. | 369/116 |
| 5,105,413 | 4/1992 | Bakx | 369/116 |
| 5,216,660 | 6/1993 | Iimura | 369/116 |

FOREIGN PATENT DOCUMENTS

| 0119547 | 7/1984 | Japan | 369/116 |
| 64-78437 | 3/1989 | Japan . | |
| 2-192041 | 7/1990 | Japan . | |
| 4-263124 | 9/1992 | Japan . | |

Primary Examiner—William L. Sikes
Assistant Examiner—James A. Dudek
Attorney, Agent, or Firm—Oblon, Spivak, McClelland, Maier, & Neustadt

[57] ABSTRACT

An optical disk apparatus includes a semiconductor laser for emitting a light beam, and an automatic power control or APC circuit for driving the laser. A compound prism structure is optically coupled to the laser in an optical head section, and defines a first optical path for causing a front laser light to be projected onto a rotating optical disk and guiding a reflected light therefrom toward a first photodetector, and a second optical path for guiding a part of the reflected light toward a second photodetector. An output signal of the first photodetector is used to generate a reproduced information signal. An output signal of the second photodetector is fed back to the APC circuit as a front light monitor signal. A part of a laser control signal internally generated in the APC circuit is supplied through a wiring line to a noise reduction circuit as a laser noise monitor signal. The noise reduction circuit subtracts this noise monitor signal from the reproduced information signal to provide a noise-suppressed information signal.

32 Claims, 36 Drawing Sheets

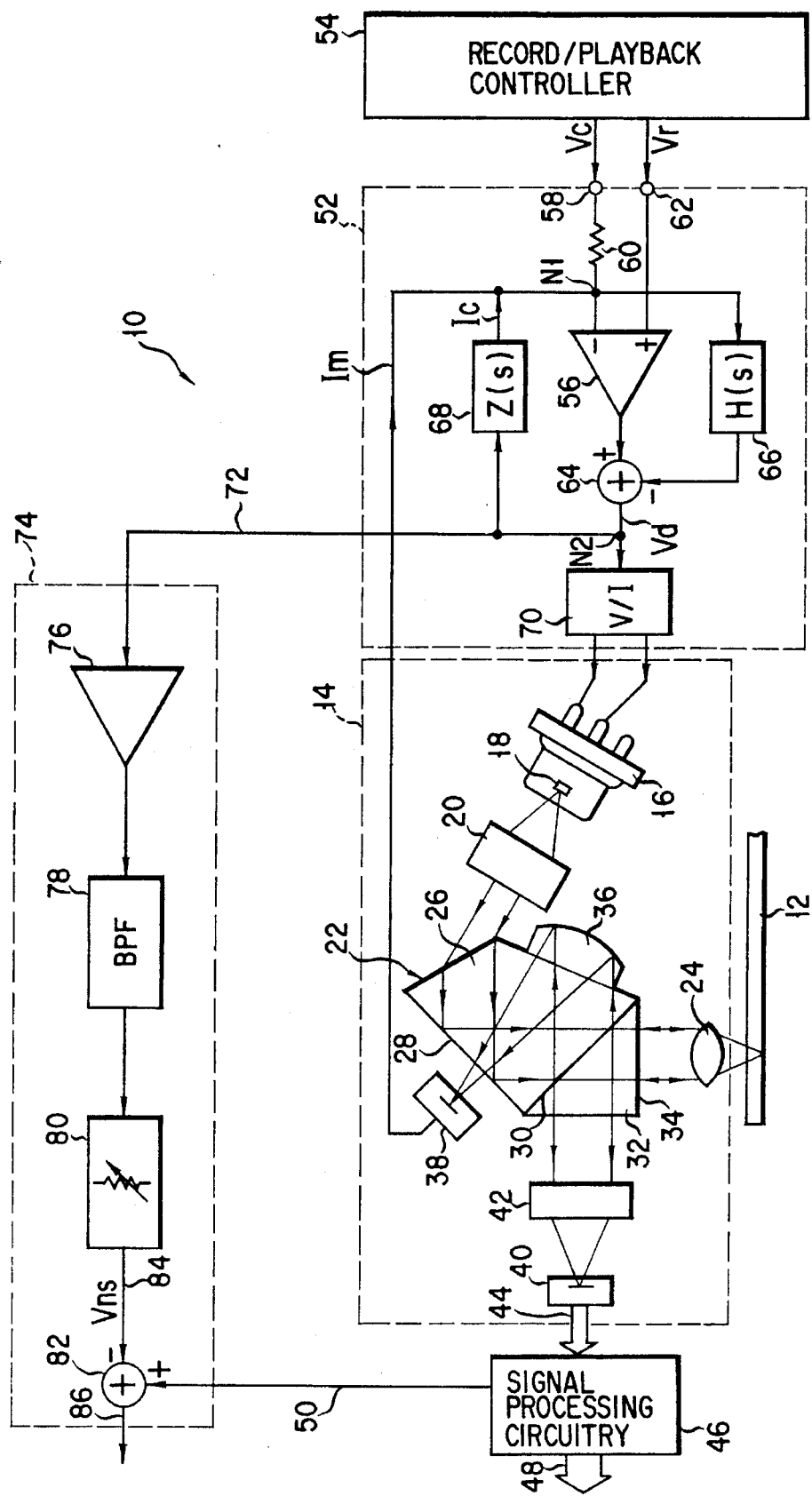
F I G. 1

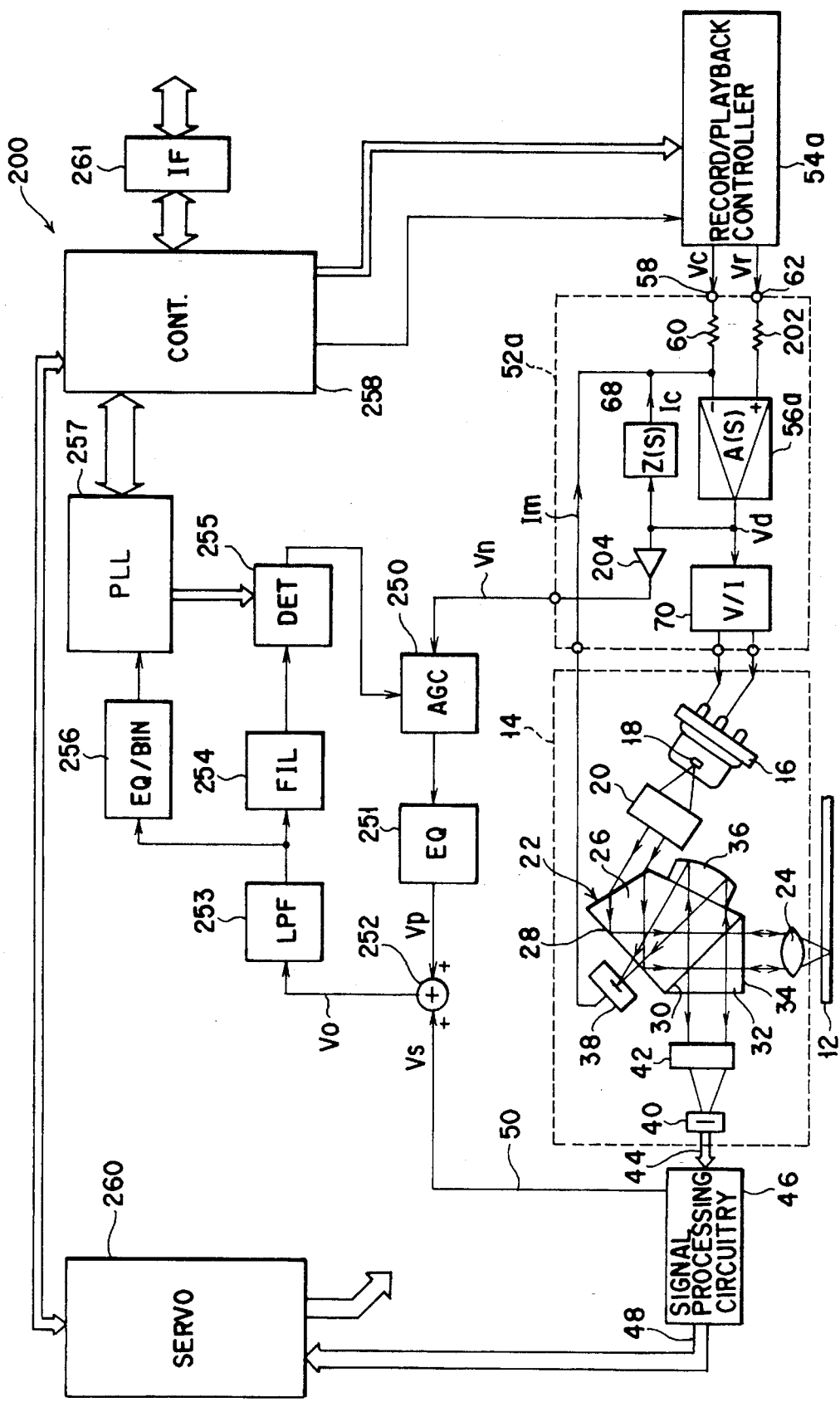
F I G. 10

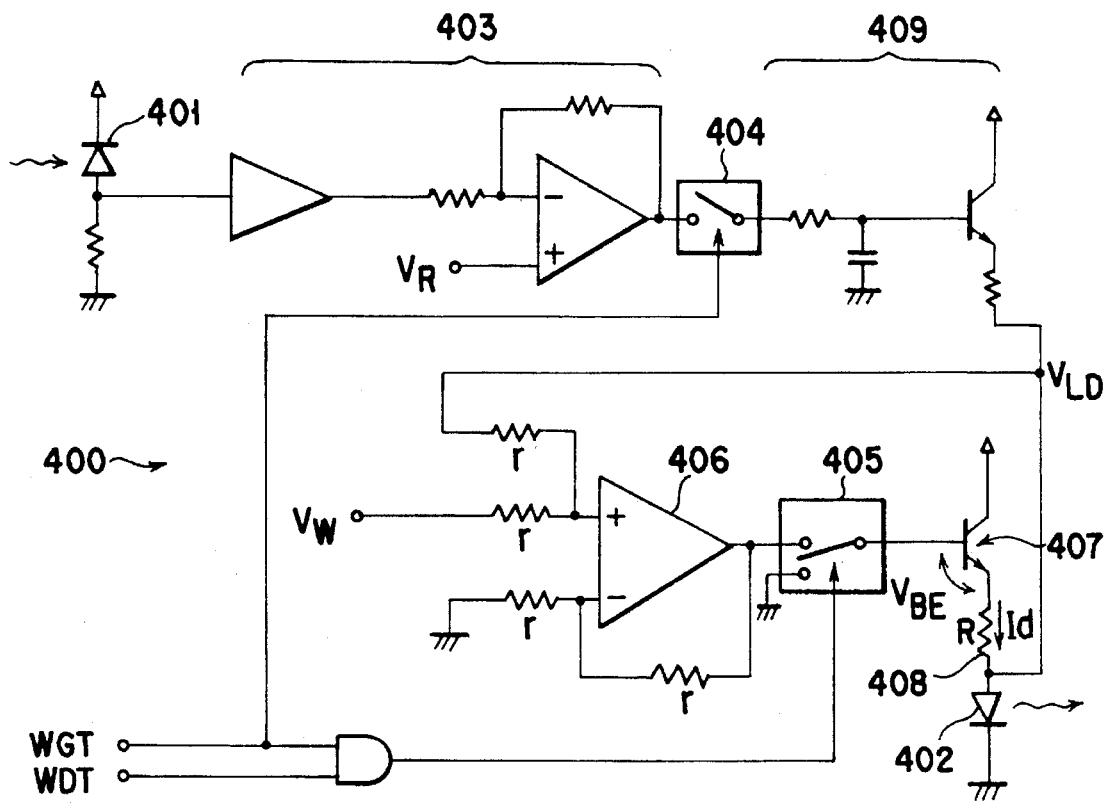
F I G. 19
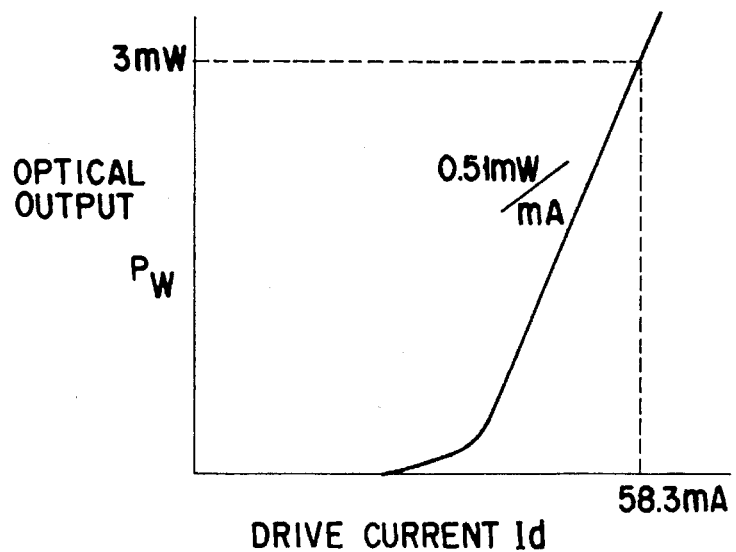
F I G. 21

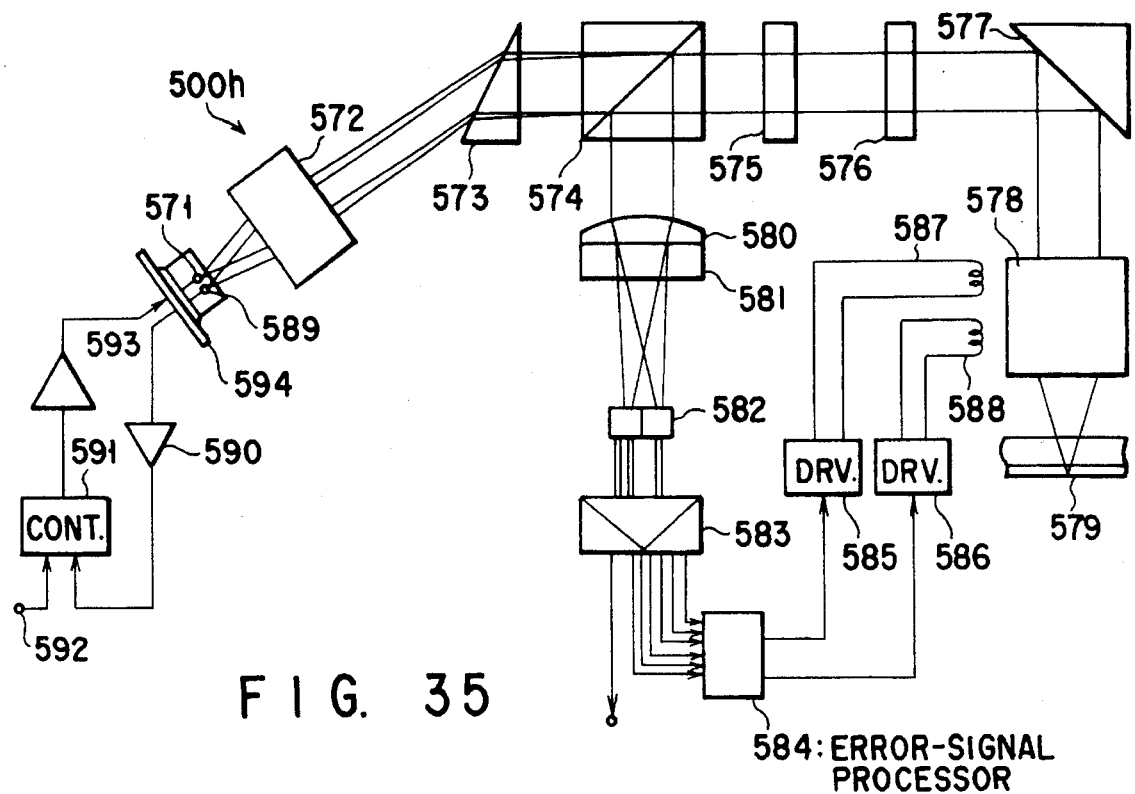
F I G. 35
584: ERROR-SIGNAL PROCESSOR
F I G. 36A  F I G. 36B  F I G. 36C
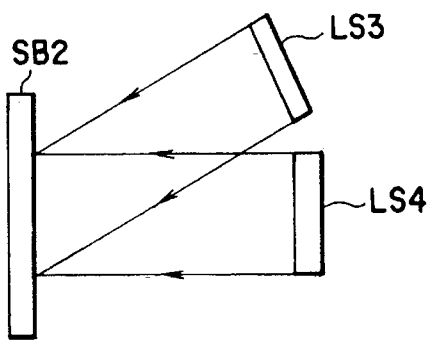
F I G. 37

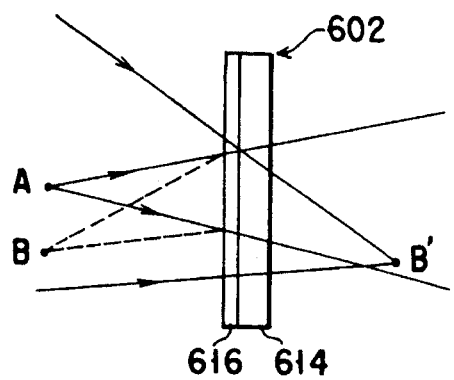
F I G. 42
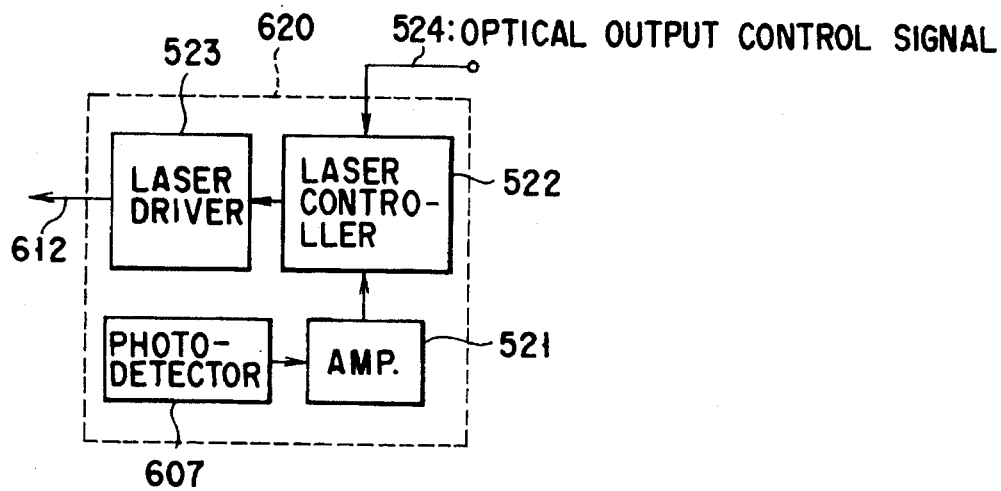
F I G. 43
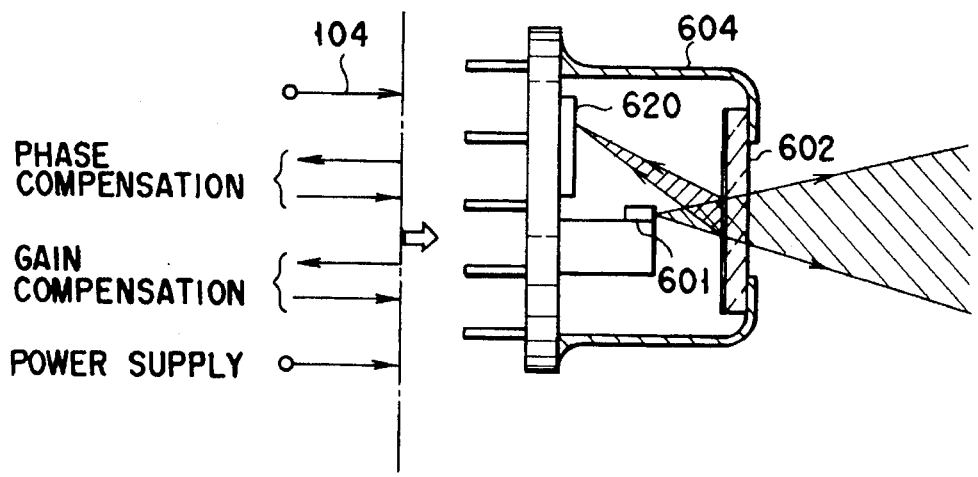
F I G. 44

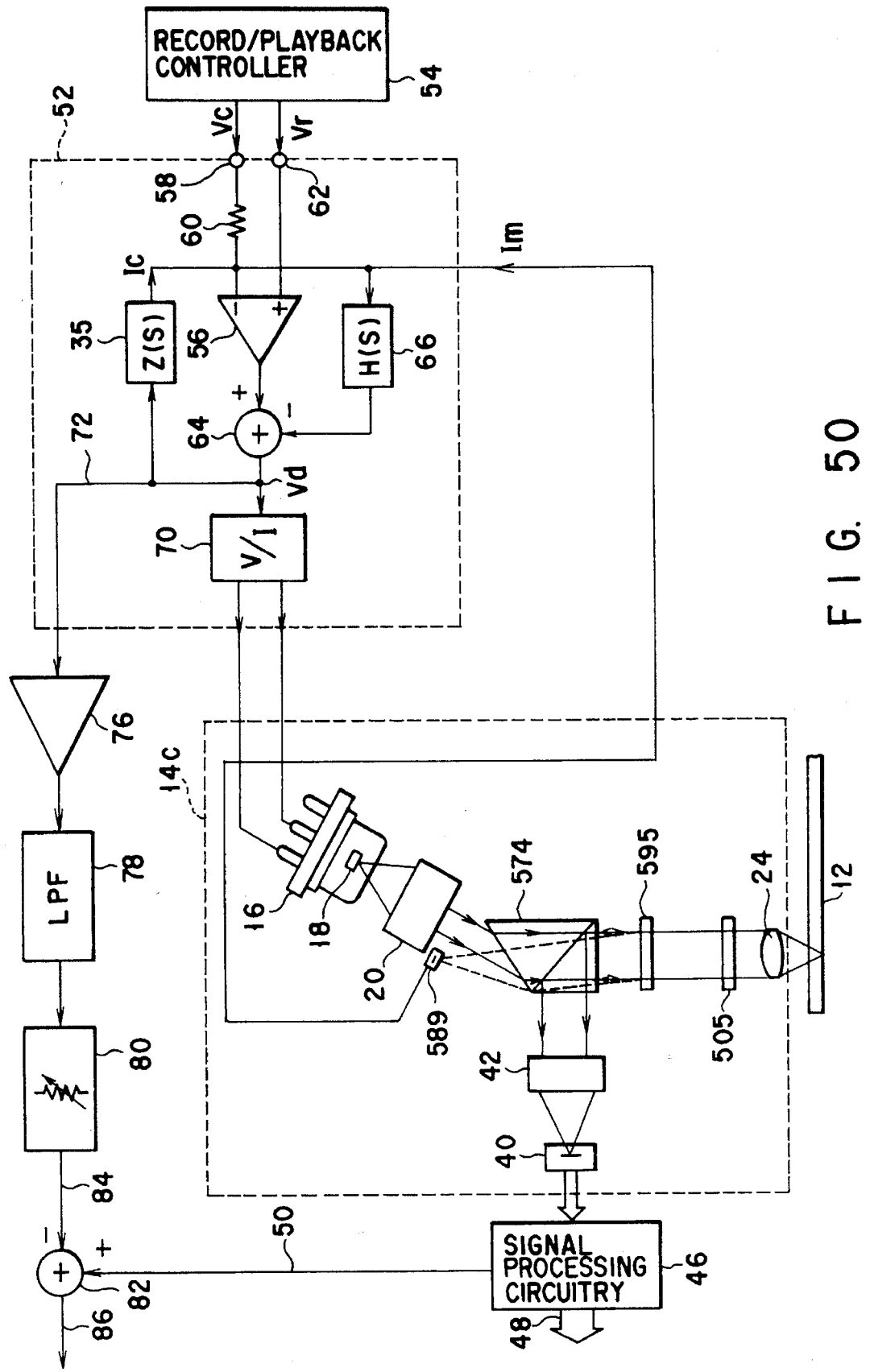
F I G. 50

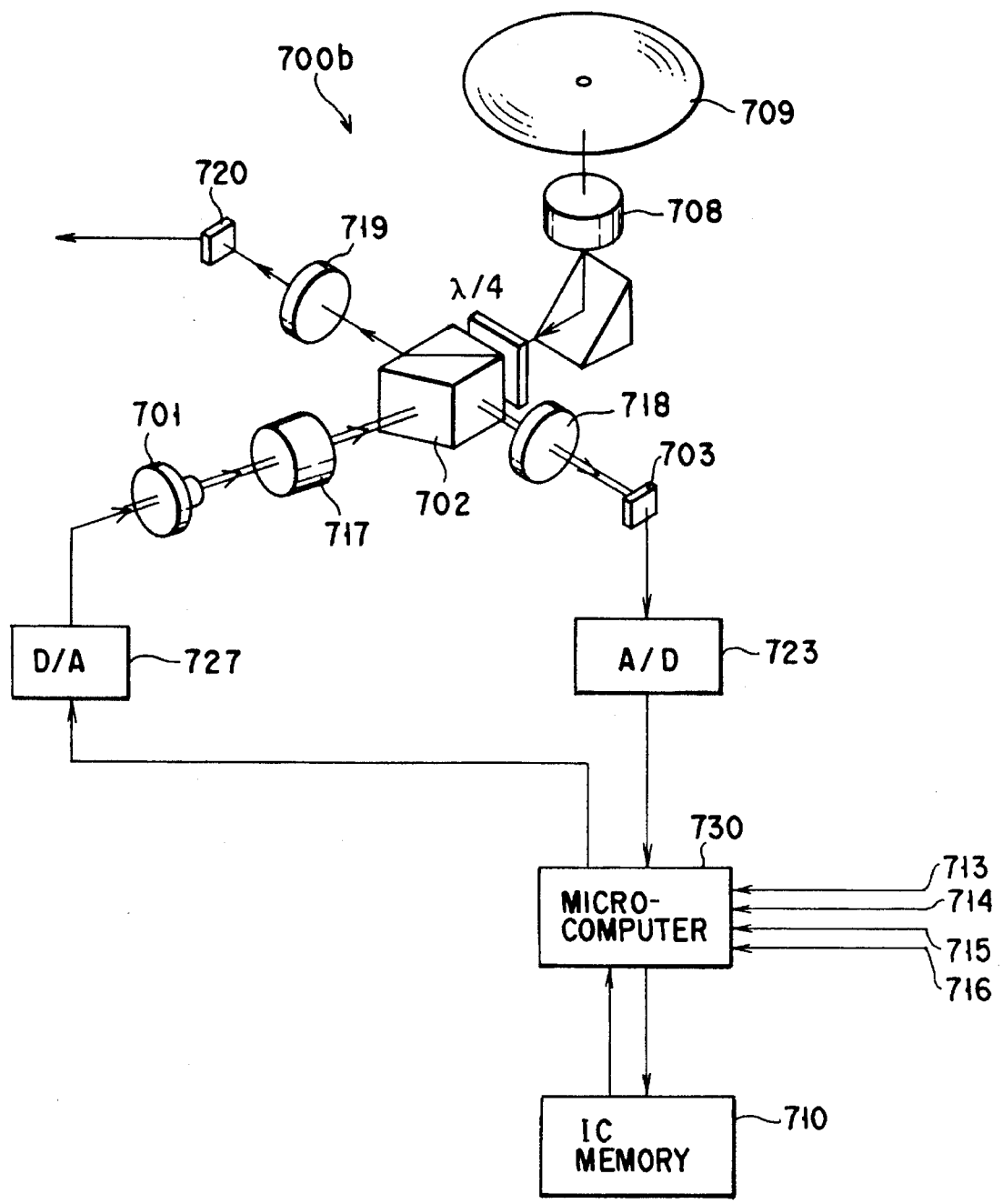
F I G. 58

NOISE REDUCTION SYSTEM FOR OPTICAL RECORD AND REPRODUCTION APPARATUS USING AUTO-POWER CONTROLLED SEMICONDUCTOR LASER DEVICE

The present application is a Continuation-In-Part application of U.S. application Ser. No. 07/942,463 filed Sep. 9, 1992, now U.S. Pat. No. 5,520,796.

BACKGROUND OF THE INVENTION

1. Filed of the Invention

The present invention relates generally to a light-emission drive/control system for solid-state optical devices, and more particularly to an optical record and reproduction apparatus for writing and/or reading information into or from an optical record carrier body by using a semiconductor laser device.

2. Description of the Related Art

Recently, an optical record/reproduction apparatus that stably stores an increased amount of information higher recording density is becoming important more and more. In the recent manufacture of highly advanced digital equipment such as a computer system, an external storage unit employed therein is required to increase the information storage capacity, as the computer tasks increase to meet a trend that the system deals with video movie images as well as static graphics images. Also, in the manufacture of a home-use or an industrial-use video movie playback apparatus, as the quality of a reproduced image (the horizontal and vertical resolutions) increases, the required recording density of a record carrier body should increase to achieve an extended length of playback time. In either case, as the recording density increases it will become more critical and less feasible to achieve higher operation reliability of the high-density record and reproduction apparatus.

The presently available optical record and reproduction apparatus employs a solid-state light-emitting device to read or reproduce an information being stored in a rotatable round disk-shaped optical record carrier body. Such a record carrier body is generally called the "optical disk"; it may spell "optical disc" alternatively. A variety of types of optical disks are presently available, including an additional-write optical disk, phase-change (PC) type optical disks that can allow overwrite, magneto-optical (MO) disks, and so forth. The solid-state light emitting device may be a semiconductor laser. The laser emits a light beam at a selected wavelength, which is projected onto the information record layer of a rotating optical disk. A reflected light from the optical disk is guided to enter an optical detector (photodetector). The photodetector detects the reflected light to generate an electrical signal indicative of reproduced information.

With the increasing needs for high performance and reliability of the optical record and reproduction apparatus (also referred to as the "optical disk drive apparatus," or "optical disk drive"), the high-accuracy drive of semiconductor laser devices has been demanded strongly. In particular, to attain an enhanced quality of the reproduced information such as an optical-disk image, it is one of the most important subjects that the optical disk record/reproduction apparatus maintains the signal-to-noise ratio of a reproduced image as high as possible. The improvement of the signal-to-noise ratio of the reproduced image may affect the maintenance of high-density record performance of the optical disk, because such signal-to-noise ratio improvement leads to a decrease in the total storage amount of information signals to be written into the optical disk, causing a resultant effective recording density to increase.

To improve the signal-to-noise ratio of the optical disk record/reproduction apparatus, it is indispensable to suppress or prevent a noise (laser noise) from being generated in the semiconductor laser itself. In the employment of any one of the various types of optical disks indicated above, the laser noise is required to remain −120 dB/Hz or less in the relative-intensity-noise (RIN). Unfortunately, the simple use of the existing semiconductor laser may decrease the RIN causing it to range from −105 to −110 dB/Hz when the laser is 830 nanometers (nm) in oscillation wavelength and 40 mW in output power.

Conventionally, the "wide-band front-light automatic power control (APC)" method is known and utilized to suppress or eliminate the laser noise generation while allowing a presently available semiconductor laser to be used as a light source of the optical disk record/reproduction apparatus. The wide-band APC is described, for example, in H. Satoh et al., "Fast Laser Power Control for High density Optical Disk Systems," Optical Data Storage Conference, Feb. 25–26, 1991, at pp. 182–185/WA4. With the APC method, a part of a front light of a semiconductor laser being actually projected onto the optical disk in a read or playback mode is guided to a photodetector which converts it into a corresponding electrical detection signal. The detection signal may be used for the control of the light output of the semiconductor laser. Unlike a "rear-light" APC using a rear light emitted from the rear surface of the semiconductor laser as a monitor light, the front-light APC can attain an expanded controllable frequency band (control range) in its control loop, thus enabling the laser noise generation to decrease depending on the loop gain of the control system.

In the wide-band front-light APC, whether or not the maximum advantage can be taken therefrom may hang on the very point of how much the controllable range can be broadened with respect to the frequency band of a reproduced signal. An example of the feed-forward control technique providing such broad control range is disclosed in U. S. Pat. No. 5,097,473 by Toyoki Taguchi under the title of "Stabilized-Feedback Control Device For Semiconductor lasers."

However, the recent innovations are never satisfied with the improvement of the signal-to-noise ratio in the optical disk record/reproduction apparatus based on the laser noise reduction method, and still demands further improvement in accommodation for the future use. Particularly, the requirement to improve the signal-to-noise ratio in the high frequency band becomes very critical in the reproduction of higher precision images on high-density optical disks. Under such a condition, a highly advanced laser control technique is demanded which can provide a more powerful laser noise reduction than ever.

SUMMARY OF THE INVENTION

It is therefore an object of the present invention to provide a new and improved noise reduction technique for a solid-state light emission device.

It is another object of the invention to provide a new and improved laser-noise reduction apparatus which can attain an enhanced signal-to-noise ratio in the reproduction of a high-density optical record carrier body.

It is still another object of the invention to provide a new and improved optical record and reproduction apparatus which can achieve an enhanced signal-to-noise ratio in the reproduction of information being stored in a high-density optical record carrier body.

In accordance with the above objects, the present invention is drawn to a specific apparatus for suppressing or eliminating a noise from a reproduced information signal read out of an optical record carrier body using a solid-state light emission device, which apparatus includes a driver for receiving a control voltage signal externally supplied thereto to designate a light emission of the light emission device, and for supplying the light emission device with a corresponding drive current signal in response to the control signal. An optical detector is provided for partially receiving a front light emitted by the light emission device, and for generating a detection current signal corresponding in magnitude to a detected amount of light. A compensator is coupled to the driver and the optical detector, for generating a voltage signal that compensates for a possible variation in the front light emitted by the light emission device, which is fed back to the driver. This voltage signal is also supplied to a noise reduction section, which receives the reproduced information signal. The noise reduction section uses the voltage signal as a noise monitor signal, and subtracts this noise monitor signal from the reproduced information signal to generate a noise-suppressed reproduction signal.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a diagram showing one embodiment of an optical disk record/reproduction apparatus in accordance with the principles of the present invention.

FIG. 10 is a diagram showing an optical record and reproduction (playback) apparatus in accordance with a further embodiment of the invention.

FIG. 19 is a diagram showing the overall configuration of a semiconductor laser driving circuit that may be preferably used in the optical record/playback apparatus in accordance with the invention.

FIG. 21 is a diagram showing the current versus optical output characteristic of a semiconductor laser of FIG. 19.

FIGS. 32 to 35 show optical record/playback apparatuses in accordance with other embodiments of the invention.

FIGS. 36A to 36C are diagrams showing different polarization states of input/output luminous flux to/from a beam splitter of FIG. 35, and FIG. 37 is a diagram for explaining the arrangement of a diffraction type element of FIG. 35.

FIG. 42 shows the arrangement of a reflection type diffracting device of FIG. 41.

FIG. 43 shows a modification of the embodiment of FIG. 41, and FIG. 44 is a diagram showing an optical output control device employing the controller of FIG. 43.

FIGS. 48 to 51 illustrate some modifications of the embodiment shown in FIG. 4 by employing the arrangements of FIGS. 24, 33, 39 and 46 respectively.

FIGS. 57 and 58 are diagrams each showing an optical disk record/playback system in accordance with another embodiment of the invention.

DETAILED DESCRIPTION OF THE PREFERRED EMBODIMENTS

Figure 2:
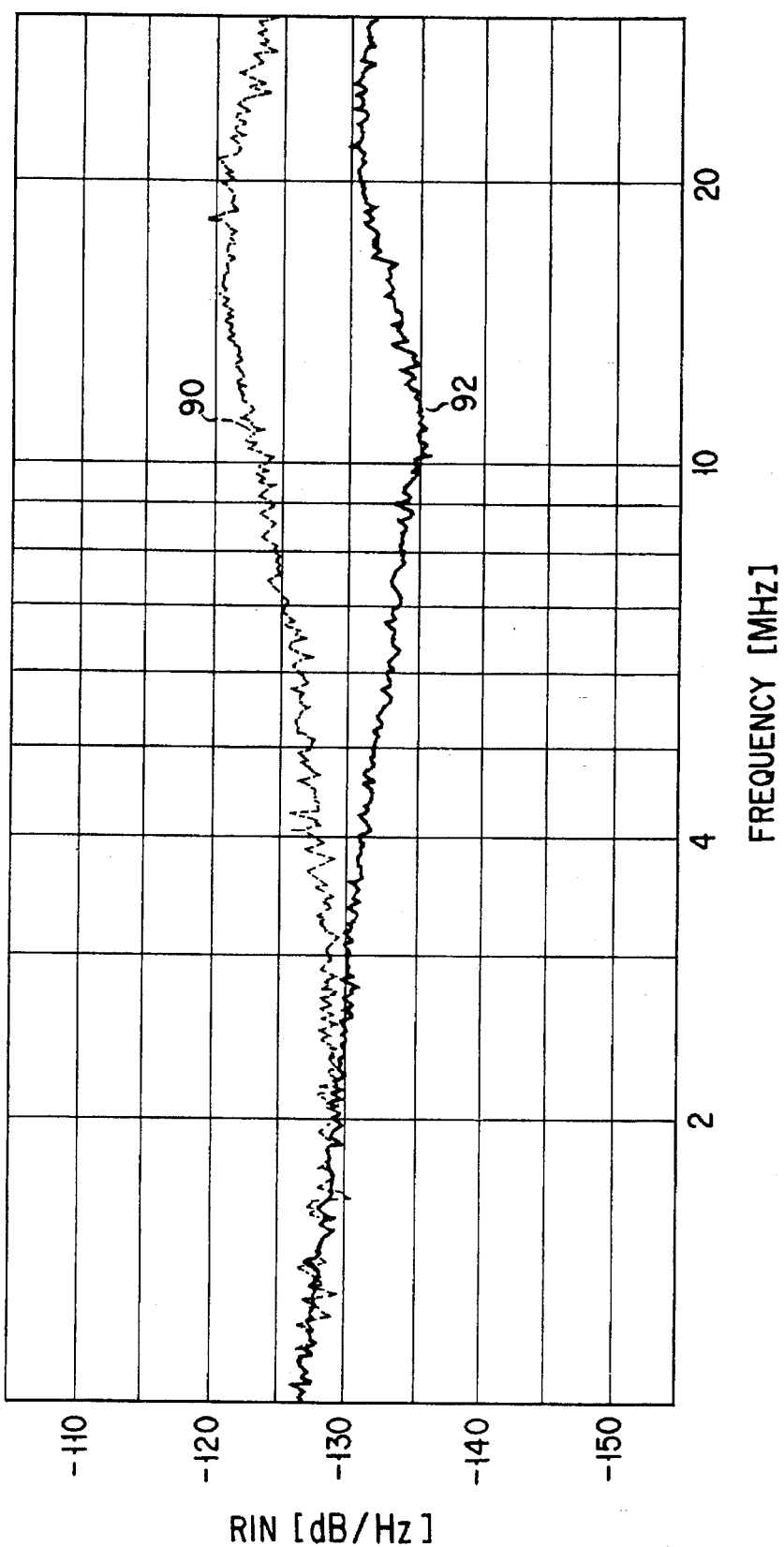
FIG. 2 is a characteristic diagram showing an experimental result of the relative-intensity-noise (RIN) versus frequency relation of a reproduced information signal in the embodiment of FIG. 1.

Referring now to FIG. 1, an optical record and reproduction (playback) apparatus in accordance with one preferred embodiment of the present invention is generally designated by the numeral 10. The optical record/playback apparatus 10 is arranged to play back or reproduce information recorded on a round disk-shaped optical carrier body 12. As is well known, this carrier body may be an optical disk (or optical disc) which has a round disk-shaped substrate, a radiation-sensitive information-record layer provided thereon, and a transparent protection film overlying the information layer. The intermediate information layer is provided with a specific surface configuration called the "pit train" that is formed or defined by using either a known "stamper" process or a projection of a write light-beam onto the information layer along a spiral track or a plurality of concentric tracks. The apparatus 10 will be called an "optical disk record/playback apparatus" or "optical disk drive apparatus", or, more simply, "optical disk drive" in the rest of the description.

The optical disk 12 is set in a known rotation-drive mechanism (not shown) including a rotary motor and a spindle, which is driven by the motor causing disk 12 to rotate at a constant or variable velocity. The optical disk drive apparatus 10 includes an optical head section 14, which faces the rotating disk 12 and may move linearly in the radial direction of disk 12. Optical head section 14 includes a semiconductor laser device 16 as a light source. Semiconductor laser device 16 contains therein a semiconductor laser chip 18, which emits and sends forth an oscillated light beam at a preselected wavelength. The laser light beam is projected onto the rotating optical disk 12 by way of an optical system including a collimator lens 20, a compound prism structure 22, and an objective 24. Compound prism structure 22 essentially consists of a beam-shape converting prism 26, an optical plane 28 serving as a reflection mirror, another optical plane 30 functioning as a polarization beam splitter, a triangle prism 32, a ¼ wavelength (λ/4 or quarter undulation) plate 34 and a concave mirror 36.

As shown in FIG. 1, the optical head section 14 includes two photodetectors 38 and 40. First photodetector 38 is arranged to face one optical plane of the beam-shape converting prism 26, and receives a reflected light from concave mirror 36. Second photodetector 40 is a multiple division photodetector, which is arranged to face one of the two optical planes of triangular prism 32, the other of which faces the objective 24, at a constant distance therebetween. Second photodetector 40 has a predetermined number of divided photosensitive areas. A condenser unit 42 including a condenser lens is arranged between photodetector 40 and triangular prism 32. A light component output from triangular prism 32 is condensed by condenser 42 and is then concentrated on photodetector 40. Photodetectors 38, 40 may be p-i-n photodiodes.

After passing through the collimator lens 20, the light emitted by the semiconductor laser device 16 is divided by compound prism structure 22 into two light components that progress along two different optical paths. The main component of the laser light is used as a read light, which is projected through objective 24 onto the information-record layer (not shown) of the rotating optical disk 12. The subsidiary component of the laser light is reflected by concave mirror 36 to photodetector 38 as a condensed light beam.

More specifically, the output light of the semiconductor laser chip 18 in the light source 16 is first reshaped by collimator lens 20 to a parallel luminous-flux light beam, which is then converted by beam-shape conversion prism 26 into a beam of almost circular profile. This circular-profile beam is totally reflected by optical plane 28 toward tilted optical plane 30. Plane 30 is a polarization beam splitter, which allows the transmission of about 90 percent of the circular beam therethrough. The transmitted light passes through quarter undulation plate 34 to become a circularly polarized light beam. This light beam goes to objective 24, which causes it to be focused on the information layer of optical disk 12.

Note here that the power of an incident light to the optical disk 12 may vary in accordance with the operation modes of the optical disk drive apparatus 10. In a write (record) mode of apparatus 10, semiconductor laser chip 18 emits a high-power light beam with a power ranging from 10 to 20 milliwatts (mW). In a read (playback or reproduction) mode, laser chip 18 sends forth a low-power light beam that is approximately one tenth the write beam in magnitude, that is, 1 to 2 mW. Obviously, the high-power beam is a write beam for forming a series of pits on the information layer of optical disk 12; the low-power beam is a read beam for reading or playing back the stored information of optical disk 12.

A reflected light from the optical disk 12 passes through objective 24 to be optically converted into a parallel beam, which returns along the optical path previously described. More specifically, the reflected light passes through the quarter undulation plate 34 to become a linearly polarized light. The plane of polarization of this light is rotated through 90 degrees inside triangular prism 32; therefore, approximately the 90% of the polarized light is reflected to condenser 42 by polarization beam splitter 30. Condenser 42 sends forth a condensed light beam of higher intensity, which is concentrated on multi-division photodetector 40. Photodetector 40 produces a current of corresponding magnitude in its divided photosensitive areas. A current signal 44 appears at the output of photodetector 40. Current signal 44 is supplied to a signal processing circuitry 46 associated with the optical head section 14. Signal processing circuitry 46 includes a known preamplifier serving as a signal amplifier and a known processing circuit. Signal processor 46 carries out a known current-to-voltage (I/V) conversion so that current signal 44 is converted into a corresponding voltage signal, which is then subjected to necessary signal-processings thereby to produce a servo signal 48 for focusing/tracking control and a reproduced information signal 50 electrically indicative of the stored information of optical disk 12.

Of the output light of the semiconductor laser chip 18, the remaining 10 percent of the light reflected by the polarization beam splitter 30 is forced to enter the concave mirror 36 as a front monitor light. As shown in FIG. 1, concave mirror 36 causes the light component to be concentrated on photodetector 38. Photodetector 38 generates an electrical detection signal (current signal) that corresponds in magnitude to the intensity of the incident light thereonto. This signal is a monitor signal Im, which acts as a control signal for automatic power control (APC) to be described later. Under such circumstances, it is recommendable that photodetector 38 comprises a specific p-i-n photodiode being higher in speed than the multi-division photodetector 40.

The reason why the 10%-light component of the output beam of the semiconductor laser chip 18 being reflected by polarization beam splitter 30 is employed as the front monitor light to be concentrated on the APC photodetector 38 is as follows. The bad influence of laser noise becomes most severe in the playback mode of the optical disk drive 10. At this time, the read beam emitted by laser chip 18 is about 1 to 2 mW as previously described. Accordingly, using the 10%-light component as the front monitor light ensures that the amount of incident light on photodetector 38 is sufficient for the purposes of photodetection.

As shown in FIG. 1, the optical disk drive apparatus 10 includes a laser control circuit 52, which is coupled to the optical head section 14 and an optical information record/playback control circuit 54. The laser controller 52 is the circuitry that electrically drives the semiconductor laser device 16 and that performs a stabilized feedback control for laser-noise reduction in accordance with a wide-band automatic power control (APC) scheme. This circuit will be referred to as the "APC unit" hereinafter. One typical circuit configuration of APC unit 52 is described for example in U.S. Pat. No. 5,097,473, Toyoki Taguchi, filed Dec. 20, 1990 (Date of Patent is Mar. 17, 1992).

The APC unit 52 includes an operational amplifier 56. This amplifier has an inverting input connected to a first input terminal 58 through a resistive element 60 for current-to-voltage conversion, and a non-inverting input coupled to a second input terminal 62. The first terminal 58 is supplied with a control signal (modulation signal)Vvc by the record/playback controller 54. The second terminal 60 is applied by controller 54 with a reference signal Vr for the control signal Vc, which potentially indicates a reference voltage having a constant level for the control signal Vc. Amplifier 56 is connected at its output to a first input of an adder circuit 64. Amplifier 56 receives control voltage Vc by way of resistive element 60, detects any difference between monitor signal Im and a control current signal flowing through resistive element 60, and produces an output voltage signal corresponding to the detected difference.

APC unit 52 further includes a feed-forward correction amplifier 66, a compensation circuit 68, and a current drive circuit 70. The correction amplifier 66 has an input connected to the non-inverting input of the operational amplifier 56 at a circuit node N1, and an output coupled to a second input of the adder 64. An output voltage Vd of adder 64 appears at a node N2. Compensation circuit 68 has an input connected to node N2 and an output connected to node N1. An output current (compensation current) Ic of compensation circuit 68 flows through node N1, to which the above-mentioned laser monitor signal Im is also supplied. Current driver 70 is electrically coupled to the semiconductor laser device 16 containing laser chip 18.

The APC unit 52 is basically responsive to the control signal Vc and the reference signal Vr supplied by the record/playback controller 54. Control signal Vc is a voltage signal that is modulated in accordance with an information signal to be stored in the optical disk 12 in a write (record) mode. In a read (playback) mode, control signal Vc is a direct current (DC) voltage having a constant potential level.

Reference signal Vr remains potentially constant throughout the both modes. Therefore, in the playback mode, a potential difference between terminals 58, 60 is kept unchanged. Such a constant terminal-to-terminal potential difference may determine the total amount of front light emitted by semiconductor laser device 16.

The feed-forward correction amplifier 66 is provided to compensate for a junction capacitance inherent in the photodetector 38, which capacitance will be a serious bar to further development in the broad-band laser power control. A compensation current Ic of compensator 68 flows in node N1, which is coupled to the inverting input of the main operational amplifier 56, in addition to the monitor current signal Im, whereby a response delay of monitor current Im that will possibly occur is compensated for by compensation current Ic to attain an expanded or broadened control range. The potential difference between the inverting input and the non-inverting input of amplifier 56 decreases due to the inflow of monitor current Im. This potential difference is amplified by correction amplifier 66 in a parallel manner. The amplified potential difference is added by adder 64 to the output voltage of main operational amplifier 56.

The output voltage Vd of adder 64 is then subjected to two different kinds of signal processing operations at node N2. In the first place, voltage Vd is applied to the current driver 70. Driver 70 carries out a voltage-to-current conversion internally to generate an output current, which is supplied to the semiconductor laser device 16 as a laser drive current. Semiconductor laser 16 oscillates and emits a laser light in response to the drive current. It can thus be said that the amount of a front light emitted by laser 16 is continuously controlled so that the potential difference between the inverting input and the non-inverting input of amplifier 56 is zero.

Secondly, the output voltage Vd of adder 64 is supplied by a wiring line 72 to a noise reduction circuit 74, which includes an AC-coupled buffer amplifier 76, a band-pass filter 78, a gain adjustment circuit 80, and a subtractor circuit 82. The AC-coupling frequency of buffer amplifier 76 is selected at several megahertz (MHz) so as to remove or eliminate a certain low frequency component, which is emphasized by the main operational amplifier 56 in the APC unit 52. Practically, such strict frequency setting may be unnecessary, because APC unit 52 exhibits some noise-reducing function by itself.

The band-pass filter 78 is an electrical filter that has an approximately uniform transmission characteristic only in a limited frequency band corresponding to that of the information signal recorded on the optical disk 12. Note that, since band-pass filter 78 is intended to compensate for a low-frequency transmission characteristic being inherently present in the information reproduction system through which the reproduced information signal 50 passes, it is theoretically desirable that band-pass filter 78 is substantially equivalent in characteristic to the information reproduction system. Practically, however, band-pass filter 78 will not be required to have so an exact equivalency or consistency in transmission characteristic. This may allow band-pass filter 78 to be merely comprised of a known one-dimensional low-pass filter.

The gain adjuster 80 includes a variable resistor, which potentially adjusts the output voltage of band-pass filter 78. The adjusted voltage signal is supplied to a first input of subtractor 82 as a laser noise monitor signal 84 (Vns), which successively represents a laser noise that is presently occurring. Subtractor 82 is supplied at its second input with the reproduced information signal 50. Subtractor 82 produces a signal 86 indicative of any difference between signals 50, 84, which signal 86 appears at an output of subtractor 82. Very importantly, signal 84 is a higher-fidelity noise signal that is principally the same in phase as an undesirable laser noise component actually contained in the reproduced information signal 50 and is thus indicative of the actual noise amount with almost complete fidelity. Therefore, the subtraction result obtained at the output of subtractor 86 may correspond to a pure reproduced information signal that can be maximally suppressed in inclusion or mixture of laser noise.

With such an arrangement, the laser-noise reduction circuit 74 is specifically responsive to the drive control signal Vd generated by the APC unit 52 for semiconductor laser device 16 emitting a read light-beam for the optical disk 12. The noise reduction control is performed by modifying signal Vd so as to be identical in characteristic with the information reproduction system to obtain noise monitor signal 84, and by subtracting this signal 84 from the reproduced information signal 50. Signal Vd indicates an actual noise being presently contained in the laser beam from the front APC-controlled semiconductor laser device 16. This can be said because the front APC operation is based on the detection signal Im that is obtained by guiding a part of the front light of laser 16 toward the photodetector 38 by the concave mirror 36, so that signal Vd potentially contains a noise component that is the same in phase as the actual laser noise component. As a result, the noise signal 84, which is obtained by post-processing the signal Vd, may represent at high accuracy the noise contained in the reflected light from optical disk 12, i.e., the light indicative of the stored information. (The reason for this is as follows: A high-frequency noise component being greater in frequency than the APC band and still remaining in signal 84 with a somewhat emphasized waveform after the processing of APC system as unremovable component. This means that a strong correlation is present between a laser noise component that possibly takes place in the reproduced information signal 50 and the noise signal 84.) Therefore, subtracting such a signal from the originally obtained reproduced information signal 50 makes it possible to provide a maximally noise-reduced or noise-free reproduced information signal. This can attain a maximized signal-to-noise ratio in the reproduction or playback of the optical disk 12.

Furthermore, with the embodiment apparatus 10, since the APC unit 52 is the circuitry that performs a "current-feedback control" wherein the detection signal Im of photodetector 38 is fed back in the form of current, APC unit 52 can be much expanded or widened in a controllable range than any conventional voltage-feedback control system. This can cause the wide range of the front APC system to further broaden. Such broadenment of the laser control will be advantageous to the manufacturers of optical disk drive apparatus, particularly in a case wherein the optical disk 12 is required to have a highly advanced capability to perform a successful record/playback of information having a higher frequency band such as extra high-precision motion-picture image.

Careful attention should be directed to the fact that the filtering band of the band-pass filter 78 and the gain adjustment amount of gain adjuster 80 are determined depending on the type of optical disk 12 being employed, the frequency band of the information signal contained in the reproduced signal 50, and the amplitude of the reproduced information signal (the variation in reflectance, and therefore the noise-level variation amplitude). In such a case, ideally, these parameters should be carefully determined so that the noise jitter of reproduced information signal 50 remains minimized with respect to the worst-case pattern with the window margin becomes narrowest in the information signal. The final determination of the best-mode setting may necessitate repetitions of a number of careful experiments and measurements. From the viewpoint of practical application, more simple arrangement is available. The above parameters may be determined so as to minimize the carrier-to-noise ratio (or the noise level) at the highest frequency of the reproduced signal 50. The experimental results made by the present inventors have demonstrated the fact that, even with such simplified parameter settings, the laser-noise reduction effect of more than 10 dB could be accomplished at the highest frequency of the reproduced signal.

One of the experimental data demonstrating the significance of the noise reduction effect of the present invention is shown in FIG. 2, which is an experimentally obtained characteristic diagram exhibiting the frequency dependence of the relative-intensity-noise (RIN). A serrate curve 90 represents the noise characteristic of a "rare" reproduced information signal obtained by a conventional optical disk drive apparatus that does not employ the aforementioned noise reduction concept of the present invention based on the wide-band front APC technology. A curve 92 indicates the noise characteristic of the noise-eliminated playback signal 86 obtained in the embodiment 10. It is apparent from viewing the graph of FIG. 2 that the present invention can achieve a successful noise reduction of more than 10 dB even in the high-frequency band of the front APC controllable range being as high as 10 to 20 MHz.

Figure 3:
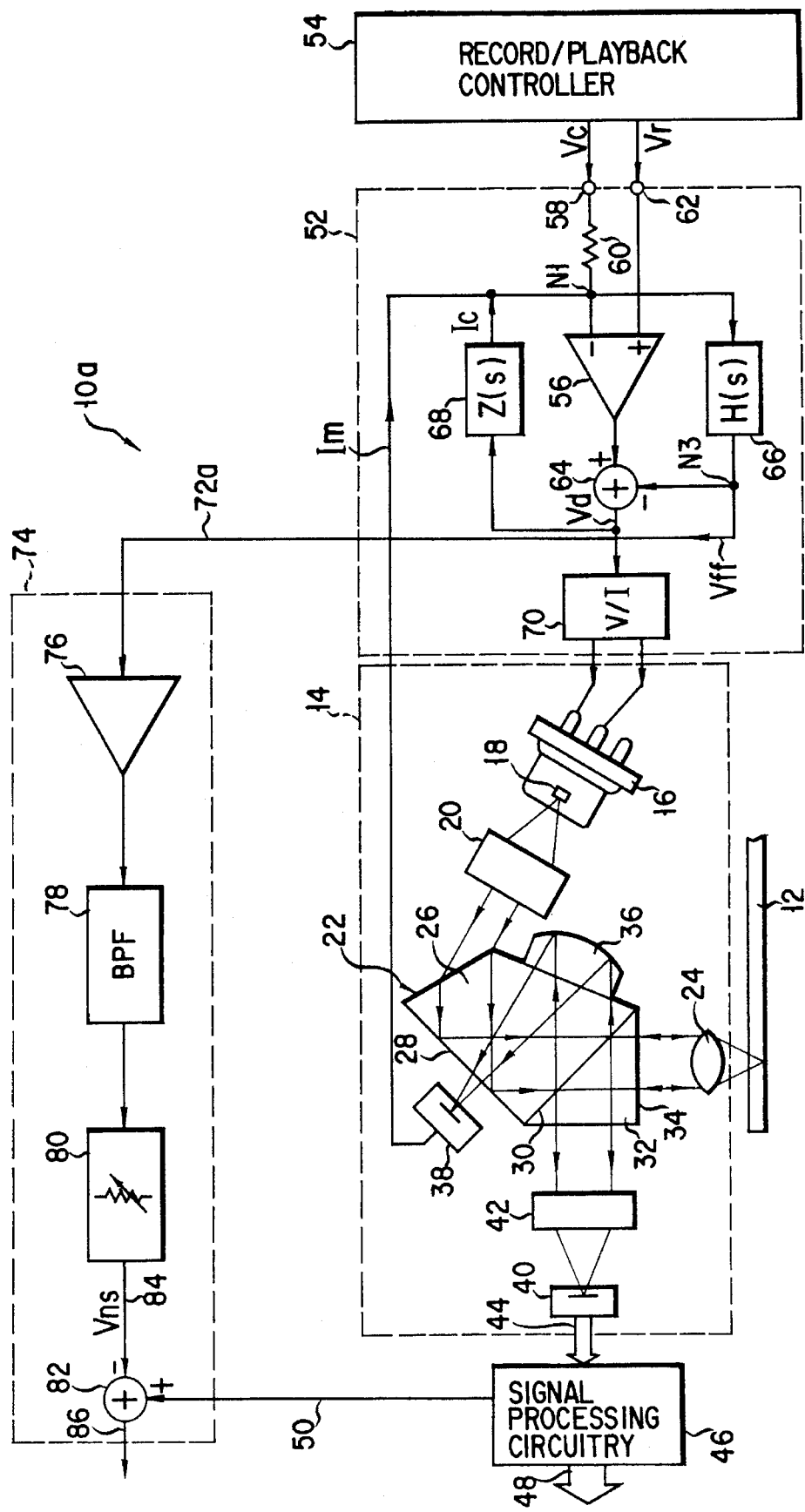
FIGS. 3, 4 and 5 are diagrams showing other embodiments of the optical disk record/reproduction apparatus according to the principles of the present invention.

An optical disk drive apparatus 10a shown in FIG. 3 is similar to the apparatus 10 of FIG. 1 with the input wiring line 72 of the noise reduction circuit 74 being replaced by a wiring line 72a, which is connected at a circuit node N3 to the output of the feed-forward correction amplifier 66. More specifically, noise reduction circuit 74 uses an output voltage signal Vff of correction amplifier 66 as the source of the laser noise monitor signal 84. Also with such an arrangement, the same technical advantages may be obtained.

Figure 4:
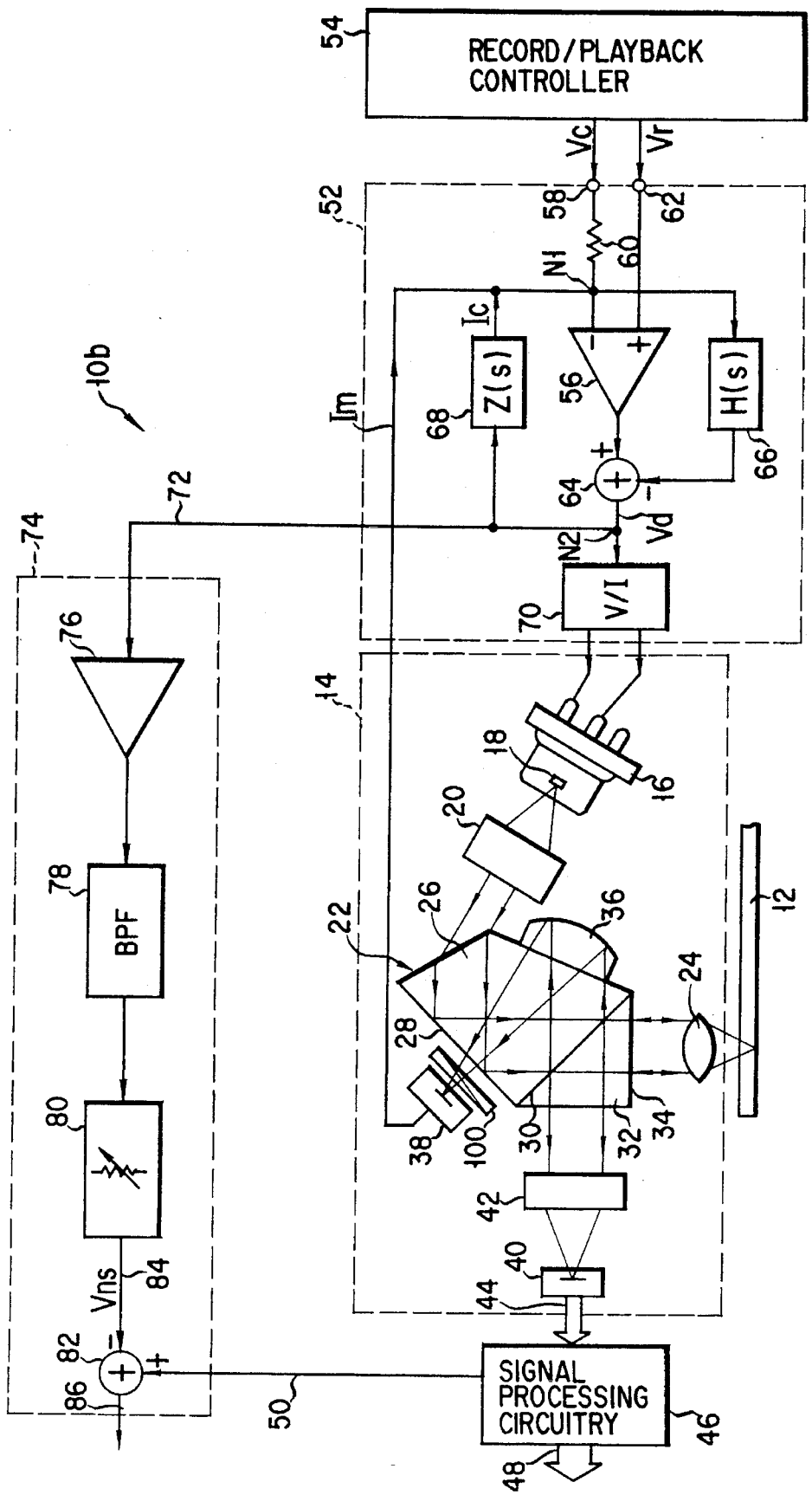

An optical disk drive apparatus 10b shown in FIG. 4 is similar to that of FIG. 1 with a polarizing plate member 100 being additionally disposed between the APC photodetector 38 and the circular beam total-reflection plane 28 of the compound prism structure 22. Such an addition of polarizer 100 may improve the strict consistency or coincidence in terms of the condition of polarization of light between (i) the optical path of information reproduction system through the optical planes 30, 34 in prism structure 22 and the surface of the optical disk 12 and (ii) the APC monitoring optical path via the internal optical plane 30 of prism structure 22 and the concave mirror 36. A resultant noise monitor signal 84 can thus be further improved in the accuracy of indication of noise occurring in the reproduced signal 50. Therefore, the finally obtained noise-reduced playback signal 86 can be much improved in the signal-to-noise ratio.

Figure 5:
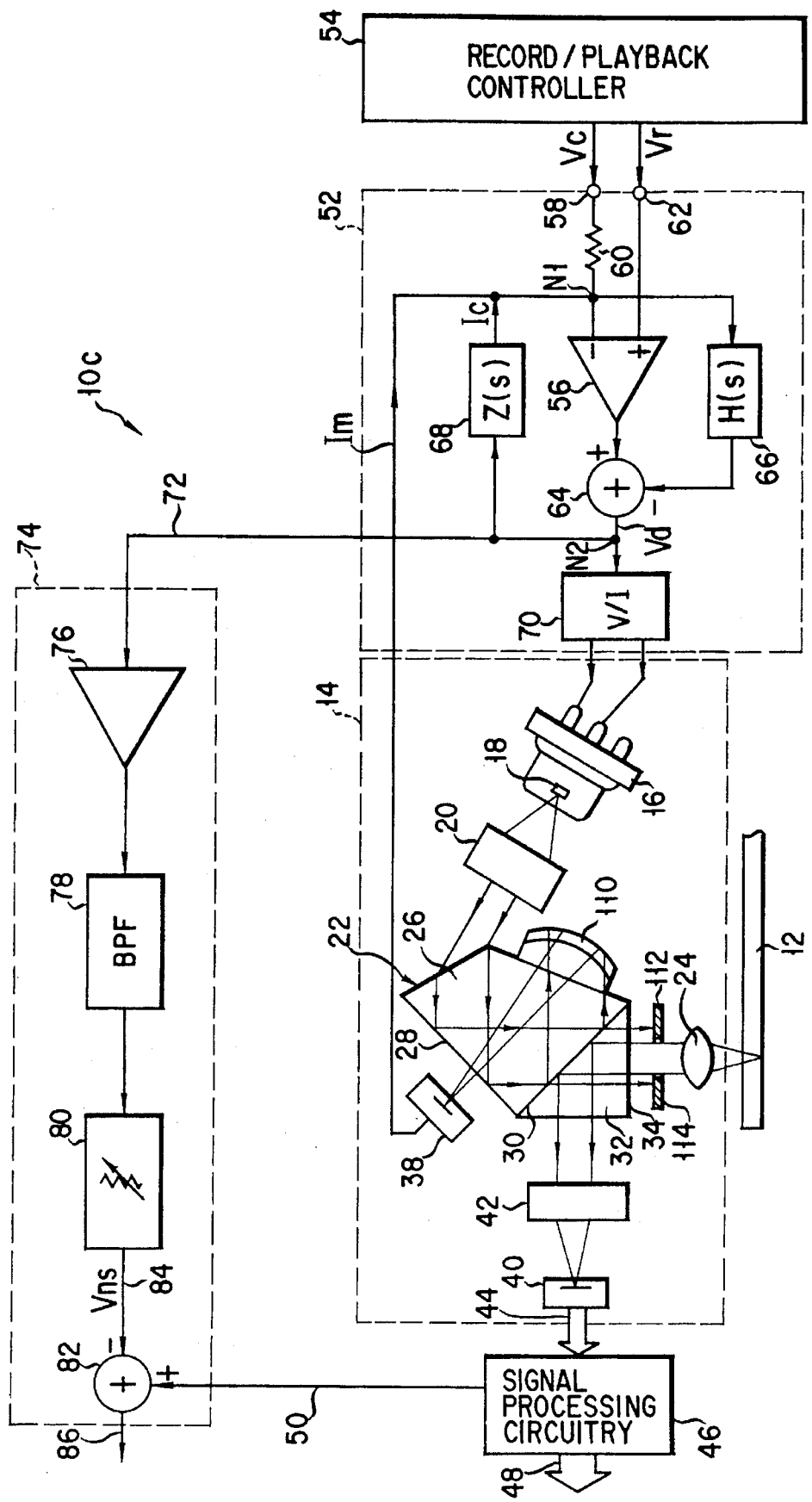

An optical disk drive apparatus 10c illustrated in FIG. 5 is similar to that of FIG. 1 with (1) the concave mirror 36 being replaced with a specific concave mirror with a spatial filter function, and (2) a luminous flux limiter 112 being added between the objective 24 and the quarter undulation plate 34 of compound prism structure 22. The luminous flux limiter 112 has an aperture stop 114, which limits the profile or cross-section of a light beam that exits from prism structure 22 and travels toward objective 24, causing a thin light beam to be projected and focused on the optical disk 12. Concave mirror 110 causes a light beam component that exits from the polarization beam splitter 30 toward APC photodetector 38 and a light beam being actually projected onto optical disk 12 to become equivalent to each other in the optical conditions. Additionally, the light beam control means may alternatively be a spatial filter having a desired luminous flux transmission distribution characteristic, which is functionally equivalent to aperture stop 114.

Figure 6:
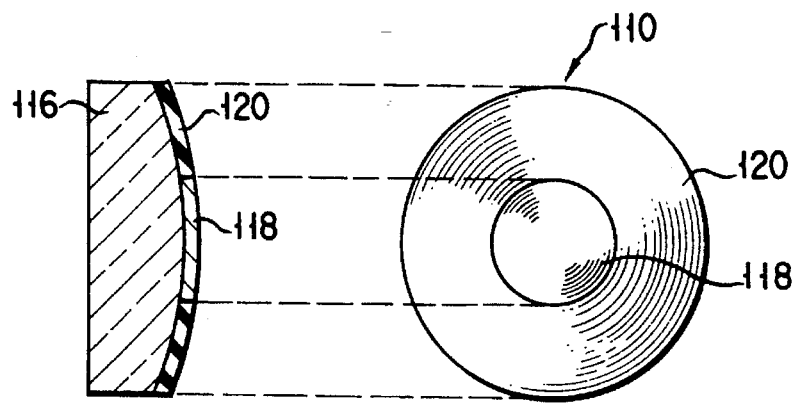
FIG. 6 is an illustration of a plan view and a corresponding cross-sectional structure of a concave mirror employed in the embodiment of FIG. 5, and FIGS. 7 and 8 are illustrations of two possible modifications of the concave mirror of the preceding figure.

As shown in FIG. 6, the concave mirror 110 has round transparent base layer or substrate 116 with a flat surface and a spherical surface (which may alternatively be a spherical surface). In the central area of substrate surface, a round high-reflectivity film 118 is arranged such that it is substantially the same in diameter as the aperture stop 114 of FIG. 5. The remaining surface area, i.e., a ring-shaped surface area of substrate 116 is covered by a low-reflectivity film 120. High-reflectivity film 118 may be a metallic film. Typically, film 118 may be made from aluminum. This film 118 may alternatively be dielectric multi-layer films. Low-reflectivity film 120 may be a single layer or multilayers made from a selected dielectric material, such as silicon oxide. Film 120 may also be made from a light absorption material, such as gelatin film containing organic dye, if required.

With the addition of the concave mirror 110 having a spatial filter function and the luminous limiter 112, it becomes possible, by suitably arranging the optical characteristics of concave mirror 110 in accordance with that of additional luminous limiter 112, to further enhance the accuracy of consistency or coincidence between (i) the spatial distribution condition of the optical path of information reproduction system through the internal optical planes 30, 34 of the compound prism structure 22 and the surface of the optical disk 12, and (ii) that of the APC monitoring optical path through the internal optical plane 30 and concave mirror 110. This results in that the noise monitor signal 84 can be improved in the accuracy of indicating noise being contained in the reproduced signal 50, thereby to further enhance the signal-to-noise ratio of the noise-eliminated reproduction signal 86.

Figure 7:
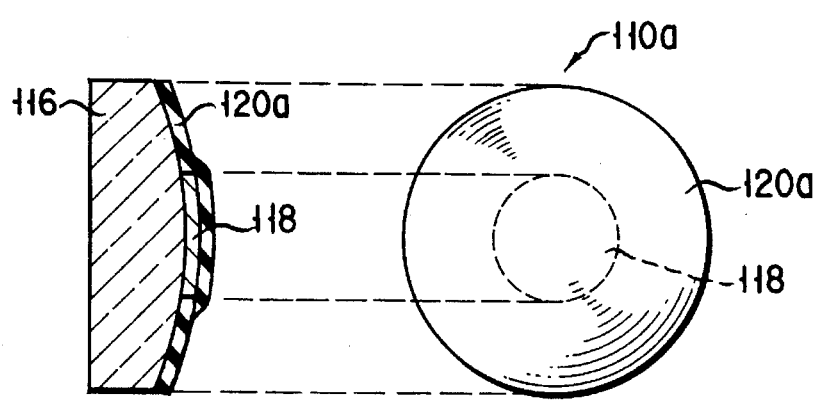
Figure 8:
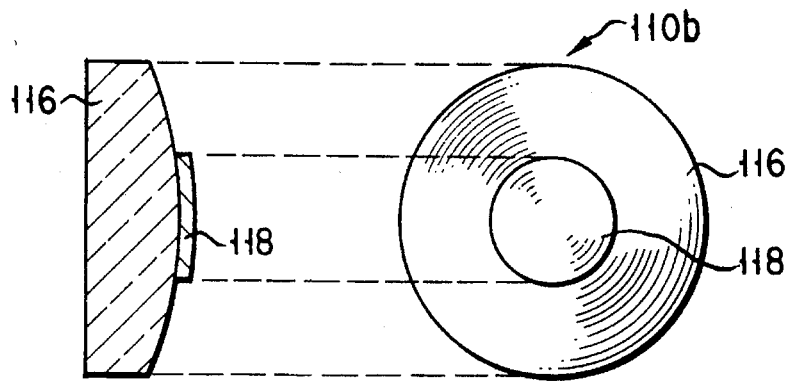

The concave mirror structure of FIG. 6 may be modified as shown in FIG. 7 or 8. A concave mirror 110a of FIG. 7 has a low-reflectivity film 120a, which expands to cover the central high-reflectivity film 118 on the round transparent substrate 116. The low-reflectivity film 120 of FIG. 6 is not provided in a concave mirror 110b shown in FIG. 8. When reduction to practice, the structure of FIG. 8 will be recommendable if the low-cost requirement is the first priority in the manufacture of the optical disk drive apparatus.

Figure 9:
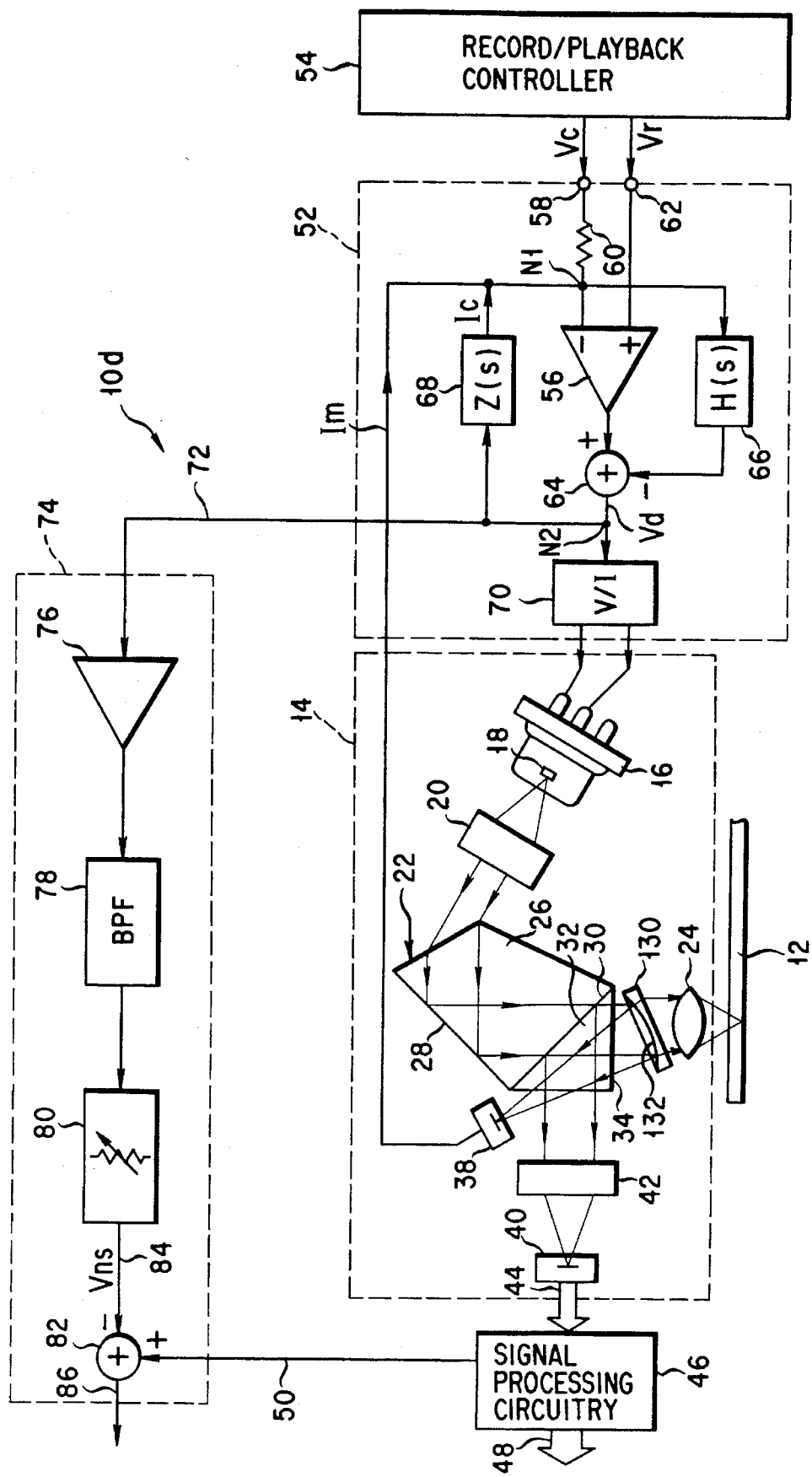
FIG. 9 illustrates a further embodiment of the optical disk record/reproduction apparatus according to the principles of the present invention.

An optical disk drive apparatus 10d shown in FIG. 9 is similar to that of FIG. 1 with (1) the concave mirror 36 of FIG. 1 being removed, and (2) a beam splitter 130 being inserted between the quarter undulation plate 34 of compound prism structure 22 and the objective 24. Beam splitter 130 is tilted in the optical path between quarter undulation plate 34 and objective lens 24. Beam splitter 130 essentially consists of a plano-convex lens, a plano-concave lens, and a concave mirror 130 being sandwiched therebetween and having the reflectivity of 10%. Concave mirror 132, which causes approximately 10% of an incident light passed through quarter undulation plate 34 to be reflected to and concentrated on the APC photodetector 38, while permitting the remaining 90% light component to pass through mirror 132 toward objective 24, which causes it to be projected on optical disk 12. The light beam is reflected by optical disk 12 and returns along itself. The reflected light is then converted by objective 12 into a parallel luminous flux, which is divided by beam splitter 130 into approximately 90% of the reflected light beam passing through splitter 130 and the remaining 10% thereof being reflected away by the back surface of concave mirror 132 as unnecessary diverging rays. The light passed through beam splitter 130 is totally reflected by the polarization beam splitter 30 toward multi-division photodetector 40 by way of condenser 42.

With such an arrangement, the APC front monitor light is obtained by using the additional beam splitter 130, which acts as a concave mirror with respect to a reflected light and functions as an optical parallel substrate for a transmission light. The front monitor light is taken out of the light beam being passed through the polarization beam splitter 30 to optical disk 12; therefore, it is possible to cause the optical systems of the reproduction beam system and of the APC front monitor system to coincide in optical conditions with each other at higher accuracy without making use of the polarizer 100 employed in the embodiment of FIG. 4. This may lead to an improvement in the monitoring accuracy of the noise monitor signal 84.

The present invention is not limited to the abovedescribed specific embodiments and may be practiced or embodied in still other ways without departing from the spirit or essential character thereof.

By way of examples, while the compound prism structure 22 is employed in the optical head section 14 in the above embodiments, it may be replaced with an optical-path division structure using a dividing mirror member. The internal arrangement of the laser-noise reduction circuit 74 may also be modified as required when reduced to practice. For example, a capacitive element may be added to a single-stage transistor amplifier to attain a low-pass filter characteristic, causing the buffer amplifier 76 to be coupled together with the band-pass filter 78. Alternatively, buffer amplifier 76 may be modified to have the function of the gain adjuster 80; a resistive load in band-pass filter 78 may also be used to achieve the gain adjustment function therein. Buffer amplifier 76 may be added with an automatic gain-adjustment function in response to a variation in the actual reflectance of the optical disk 12 and/or the level design of the reproduced information signal 50. A non-linear optical device such as a secondary harmonic generator (SHG) may be additionally disposed between the light emission end of the semiconductor laser device 16 and the collimator lens 20, causing the laser light beam to be subjected to an optical frequency conversion process.

The rest of the present description will be devoted to the explanation of other embodiments of the invention.

An optical record and reproduction (playback) apparatus 200 is shown in FIG. 10, which includes the optical head section 14 of FIG. 1. This optical head section 14 is associated with a wide-band front-APC laser control circuit 52a. Laser control circuit 52a is connected to an optical information record/playback control circuit 54a, which supplies laser controller 52a with a control signal (modulation signal) Vc and a reference signal Vr for this control signal Vc.

The laser controller 52a is similar to the controller 52 of FIG. 1 with (1) the operational amplifier 56, the adder 64, and the feed-forward correction amplifier 66 of FIG. 1 being replaced by a control amplifier 56a, (2) a resistor 202 being added to the non-inverting input of amplifier 56a, and (3) a buffer amplifier 204 being additionally arranged to have an input coupled to the output of amplifier 56a. The control amplifier 56a has a function equivalent to that of a portion formed of the operational amplifier 56, the adder 64, and the feed-forward correction amplifier 66. As for the modulation signal Vc, a voltage modulated in accordance with an information signal to be recorded is inputted during recording and a constant voltage is inputted during playback. As for the reference voltage Vr, a constant voltage is always inputted via a resistor 202. A resistor 60 has the same value as that of the resistor 202, thereby preventing an offset voltage from developing due to very small input current to the control amplifier 56a. As a result, during playback, the voltage between terminals 58, 62 remains constant; this voltage determines the amount of front light from the semiconductor laser 16.

A monitor current Im is fed back from the photodetector 38 to the inverting input of the control amplifier 56a, to which a compensation current for compensating a response delay of monitor current Im is also supplied from the compensation circuit 68. The flow of monitor current Im from photodetector 38 decreases the potential difference between the inverting input and non-inverting input of control amplifier 56a. The potential difference is amplified by control amplifier 56 in accordance with its inherent open-loop characteristic (see FIG. 11) to produce a control signal Vd. The control signal Vd is divided in two, one of which is supplied to the current driver circuit 70. Current driver 70 performs a voltage-to-current converting operation (V/I conversion) for control signal Vd, and supplies a resulting current signal to the laser 16. This controls the amount of front light from laser 16 so that the potential difference between the inverting and non-inverting inputs of control amplifier 56a be kept at zero.

Figure 11:
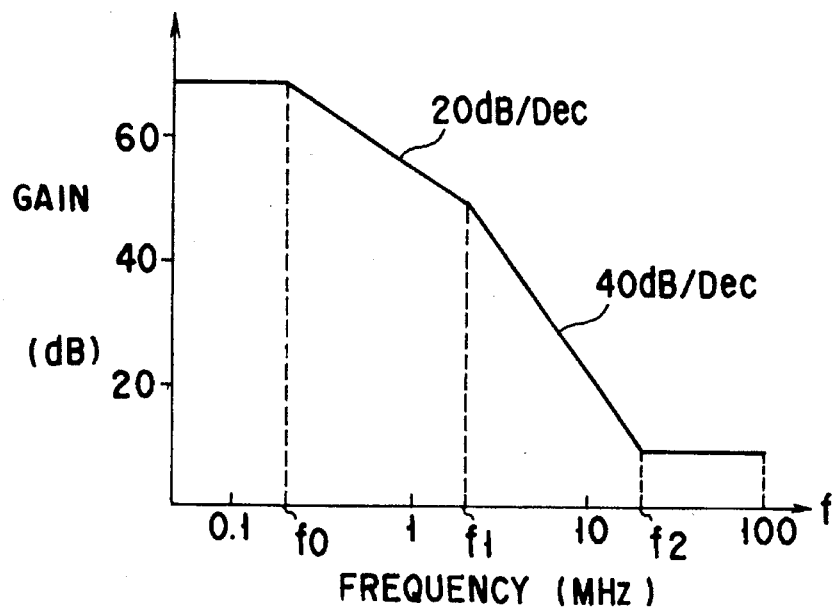
FIG. 11 illustrates the closed-loop characteristic of a control amplifier of FIG. 10.

FIG. 11 shows the open-loop frequency characteristic of the control amplifier 56a, which has a gain of 60 dB or more at a frequency of "f1" and below, thereby to enhance the stability of the amount of light output, particularly the stability at a small amount of light output during playback. A range of frequencies f1 to f2 is the band of a reproduced signal, which band is given a double-integral characteristic to suppress the occurrence of laser noise more successfully. A range higher than frequency f2 is given a flat characteristic to make the control band wider. With such a characteristic, feedback control of the light output of laser 16 can allow laser noise to be suppressed according to the reverse of the open-loop frequency characteristic of the control amplifier, that is, a characteristic where noise suppression effect is high in the low-frequency range and decreases in the high-frequency range.

Figure 12:
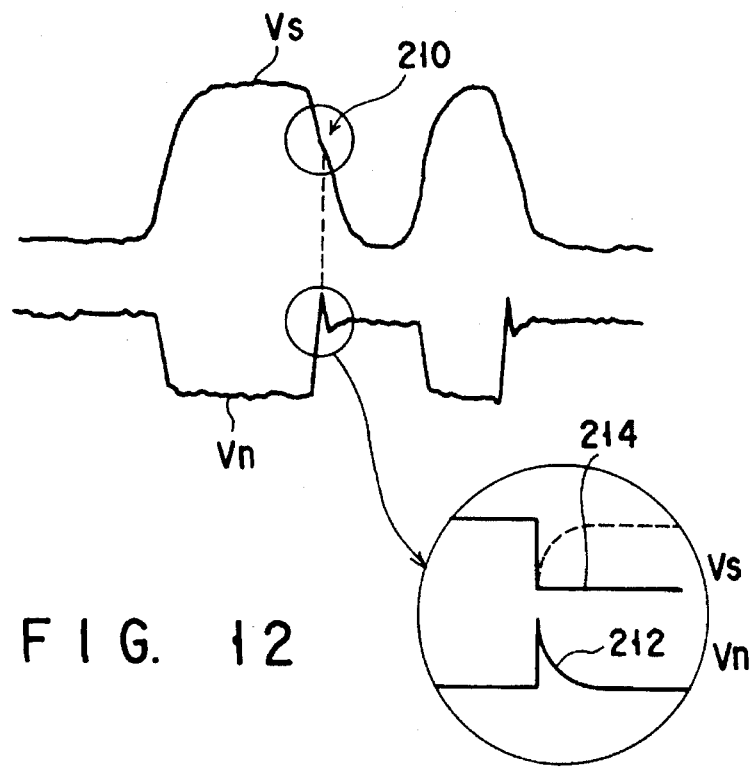
FIG. 12 illustrates the waveform of a reproduction signal and a control signal generated in the embodiment of FIG. 10.

FIG. 12 shows some observed waveforms of the reproduced signal Vs in the optical disk apparatus and the control signal Vn generated at the control amplifier in a case where the wide-band front APC with the FIG. 11 open-loop frequency characteristic is used. Laser noise 210 is observed in the control signal Vn and a signal component of the opposite phase to that of the reproduce signal Vs is observed in control signal Vn. It is probably because variations in the output of the semi-conductor laser 16 due to changes in the amount of light returned to laser 16 as a result of the change of the reflectivity according to the presence or absence of a recording pit on the optical disk, are suppressed by feedback control. Further, when the reflection intensity changes from a high level to a low level at a recording pit, mode hopping takes place, so that laser noise develops in such a manner that the level of reproduced signal Vs drops as indicated by numeral 214, although the control signal Vn carries a signal 212 enhancing the optical output. This phenomenon is ascribed to the fact that control signal Vn produces a control response characteristic 212 for compensation according to the step response 214 of the decreased optical output due to the mode hopping and resulting response errors remains in the form of laser noises. This is a characteristic of laser noise in feedback control.

Because the wide-band front APC circuit 52a monitors the front light from the laser 16 and, based on the monitoring result, performs wide-band APC whose control band is several times as wide as that of the reproduced signal, it can effectively suppress interfering noise at the laser 16 caused by the returned light and laser noise such as mode competing noise in the low-frequency band. In wide-band front APC circuit 52a, however, the laser noise suppression characteristic degrades in a range of high frequencies, laser noise in the reproduced-signal band cannot be decreased sufficiently in making the reproduced-signal band wider to meet demands for higher recording density and faster optical-disk rotating speed, resulting in an insufficient signal-to-noise ratio. Because laser noise develops and remains at the edge portion of the reproduce signal, great errors occur in edge sensing, particularly in a mark-edge recording/reproducing system.

To solve such a problem, in this embodiment, based on the fact that. the laser noise contained in the reproduced signal is the residual error component that could not be suppressed by the wide-band front APC and the residual error component is equal to the control error component produced at the input section of the control amplifier 56a acting as a control means of the wide-band front APC, the control signal Vd outputted from the control amplifier 56a is processed according to the reverse of the open-loop transfer characteristic of control amplifier 56a in at least the reproduced-signal band to produce a residual laser-noise signal, the control error component. By subtracting the residual laser-noise signal from a reproduced information signal 50, the laser noise contained in reproduced signal 50 can be reduced.

The arrangement of the laser-nose reducing circuit is as follows. The other half of the control signal Vd divided in two outputted from the control amplifier 56a is inputted to a buffer amplifier 204. The output signal Vn of buffer amplifier 204 passes through the an auto-gain adjustment circuit 250 and enters an equalizing filter circuit 251, which then processes the signal according to the reverse of the open-loop characteristic of control amplifier 56a to produce a residual laser-noise signal Vp. Because the residual laser-noise signal Vp is produced from the negative feedback signal, it has the opposite phase to that of the laser noise contained in the reproduced signal 50. Therefore, when reproduced signal 50 and residual noise signal Vp are inputted to an adder 252, the laser-noise component in reproduced information signal 50 is offset by the residual laser-noise signal Vp, thereby producing a reproduced signal Vo whose laser noise is suppressed more. The reproduced signal Vo is further inputted to a low-pass filter (LPF) 253, which removes unnecessary high-frequency components sufficiently, thus decreasing laser noises still more.

Figure 13:
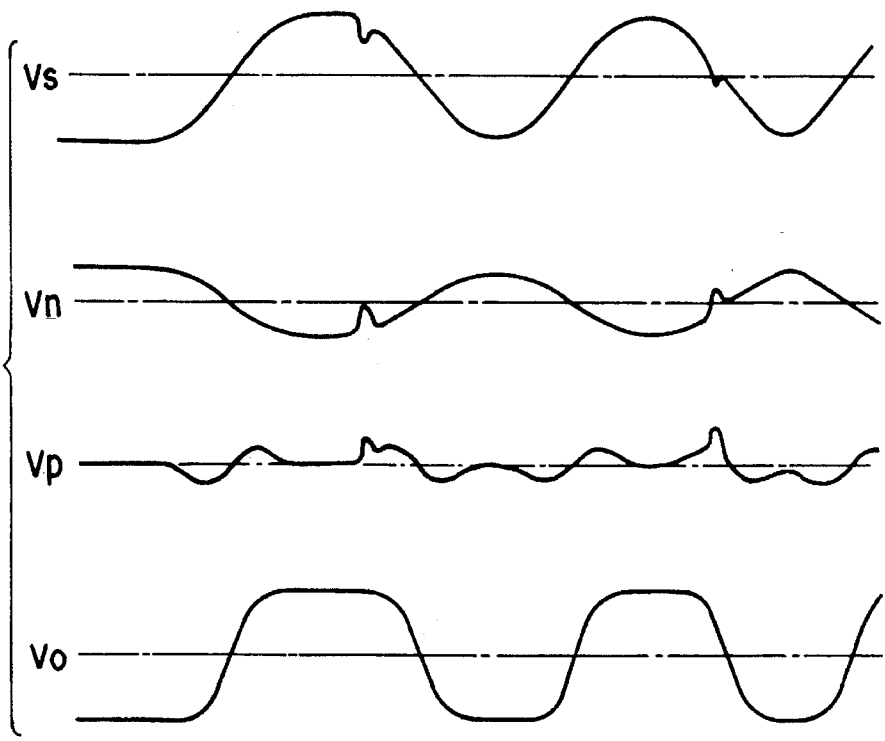
FIG. 13 shows the waveforms of some signals generated in the FIG. 10 embodiment.

A decrease in laser noise and the signal-edge enhancement effect in the FIG. 10 embodiment will be explained with reference to the waveform diagrams of FIG. 13. The relationship between the reproduced signal Vs and the output signal (control signal) Vn of the buffer amplifier 204 in the mark-edge recording system is as shown in FIG. 13, where a laser-noise-suppressing component and a reproduced-signal component are superimposed on the control signal Vn (see FIG. 12). The open-loop transfer characteristic of the control amplifier 56a is as shown in FIG. 11, where the characteristic in the reproduced-signal band (f1 to f2) presents a double-integral characteristic. The equalizing filter circuit 251 carries out a process according to the reverse of the double-integral characteristic in the reproduced-signal band, that is, a second-order differential process. Therefore, by adding the output signal Vp of the equalizing filter circuit 251 and the reproduced signal Vs of the opposite phase at the adder 252, the edge portion is enhanced, with the result that a reproduced signal Vo whose signal-to-noise ratio is equivalently improved greatly is obtained.

To achieve such enhancement of the signal edge and the sufficient laser-noise reduction effect, it is desirable that the level of the output signal Vp of the equalizing filter circuit 251 should be always optimized in accordance with a change in the level of the reproduced signal Vs. For this reason, this embodiment contains the following gain-control signal generating system.

Specifically, the output signal of the LPF 253 is divided in two, one of which goes through a reproduced waveform equalizing/binarizing circuit 256 for decoding information data from the reproduced signal and then enters a timing generating circuit 257 for decoding/clock generation (PLL). The other of the halved outputs of LPF 253 passes through a filter (which may be a low-pass filter) 254 for averaging the reproduced signal Vo and then enters a detecting filter circuit 255 to produce a gain control signal supplied to a gain-varying circuit 250. The reproduced-signal level varies with the reflectivity of the optical disk and the nature of the reproduced signal. Since particularly in a recordable and reproducible disk, the level at the address section differs from the level at the data section, to suppress laser noise more accurately, it is more desirable that the level of the residual laser-noise signal Vp should be optimized separately by switching between the address section and the data section.

Figure 14:
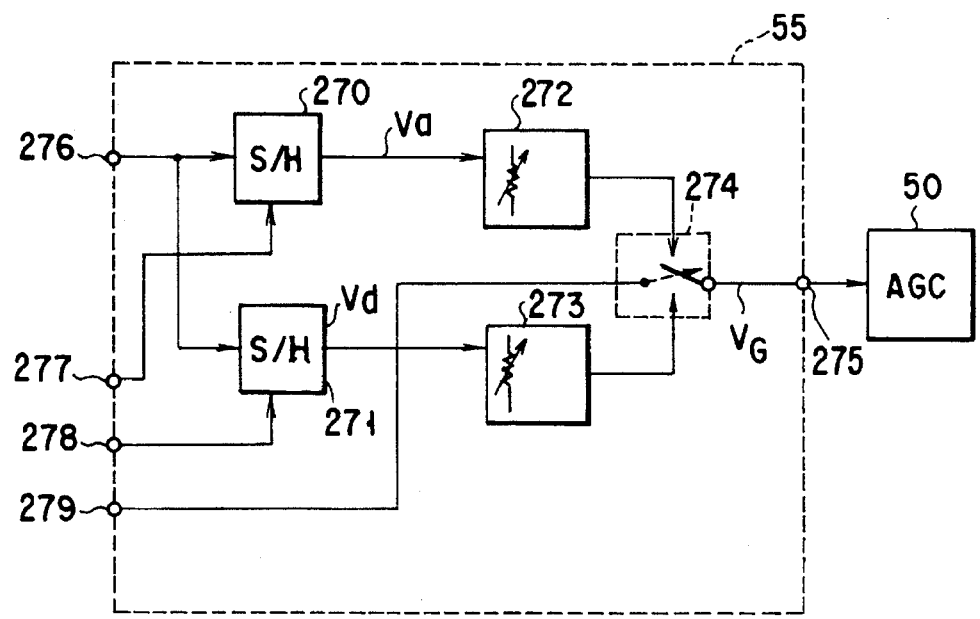
FIG. 14 shows the detailed configuration of a detection filter circuit of FIG. 10.

FIG. 14 shows a concrete arrangement of the detecting filter circuit 255 of FIG. 10. The output signal of the filter 254 of FIG. 10 is inputted to an input terminal 276 and then directed to sample-hold (S/H) circuits 270, 271. S/H circuit 270 detects the average value at the address section; S/H circuit 271 detects the average value at the data section. These average values detected go through level adjustment circuits 272, 273, respectively, and then enter a switching circuit 274. Switching circuit 275 produces a gain control signal Vg suited for the address section and the data section and supplies it as a control voltage to the gain-varying circuit 250. Gain-varying circuit 250 varies the voltage amplitude of the control signal Vn in proportion to the control voltage.

The amount of adjustment of the level adjustment circuits 272, 273 is set at the address section and the data section separately so that laser noise in the reproduced signal Vo may be minimized. This makes it possible to optimize the level of the residual laser-noise signal Vp in accordance with a change in the reflectivity of the optical disk and the recording state.

The timing generating circuit 257 of FIG. 10 produces a sampling clock signal of average-value detection timing supplied to the S/H circuits 270, 271 and a switching timing signal supplied to the switching circuit 275 on the basis of the state of the reproduced signal inputted from the equalizer/binarizing circuit 256 that equalizes and binarizes the reproduced waveform. Practically, for example, to sense the average value, the sampling clock signal is generated in the VFO signal region so that the sensing may be done in the VFO signal region previously placed in the address section and the data section for reproduction clock synchronization. The switching timing signal may be generated before the start of the VFO signal region of each of the address section and the data section. On the other hand, in the case of the mark-position recording system, the peak value, rather than the average value of the output signal of the filter 254, is sensed, and the amount of adjustment of the level adjustment circuits 272, 273 is set so that laser noise is minimized at the peak position. Also in this case, offsetting the laser noise enables the reproduced signal to be finer, providing the effect of equivalently improving the signal-to-noise ratio remarkably.

In the above embodiment 200, attention is paid to the residual laser noise as inherent control errors in using wide-band front APC (since laser noise develops and remains at the edge portion of the reproduced signal, great edge sensing errors occur during playback particularly in the mark-edge recording/reproducing system capable of improving the recording density. This problem is becoming a serious obstacle to the achievement of higher signal-to-noise ratio as the recording density becomes higher and the rotating speed of the optical disk gets faster). The main point of the embodiment is to eliminate the residual laser noise contained in the reproduced signal more successfully, using the residual laser-noise signal detectable in wide-band front APC. By subtracting the residual laser-noise signal, a control error component, from the reproduced signal in wide-band front APC, it is possible to remarkably reduce the laser-noise noise contained in the reproduced signal, particularly noises in a range of high frequencies in the reproduced-signal band, where the noises cannot be suppressed sufficiently only by conventional wide-band front APC in a case where the higher density of the optical disk or the faster rotating speed makes the reproduced signal spread over a wider band.

A first light. beam projected onto the optical disk 12 and a second light beam projected onto the photodetector 38 for wide-band front APC are the front light from the same semiconductor laser 16. The laser noise contained in the reproduced signal 50 obtained via the playback photodetector 40 is the residual error component that could not be suppressed by wide-band front APC and is equal to the control error component generated in the input section of the control means in the wide-band front APC. The control error component is obtained as a residual laser-noise signal by processing the control signal Vc according to the reverse of the open-loop transfer characteristic of the APC unit 52a in at least the reproduced-signal band. Therefore, after the residual laser-noise signal has been subtracted from the reproduced signal 50, a resultant information signal is able to make a high S/N ratio signal free from the laser noise originally contained in the semiconductor laser.

The residual laser-noise signal thus obtained through signal processing contains the reproduced signal having undergone a similar signal process, with the result that the signal edge of the reproduced signal is enhanced. Since the reproduced-signal component contained in the residual laser noise has the effect of enhancing the signal edge of the reproduced signal, it is possible to equivalently improve the signal-to-noise ratio of the reproduced signal remarkably. In this case, by constructing the circuit so that the residual laser-noise signal level may vary with the reproduced-signal level, the effect of eliminating the laser noise is not degraded even if the reflectivity of the optical disk changes. Variable control of the amplitude of the residual laser-noise signal according to the reproduced signal level makes it possible to always assure a great laser-noise eliminating effect.

Furthermore, since the output signal of the photodetector 38 also contains the residual noise component of the semiconductor laser, by using this component to produce a residual noise signal and subtracting it from the reproduced signal as noted earlier, the laser noise is eliminated and the reproduced signal whose signal edge is enhanced is obtained. In this case, signal processing with the reverse of the open-loop transfer characteristic of the control means is unnecessary.

On the other hand, by achieving the suitable filtering of the control signal Vc or the output signal of the photodetector 38, for example, the filtering almost equivalent to the frequency characteristic of the reproduced-signal sensing system (generally, a low-pass characteristic), adjusting the amplitude and delay of the laser-noise component contained in the reproduced signal, and further adjusting the gain for matching the amplitude of the residual laser-noise signal, a laser-noise monitor signal of the same level and the same phase as those of the mode hopping noise contained in the reproduced signal is produced, thereby eliminating the laser noise in the reproduced signal accurately to produce a good reproduced signal with less distortion. With the above effects combined, the embodiment provides a high-quality reproduced signal with very small laser noise, less distortion, and good signal-to-noise ratio.

Figure 15:
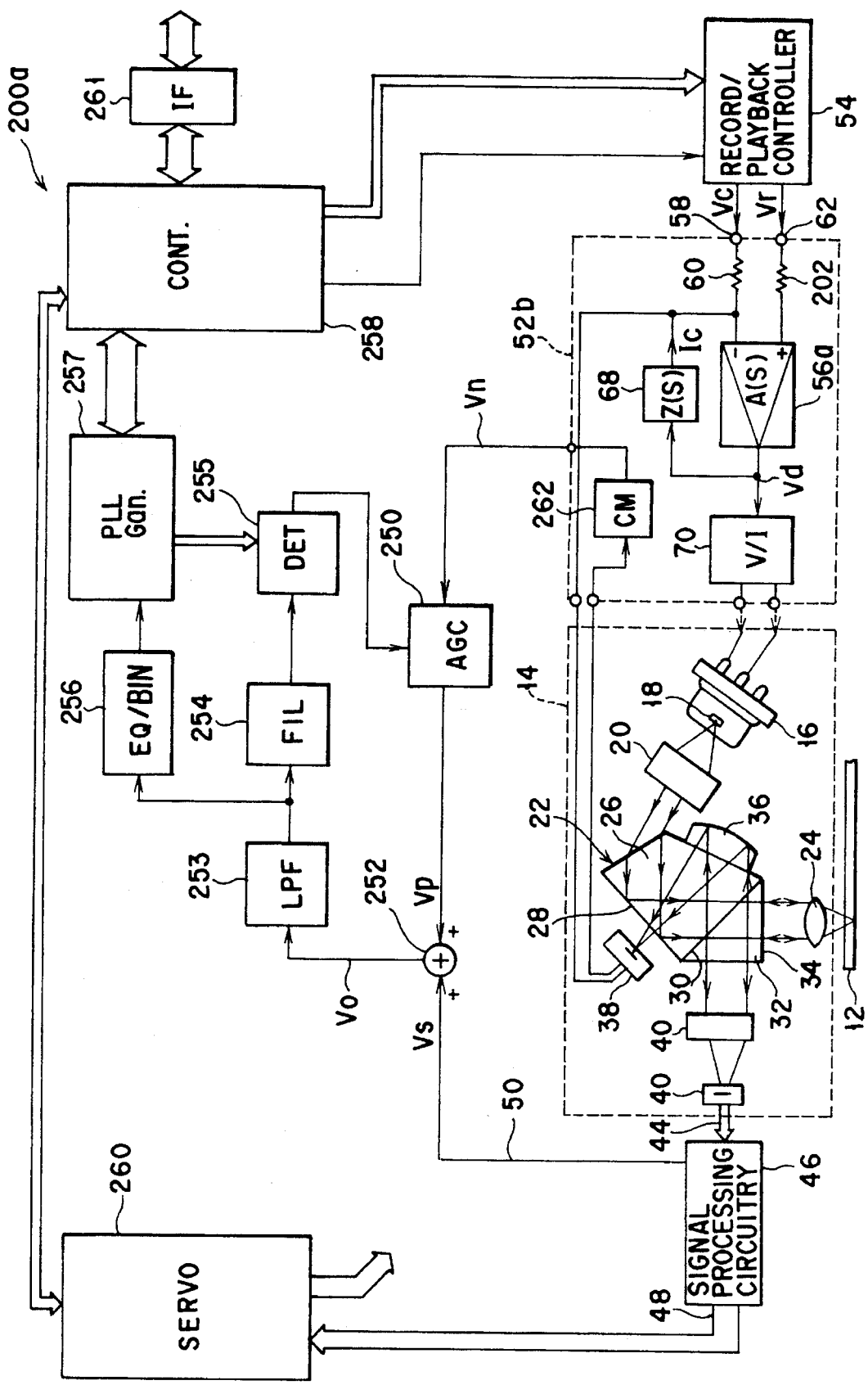
FIGS. 15 and 16 are diagrams each showing an optical record and playback apparatus in accordance with another embodiment of the invention.

The embodiment of FIG. 10 may be modified as shown in FIG. 15. An optical record and playback apparatus 200a of FIG. 15 differs mainly from that of FIG. 10 in the arrangement of the wide-band front APC circuit 52b and that of producing the residual laser-noise signal Vp. More specifically, the wide-band front APC circuit 52b of the embodiment 200a includes resistors 60, 202, the control amplifier 56a, the compensation circuit 68, the current driver 70, and a current-mirror circuit 262 that monitors the feedback current Im from the photodetector 38. Current-mirror circuit 262 is provided in the alternative of the buffer amplifier 204.

The current-mirror circuit 262 receives, as an input, the monitor current Im fed back from the photodetector 38 to the non-inverting input of the control amplifier 56a, and generates a residual laser-noise signal Vn. Current-mirror circuit 262 includes a current-to-voltage (I/V) converting section at the output stage in this example, and is constructed so as to generate a voltage signal proportional to the monitor current Im as the output signal Vn.

This embodiment 200a has the disadvantage that the residual laser-noise signal Vn obtained from the current-mirror circuit 262 does not contain a component of the compensation current Ic from the compensation circuit 68; however, since it does not require the equalizing filter circuit 251 needed in the embodiment 200 of FIG. 10 (that is, a means of processing signals according to the reverse of the open-loop transfer characteristic of the control amplifier 56), it has the advantage that the arrangement becomes simple. Namely, the output signal Vn of the current-mirror circuit 240 goes through the gain-varying circuit 250 and becomes a residual laser-noise signal Vp, which is inputted to the adder 252. This allows the laser noise in the reproduced signal Vs to be offset by the residual laser-noise signal Vp at the adder 252, thereby producing a reproduced signal whose laser noise is suppressed more. As with the embodiment 200, the LPF 253 removes unnecessary high-frequency components from the reproduced signal Vo sufficiently, which decreases the laser noise much more.

Also in the embodiment 200a, the use of wide-band front APC allows the residual laser-noise signal Vp produced via the current-mirror circuit 240 to contain a component enhancing the reproduced-signal edge, with the result that the output signal Vo of the adder 252 has the reproduced-signal edge enhanced as mentioned in the embodiment 200, thus providing the effect of equivalently improving the signal-to-noise ratio greatly.

Figure 16:
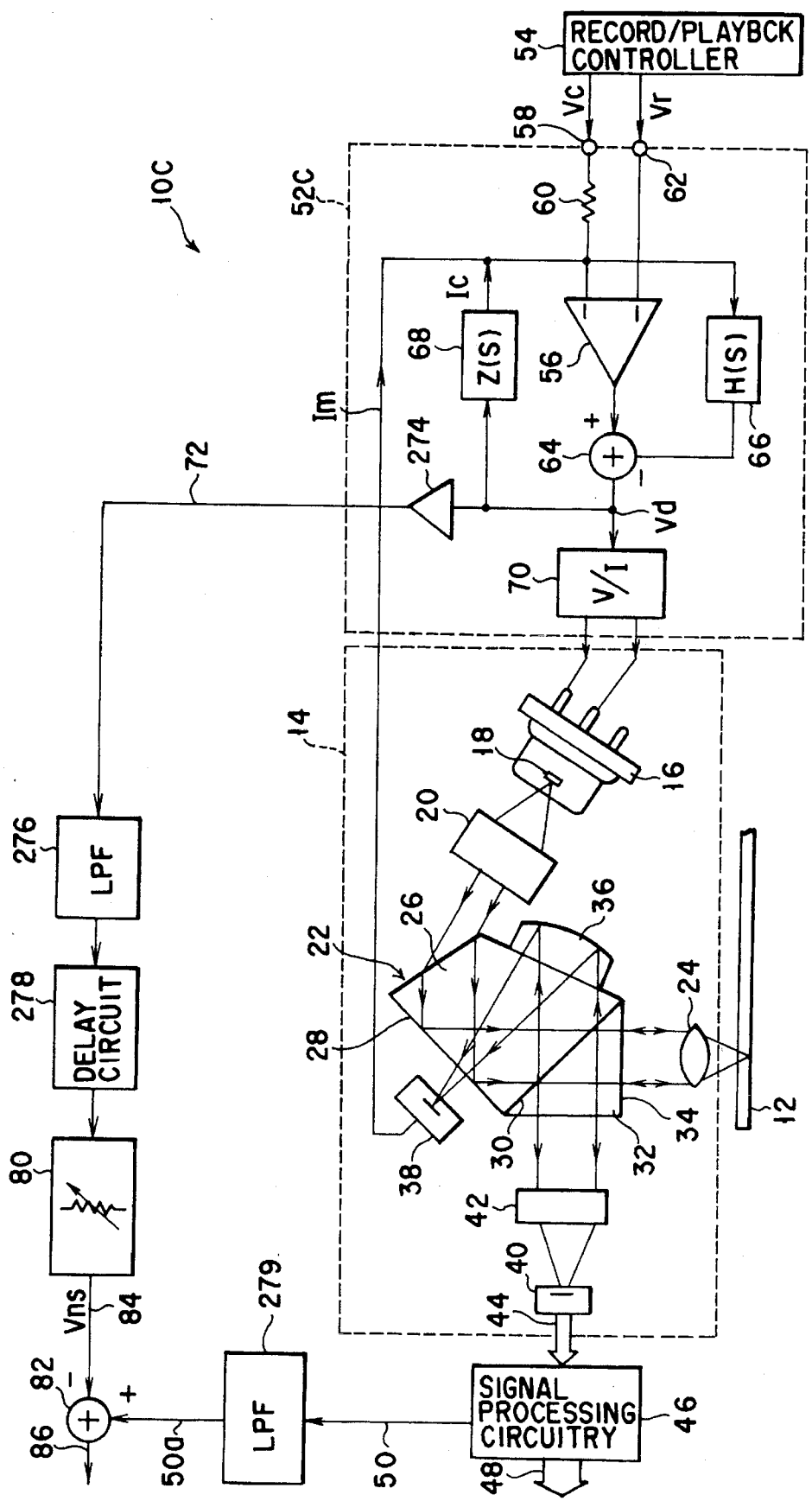

An optical record/playback apparatus 10 shown in FIG. 16 is similar to that of FIG. 1 with (1) a buffer amplifier 274 being added in the wiring line 72 of the laser control circuit 52 of FIG. 1, (2) the AC-coupled buffer amplifier 76 and band-pass filter 78 being replaced with an LPF 276 and a delay circuit 278, and (3) another LPF 279 being arranged to have an input coupled to the signal processing circuit 46 and an output coupled to the adder 82.

The monitor current Im is fed back from the photodetector 38 to the inverting input of the operational amplifier 56, to which a compensation current for compensating a response delay of the monitor current Im is also supplied from the compensation circuit 68. The flow of monitor current Im from photodetector 38 decreases the potential difference between the inverting input and non-inverting input of operational amplifier 56. The potential difference is amplified by operational amplifier 56 and the correction amplifier 66 in parallel with the former amplifier for feed-forward compensation of the effect of the junction capacitance of photodetector 38. The resulting amplified signals are then added by the adder 64 to produce a control signal Vd. The control signal Vd is divided into two, one of which is supplied to the current driver 70. Current driver 70 performs voltage-to-current conversion (V/I conversion) of control signal Vd and supplies the resulting current to the laser 16. This controls the amount of front light from laser 16 so that the potential difference between the inverting and non-inverting input terminals of operational amplifier 56 remains at zero. The other divided half of the control signal Vd is taken out through the buffer amplifier 274.

The wide-band front APC circuit 52c monitors the front light of the laser 16 and, based on the monitoring result, performs a wide-band APC operation whose control band is several times as wide as that of the reproduced signal, with the result that the generation of noise in the laser 16 due to the returned light can be decreased.

In practice, even when there is some returned light, it is necessary to keep relative-intensity-noise (RIN) in a range of −120 dB to 125 dB. According to the latest academic report (Taguchi et al., "High-Density Recording using a Red Laser Optical Head," 4th symposium on Phase Change Optical Recording Technology, the Japan Society of Applied Physics, 1992 at p. 58), the use of wide-band front APC makes it possible to keep RIN at −130 dB or below in pit-position recording where information is located in the center of the pit, although the carrier frequency is 8.6 MHz, twice as high as usual. It is also disclosed that noise jitters are sufficiently small. That is, it is understood that in pit-position recording where information resides at the peak of the reproduced signal, the reduction of laser noise by wide-band front APC is effective. When edge recording was achieved, however, which gave information to the pit edge or the mark edge to achieve higher recording density than that in pit-position recording, there arose a problem not found in conventional pit-position recording.

Figure 17:
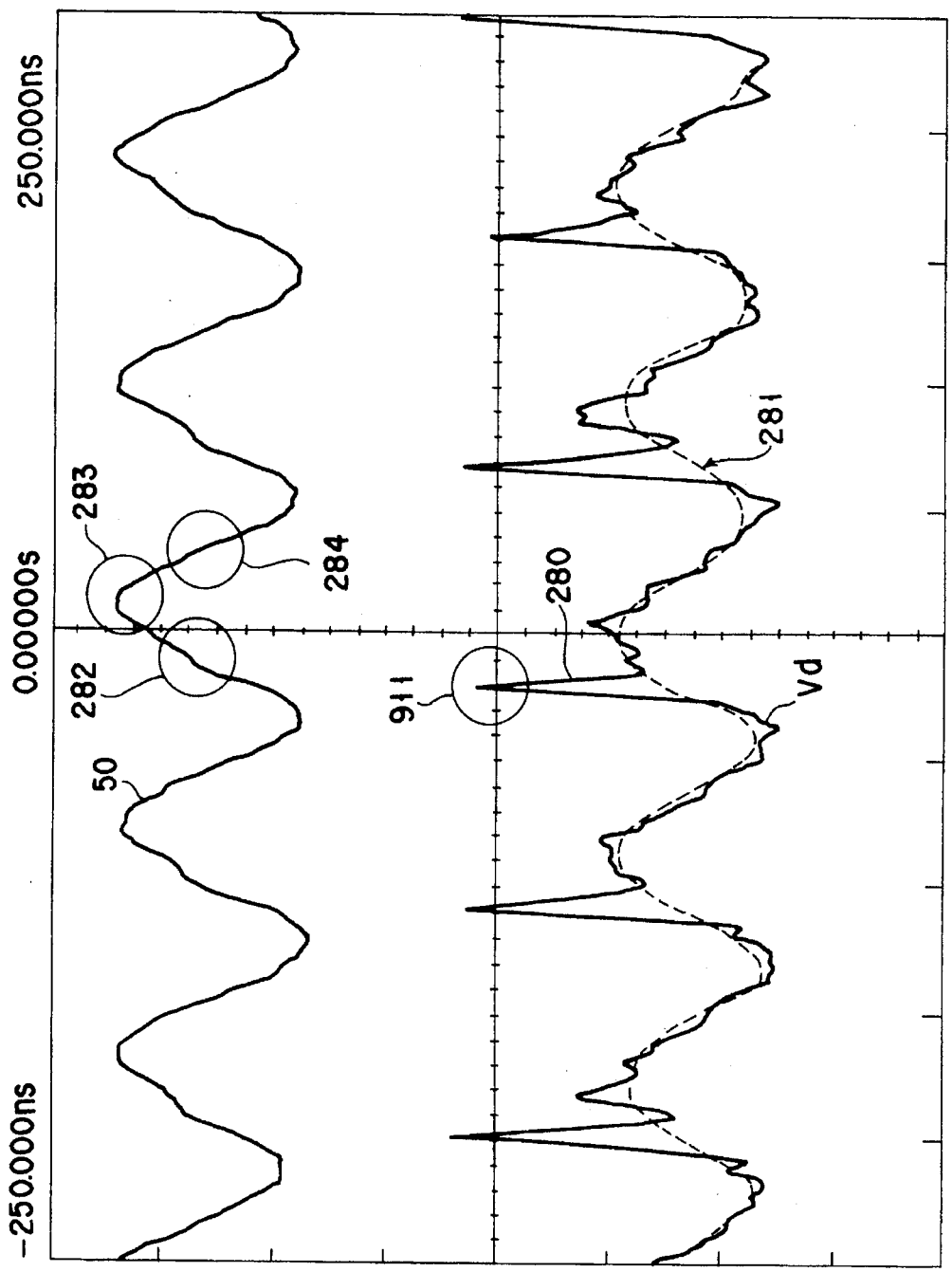
FIG. 17 shows in waveform a reproduction signal and laser drive signal in the case of a phase-change/edge-recording type optical disk.

FIG. 17 shows waveforms of the reproduced information signal 50 of a phase-change optical disk recorded in edge recording (the direction in which the signal increases is the direction in which the reflectivity of the optical disk decreases) and the laser driving signal Vd (AC component). The driving signal Vd, when the control signal is seen microscopically with respect to time, has a waveform where the residual mode hopping noise 280 caused because the control system could not follow the mode hopping caused by the returned light is superimposed on the returned-light noise 281 due to a change in the reflectivity of the mark on the optical disk. When this driving signal Vd is inputted to the laser driver 70, the laser 16 will emit light including the noise component.

By examining a rising portion 282, a peak 283, and a falling portion 284 of the reproduced signal 50 in which noise is enhanced, it will be understood that the position of the peak 283 is almost the same between any marks, but the shades of the rising portion 282 and the falling portion 284 differ widely. Specifically, rising portion 282 is affected by the residual mode hopping noise, so that the slope near the center of the waveform (this is where there is information in edge recording) is gentle. Since the reproduction of information needs the differential of the reproduced-signal waveform, so that when the slope of the waveform becomes gentle at a certain position of the information as described above, great noise jitters can take place, thus disabling the exact reproduction of the information.

In this embodiment, the reproduced signal 50 undergoes band limitation by the LPF 279 to produce a signal 50a for binarization. The noise, however, cannot be eliminated sufficiently by LPF 279 only. Although such noise is contained in the control signal inputted to the laser driver 70, passing it through the LPF makes it much more difficult to follow the mode hopping, resulting in a wider pulse width. Widening the control band narrows the pulse width, reducing its effect. Since a trend toward higher recording density leads to wider signal bands, there actually arises a difficult problem.

To solve this problem, this embodiment pays attention to the fact that the control signal obtained from the wide-band front APC circuit 52c (for example, the control signal Vd generated from the adder 64) contains a laser-noise component; by using the control signal Vd, the laser noise contained in the reproduced signal 50 can be reduced in the embodiment. The arrangement of such a laser-noise reduction circuit will be explained below.

The other half of the divided control signal Vd is supplied through an AC-coupling buffer amplifier 274, the LPF 276, delay circuit 278, and gain adjustment circuit 80 to provide a laser-noise monitor signal 84, which is then supplied to subtractor 48. Although it is desirable that the AC-coupling frequency of buffer amplifier 274 should be set to several MHz so as to eliminate the low-frequency components enhanced by operational amplifier 56, the setting may be rough because APC circuit 52c has the noise suppressing effect. The characteristic of LPF 276, together with delay circuit 278, is used to compensate for the low-pass characteristic of the reproduction system (in this example, signal processing circuit 46 and LPF 279) through which the reproduced signal 50 has passed. It is desirable that a laser-noise monitor signal 84 with a characteristic almost equivalent to that of the playback system should be obtained. In practice, however, it is not necessary that LPF 276 should have completely the same characteristic as that of the playback system, but a simple first-order LPF may be sufficient.

Since the phase of the laser-noise component contained in the control signal Vd supplied through the LPF 276 leads that of the reproduced signal 50, the delay circuit 278 is provided to delay the phase to match it with that of reproduced signal 50. The leading of the phase of the control signal ahead of that of signal 50 is ascribed to the APC circuit 52c compensating for the delay at the laser 16 and the photodetector 38.

After having been delayed at the delay circuit 278, the output signal of the LPF 276 is gain-adjusted by the gain adjuster 80 to produce a laser-noise monitor signal 84. This monitor signal 84 has basically the same phase as that of the laser-noise component contained in the reproduced signal 50. Therefore, by causing the subtractor 82 to subtract the laser-noise monitor signal 84 from the reproduced signal 50a subjected to band limitation at the LPF 279, there may be obtained a noise-eliminated reproduction signal 86 whose laser noise including one due to the residual mode hopping is suppressed more successfully.

The pass band of the LPF 276, the amount of delay at the delay circuit 278, and the amount of gain adjustment at the gain adjuster 80 are determined by the type of optical disk 12 and the band of the data signal contained in the reproduced information signal 50. In this case, it is ideal that for patterns in the data signal whose margin is the narrowest (the worst case), those factors are set so that the noise jitters of the reproduced signal particularly at the edge front may be minimized. To achieve this, troublesome measurements are necessary.

For a more simple approach, the pass band of LPF 276, the amount of delay at delay circuit 278, and the amount of gain adjustment at gain adjuster 80 may be determined so that the noise level at the maximum recording frequency of the reproduced signal may be minimized. More specifically, in the first place, the pass band of LPF 279 in the playback signal system is determined (normally, approximately 1.5 to 2 times the carrier frequency); then, the amount of phase lead of the control signal Vd (the amount of compensation for the delay due to the laser 16 and the photodetector 38) is measured. The amount of phase lead is normally on the order of 10 ms. Strictly speaking, for example, it is preferable that the measurement of the amount of phase lead should be made through adjustment using a delay line with taps. A fixed delay line may be used provided that the phase difference between the reproduced signal outputted from LPF 279 and the output signal of LPF 276 is previously measured accurately. The gain adjustment of the gain adjuster 80 can generally be finished easily by making the terminal resistance of delay circuit 278 variable.

Figure 18:
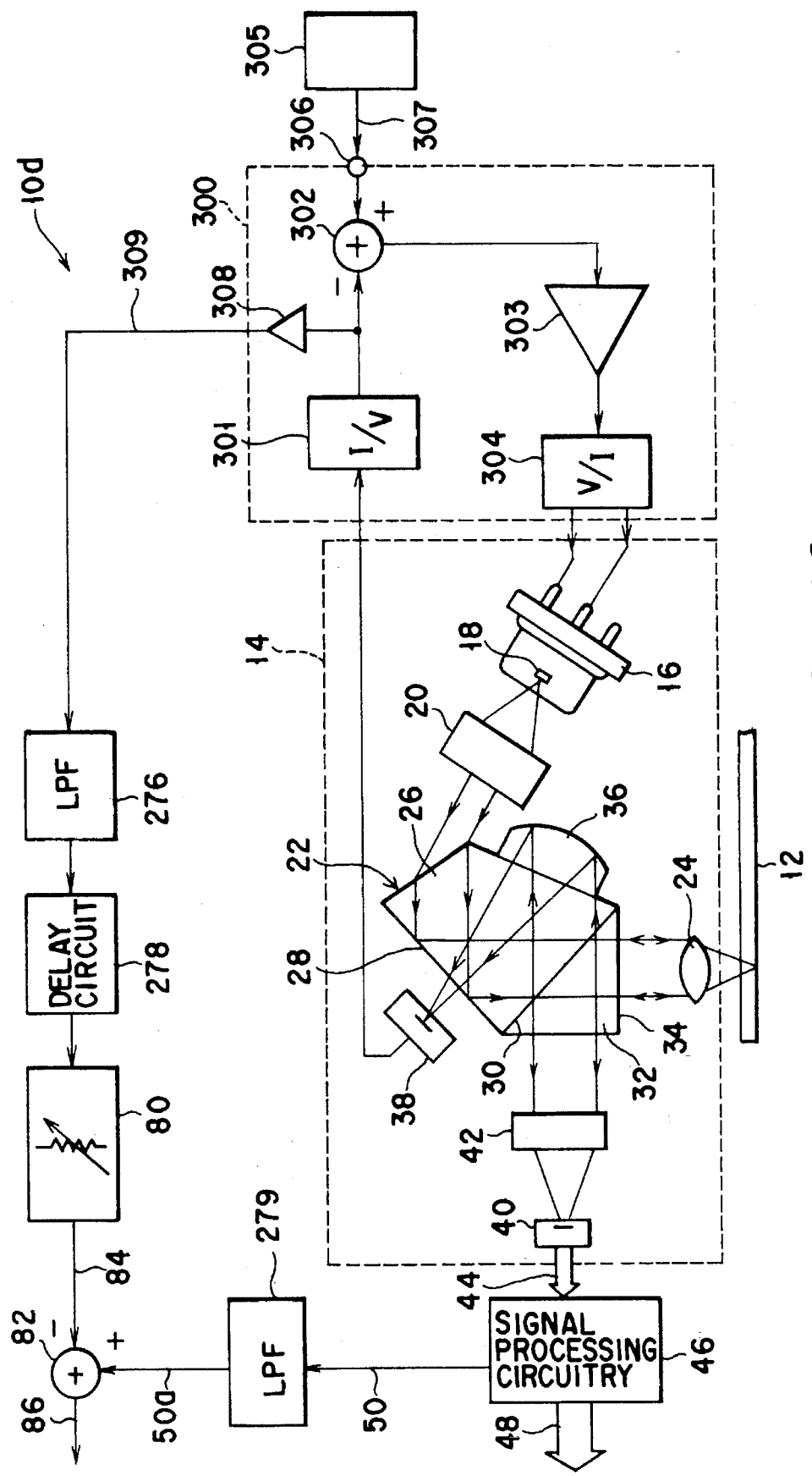
FIG. 18 shows a modification of the embodiment of FIG. 16.

An optical record/playback apparatus 10d shown in FIG. 18 is similar to that of FIG. 16 with the APC unit 52c and the record/playback controller 54 being replaced with a wide-band front APC unit 300 and an external record/playback controller 305. In other words, this embodiment 10d differs from the embodiment 10c of FIG. 16 in the configuration of the wide-band front APC circuit 300 and the method of generating the laser-noise monitor signal 84 from which the subtractor 82 subtracts the laser noise contained in the reproduced signal 50. Specifically, APC circuit 300 includes an I/V converter 301, a subtractor 302, an amplifier 303, and a current driving circuit 304 that drives the laser 16, and has its input terminal 306 inputted with a modulation signal 307 from the external record/playback controller 305.

The monitor current according to the intensity of the front light of the laser 16 outputted from the photodetector 38 in the optical head section 14 is converted by I/V converter 301 into a voltage signal. The output signal of I/V converter 301 is divided in two, one of which is supplied as a normal sensed signal for APC to the subtractor 302, which subtracts it from the modulation signal 307. For this signal 307, a voltage modulated according to the information signal to be recorded is inputted during recording, whereas a constant voltage is inputted during playback. The output signal of subtractor 302 is amplified at the amplifier 303, and is supplied to the current driver 304. Driver 304 performs a V/I conversion of the output signal of amplifier 303 and supplies the output current to the laser 16. This permits the amount of front light of laser 16 to be modulated in accordance with the modulation signal 307 during recording. During playback, the voltage of the output signal of I/V converter 301 is controlled so as to agree with the voltage of modulation signal 307.

In this embodiment, after part of the other half of the output signal of the I/V converter 301 has been supplied to the buffer amplifier 308, it goes through the LPF 276, delay circuit 278, and gain adjuster 80 to provide a laser-noise monitor signal 84 as explained previously in the embodiment 10c of FIG. 10. As with the embodiment 10c, the laser-noise monitor signal 84 is supplied to the subtractor 82, which subtracts it from the reproduced signal 50a. This makes it possible to obtain a noise-eliminated reproduced signal 86 whose laser noise is suppressed more from the output of subtractor 82.

The gist of the invention explained referring to FIGS. 10 to 18 is that a laser noise including the residual mode hopping noise contained in the reproduced information signal is offset for noise removal by using the laser-noise signal obtained from the wide-band front APC. Even when a high-frequency superposing circuit is used, the use of the wide-band front APC of the present invention enables laser noise to be decreased much more.

While in the above embodiments 200, 200a, 10c and 10d, the compound prism structure 22 is used in the optical head section 14, the emitted light from the laser 16 may be divided in two by a glass or a splitting mirror (including those of different transmittance and reflectivity), one of which may be directed to the optical disk 12 and the other of which be introduced to the photodetector 38.

The configuration of the laser-noise reducing circuit may be modified as follows. For example, the buffer amplifier 274 or 308 and the LPF 276 may be integrally formed by adding a capacitor to the transistor amplifier at the first stage to achieve an LPF characteristic. Buffer amplifier 274 or 308 may be provided with the function of the gain adjustment circuit 284. Further, the gain adjustment may be made using the load resistance of LPF 276. The function of automatically adjusting the gain according to a change in the reflectivity of the optical disk 12 and the level of the reproduced signal may be provided for buffer amplifier 274 or 308.

The laser noise contained in the reproduced signal is not necessarily eliminated over the entire band. Since it is a the band corresponding to the signal band of the data of the reproduced signal recorded on the optical disk that laser noise must be basically eliminated, the filtering in obtaining a laser-noise monitor signal may use a band-pass filter (BPF) instead of the LPF. while, in the embodiment, the emitted light from the laser 16 is used as it is in the optical head 14, the emitted light may be passed through a nonlinear optical element such as an SHG (second-harmonic generator) for light-to-frequency conversion and then be projected onto optical disk 12 or photodetector 38.

Next explained will be semiconductor laser driving circuits most suitable for the optical information record/playback apparatus such as the above-described optical-disk apparatus.

The recording on an optical recording medium such as an optical disk is performed by gathering the output light of the semiconductor laser subjected to light-intensity modulation according to the recording information signal and then projecting it onto the optical recording medium. To achieve the light-intensity modulation of the semiconductor laser requires a semi-conductor laser driving circuit for modulating the driving signal of the semiconductor laser in accordance with the recording information signal. A conventional cathode-common semiconductor laser driving circuit has been disclosed in, for example, Published Unexamined Japanese Patent Application (PUJPA) 2-206,187. This semiconductor laser driving circuit is roughly composed of two control systems: read power control during playback and write power control during recording. Since write power control needs a band of 40 MHz or above, the loop of the read power control system is opened during the write power emission by opening the analog switch, thereby carrying out write power control in a manner of open control. The reason for this is that the closed loop band of the read power control system can be secured for a range of approximately 1 MHz at most.

When the write data is a "1", the write power driving circuit, applies a write power control voltage $V_W$ to the base of a PNP transistor via a switch circuit to make the transistor on and thus allows a driving current to flow in the semiconductor laser. At this time, the semiconductor laser emits write power. when the write data is a "0", the emission of write power is not achieved. The write power driving circuit, however, is not suitable for high speed operation since there are no high-speed PNP transistors. To solve this problem, a method of using NPN transistors has been proposed in PUJPA 2-193,332. In this case, there is a problem: when the forward voltage of the semiconductor laser varies as the temperature changes or when the base-emitter voltage of the transistor varies, the driving current fluctuates, resulting in the unstable write power.

Explained below will be a semiconductor laser driving circuit with which write power does not fluctuate even if the forward voltage of the semiconductor laser or the base-emitter voltage of the transistor fluctuates in a case where NPN transistors are used as semiconductor-laser driving transistors. The semiconductor-laser driving circuit is constructed so as to feed back the forward voltage of the semiconductor laser to offset fluctuations in the forward voltage. It is also designed to offset fluctuations in the base-emitter voltage of the driving transistor by making calculations using the base-emitter voltage of the driving transistor and the base-emitter voltage produced by another transistor of the same characteristic as that of the driving transistor.

In this way, even if the forward voltage of the semiconductor laser or the base-emitter voltage of the driving transistor varies, the driving current of the semiconductor laser remains unchanged, which thus suppresses the fluctuation of write power, thereby enabling stable recording and reproducing. Hereinafter, embodiments of a semiconductor laser driving circuit embodying the concept of the invention will be explained.

In a semiconductor-laser driving circuit 400 shown in FIG. 19, a signal obtained by receiving part of the output light of a semiconductor laser 402 at a photodetector 401 during playback is monitored by a sensor circuit 403 composed of a buffer amplifier and an operational amplifier. This sensor circuit 403, like the conventional example disclosed in PUJPA 2-206,187, contains a buffer and an operational amplifier being associated with two resistors as shown in FIG. 19. A read-power control system is constructed so that the output voltage of the sensor circuit 403 may be equal to the read-power control voltage VR. At this time, because the recording gate WGT goes low to close an analog switch 404, the read-power control system makes a closed loop. Pulse sequences at primary portions during playback are shown in FIG. 20.

Figure 20:
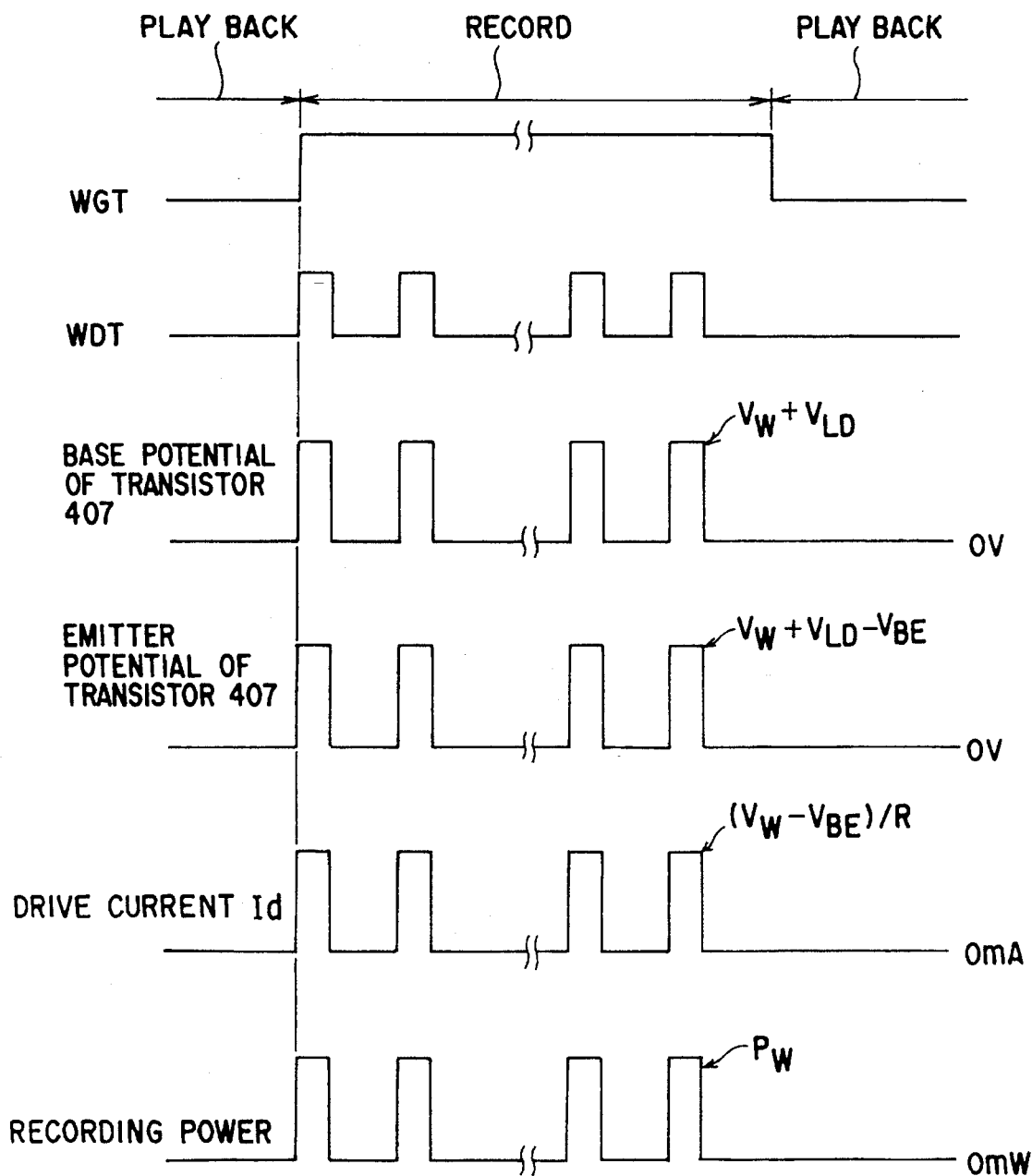
FIG. 20 is an illustration of timing diagram showing the pulsing sequences of the embodiment of FIG. 19.

Next, during recording, as shown in FIG. 20, when the recording gate WGT goes high and the analog switch 404 is opened during this period of time, this places the read power control system in the open state. At the same time, when binary recording data WDT is inputted and a switch circuit 405 is closed during the time that the recording data WDT is high, the output of the operational amplifier 406 is inputted to the base of the NPN transistor 407. At this time, because the forward voltage $V_{LD}$ of the semiconductor laser 402 is fed back to an adder composed of an operational amplifier 406, which adds the forward voltage $V_{LD}$ to the write power control voltage $V_W$, the emitter voltage of the transistor 407 is $V_W+V_{LD}-V_{BE}$. Here, the driving current Id flowing through the semiconductor laser 402 is equal to the current flowing through a resistor 408 (resistance value R) and is expressed as:

$$Id=\{(V_W+V_{LD}-V_{BE})-V_{LD}\}/R=(V_W-V_{BE})/R. \qquad (1)$$

Therefore, the driving current Id becomes independent of $V_{LD}$.

Since semiconductor lasers generally have such a current-light output characteristic as shown in FIG. 21, the write power PW emitted from the semiconductor laser 402 changes almost linearly with the driving current Id. Consequently, the write power PW does not depend on the forward voltage $V_{LD}$ of the semiconductor laser 402, either. In other words, even if $V_{LD}$ fluctuates, the write power PW remains unchanged.

Incidentally, in a case where the forward voltage $V_{LD}$ of the semiconductor laser 402 is not fed back and the driving current Id is not corrected, the noncorrected driving current (assumed to be Id') is expressed as:

$$Id'=\{(V_W-V_{BE})-V_{LD}\}/R. \qquad (2)$$

For example, when $V_W$=3.0 volts, $V_{BE}$=0.6 volts, R=12 ohms, and $V_{LD}$=1.7 volts, the write power PW will be 30 mW.

If the forward voltage $V_{LD}$ of the semiconductor laser 402 has a temperature characteristic of −1.5 mV/°C., the $V_{LD}$ will fluctuate by 45 mV with a temperature change of 30° C., with the result that the driving current Id' will change by 3.8 mA and the write power fluctuates by 2 mV.

Figure 22:
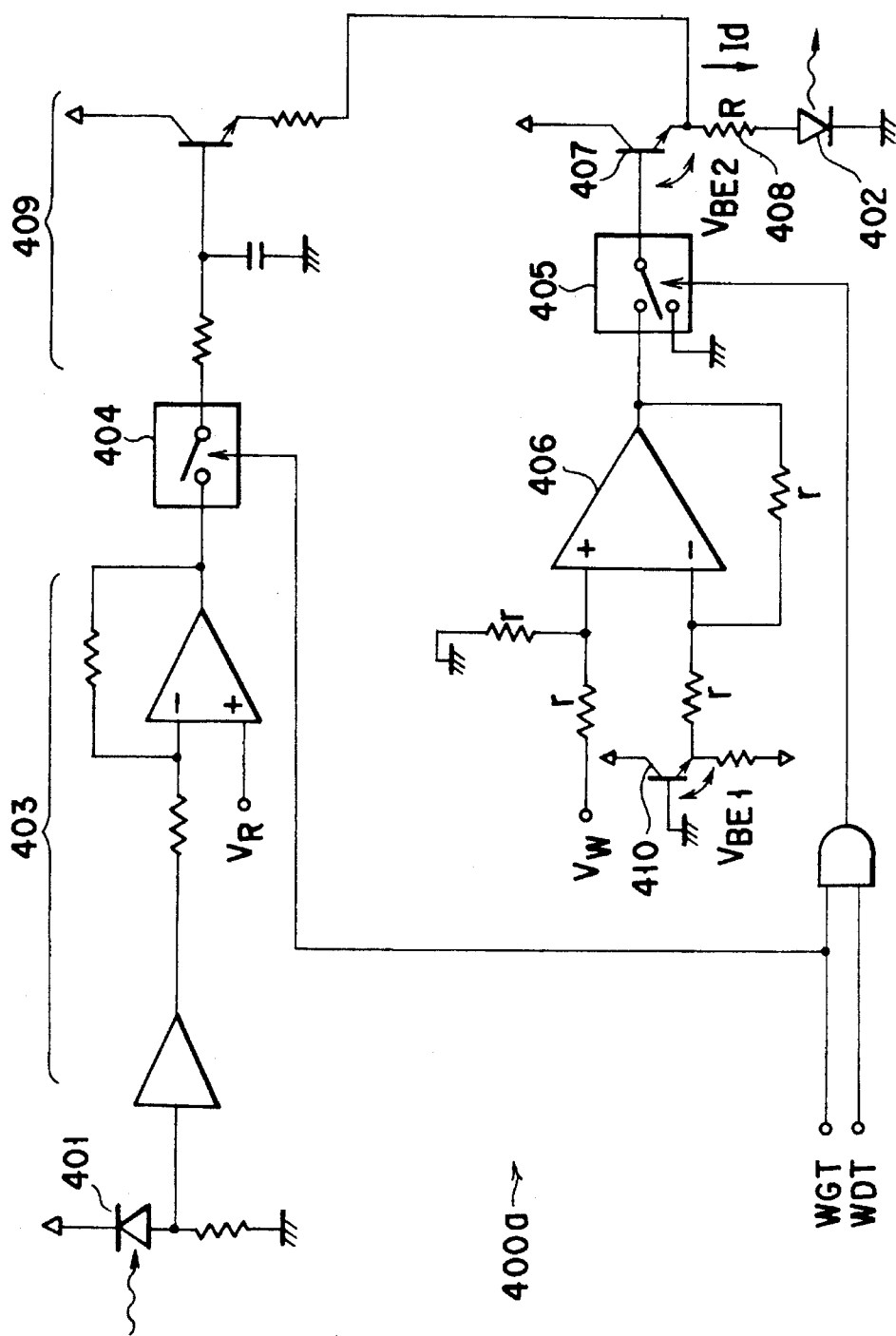
FIG. 22 is a diagram showing another semiconductor laser driving circuit that may be preferably used in the optical record/playback apparatus in accordance with the invention.

Another semiconductor-laser driving circuit 400a is shown in FIG. 22, wherein a signal obtained by receiving part of the output light of the semiconductor laser 402 at the photodetector 401 during playback is monitored by the detection circuit 403 composed of a buffer amplifier and an operational amplifier. A read-power control system is constructed so that the output voltage of the detector 403 may be equal to the read-power control voltage $v_R$. At this time, because the recording gate WGT goes low to close the analog switch 404, the read power control system makes a closed loop.

Figure 23:
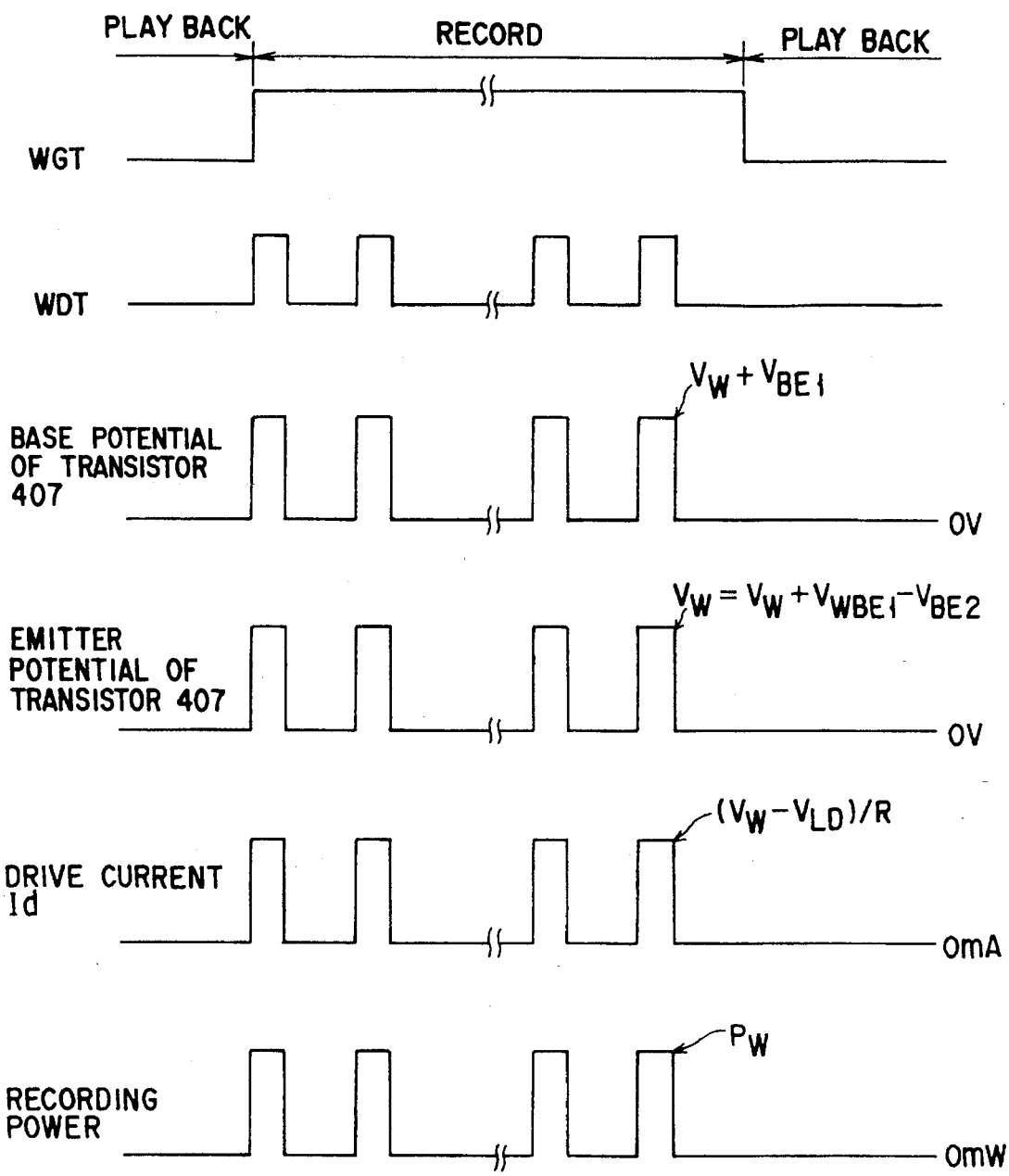
FIG. 23 is a timing diagram showing the pulsing sequences of the embodiment of FIG. 22.

During recording, as shown in FIG. 23, when the recording gate WGT goes high and the analog switch 404 is opened during this period of time, this places the read power control system in the open state. At the same time, when binary recording data WDT is inputted and the switch circuit 405 is closed during the time that the recording data WDT is high, the output of the operational amplifier 406 is inputted to the base of the NPN transistor 407.

At this time, the base-emitter voltage produced by a newly provided transistor 408 of the same characteristic as that of the transistor 407 is added to the write power control voltage $V_W$ at the adder circuit composed of an operational amplifier 406. Actually, however, the base-emitter voltage, which is inputted in the form of a negative voltage, is subtracted from the write-power control voltage $V_W$ to achieve addition.

Therefore, if the base-emitter voltages of transistors 410 and 407 are $V_{BE1}$ and $V_{BE2}$, the emitter voltage of the transistor 407 will be substantially equal to: $(V_W+V_{BE1})-V_{BE2}$.

Here, when transistors of the same characteristic are used for transistors 407, 410, it can be assumed that $V_{BE1}$ is equal to $V_{BE2}$, so that the emitter voltage of the transistor 407 can be renamed $V_W$. In this case, because the driving current Id flowing through the semi-conductor laser 402 is equal to the current flowing through the resistor 408 (whose resistance value is assumed to be R) and is expressed as $(V_W-V_{LD})/R$, it does not depend on $V_{BE2}$.

Since the semiconductor laser 400a of FIG. 22 also has such a current-light output characteristic as shown in FIG. 21, the write power PW does not depend on the $V_{BE2}$ of the transistor 407. In other words, even if $V_{BE2}$ fluctuates, the write power PW remains unchanged.

Incidentally, in a case where the forward voltage $V_{BE2}$ of the transistor 407 is generated at the transistor 410 but not corrected, the non-corrected driving current Id' is expressed as:

$$Id'=\{(V_W-V_{BE2})-V_{LD}\}/R. \qquad (3)$$

For example, when $V_W$=3.0 volts, $V_{BE}$=0.6 volts, R=12 ohms, and $V_{LD}$=1.7 volts, the write power PW will be 30 mW. When the base-emitter voltage $V_{BE2}$ of the transistor 402 changes by 50 mV as temperature changes, the driving current Id' will change by 4.2 mA and the write power fluctuates by 2.1 mV.

With the semiconductor-laser driving circuits 400, 400a of this invention, either by feeding back the forward voltage of the semiconductor laser for calculation with the write power control voltage and inputting the result to the driving transistor, or by performing calculations using the write power control voltage and the emitter-base voltage of the transistor and inputting the result at the time of driving the semiconductor laser, the driving current can be kept constant even if the forward voltage of the semiconductor laser or the emitter-base voltage of the driving transistor fluctuates, thereby making it possible to keep the write power constant. Further, with this arrangement, NPN transistors can be used as semiconductor-laser driving transistors, thereby enabling the achievement of a high-speed operation.

Figure 24:
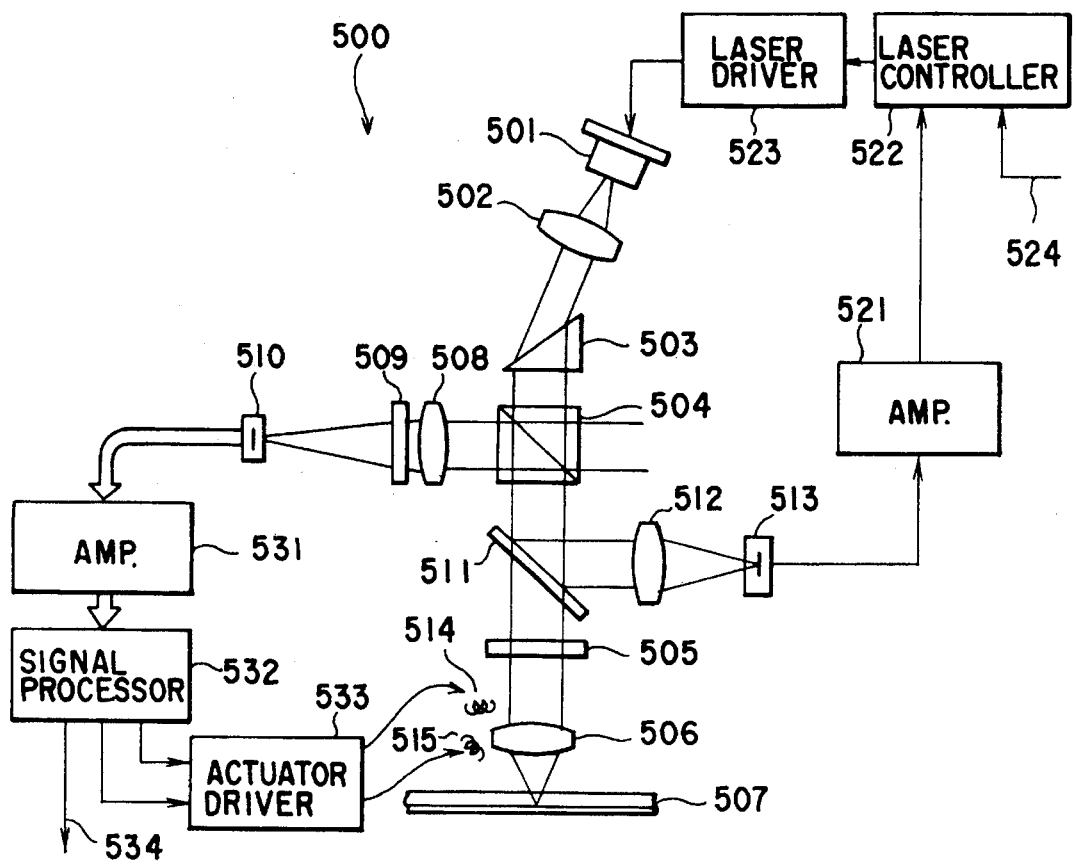
FIG. 24 is a diagram showing an optical record/playback apparatus in accordance with a further embodiment of the invention.

An optical record/playback apparatus 500 shown in FIG. 24 is arranged including a semiconductor laser 501, a collimator lens 502, a beam reshaping prism 503, a beam splitters 504, 511, a λ/4 (quarter undulation) plate 505, an objective lens 506, an optical disk 507, a condenser lens 508, a holographic optical element (HOE) 509, a photodetectors 510, 513, a focus drive coil 514 and a tracking drive coil 515.

A luminous flux (front light) output from the semiconductor laser 501 is converted by the collimator lens 502 into parallel luminous flux, which is then reshaped by the prism 503 so that its anisotropic beam shape is converted into an isotropic beam shape. Thereafter, such a reshaped beam enters the objective lens 506, which causes the beam to focus onto the recording surface of optical disk 507 to form a small beam spot thereon. A light reflected from the recording surface of optical disk 507 propagates through objective lens 506 to reach the beam splitter 504, which serves as a first optical separator, and is then reflected therefrom toward a signal detection system constituted by the condenser lens 508, HOE 509 and photodetector 510. Photodetector 510 generates an electrical detection signal, which is supplied through an amplifier circuit 531 to a signal processing section 532. This signal processor generates a reproduced information signal 534, a focus error signal and a tracking error signal. These error signals are supplied through an actuator driver 533 to the focus drive coil 514 and the tracking drive coil 515, respectively. Coils 514, 515 control the position of objective lens 506 by causing lens 506 to move in the optical-axis direction and in the radial direction of optical disk 507, whereby the small focused beam spot is positionally controlled with respect to the information recorded on optical disk 507 to ensure that the recording and playback operations are stably performed.

Very importantly, the light passed through the beam splitter 504 is introduced onto the other beam splitter 511 acting as a second optical separator, which extracts a part of the light that travels toward the optical disk 507. The extracted part of light is projected by a condenser lens 512 onto the photodetector 513, which detects variations in the amount of light. An output signal of photodetector 513 is supplied through an amplifier 521 to a laser control section 522, and is then subjected to a comparison-processing with an optical output control signal 524. The comparison-processing results of the laser controller 522 are input to a laser driver 523, which controls the semiconductor laser 501 by modifying the value of a drive current being fed to laser 501 so that the actual light emission of laser 501 is suitably adjusted or optimized in intensity when optical output control signal 524 is set at a constant level (during a playback operation, for example), laser 501 is so controlled as to remain constant in the light emission amount. Alternatively, when signal 524 is required to vary in level in accordance with a recording information, the light emission amount of laser 501 is controlled so as to vary as signal 524 varies.

Figure 25A:
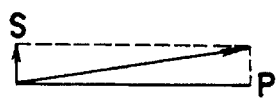
FIGS. 25A, 25B and 25C are diagrams showing different polarization states of input/output luminous flux to/from a beam splitter of FIG. 24.
Figure 25B:
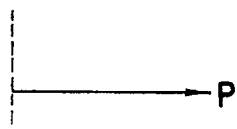
Figure 25C:
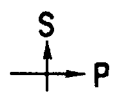

In the case wherein the light emitted by the semiconductor laser 501 has a certain polarized component other than parallel polarized component with respect to an active layer of laser 501, the optical record/playback apparatus 500 operates as follows. FIGS. 25A to 25C show different polarization states of input/output light to/from the beam splitter 504 of FIG. 24. FIG. 25A shows the polarization state of luminous flux being input to beam splitter 504, which is substantially the same as that of a laser light emitted from laser 501. FIG. 25B indicates a polarization component of a light passed through beam splitter 504, and FIG. 25C illustrates that of a reflected light therefrom.

It will be apparent by viewing FIGS. 25A to 25C that the beam splitter 504 has a specific optical separation characteristic that prevents a light passed through beam splitter 504 from having any "s"-polarized components. While almost all "p"-polarized components are allowed to pass through beam splitter 504, a part of p-polarized components is reflected and is sent forth as a reflected light of beam splitter together with the s-polarized components. Such a part of p-polarized components will not used for a specific purpose. Conventionally, since this light is detected to control the light output of a semiconductor laser, variations in the light amount may accelerated undesirably by light-amount control operations due to an influence of the polarized light variations both in the light traveling toward an optical disk and in the light to be used for the detection for the optical output control.

The light that has passed through the beam splitter 504 is a linearly-polarized light having the p-polarized components only. This light is divided into two parts, one of which reaches the optical disk 507, and the other of which travels toward the photodetector 513. These two divided parts may exhibit substantially similar behavior to each other in variations of light amount. Accordingly, when the light emission amount of the semiconductor laser 501 is controlled on the basis of the output of photodetector 513, it becomes possible to control the light traveling toward optical disk 507 in the same manner as for the other light. For example, when information is reproduced from optical disk 507, a constant value is input as the optical output control signal 524 to perform a control operation that causes the output of photodetector 513 to remain constant so that the light toward optical disk 507 is constant in intensity.

With the embodiment 500, the first optical separator 504 is arranged for guiding a reflected light from the recording medium (optical disk) 507 so that the reflected light is projected onto the first photodetector 510 after the reflected light is separated from the light propagating from the semiconductor laser 501 toward optical disk 507. The second optical separator 511 is arranged between first optical separator 504 and optical disk 507, for separately taking out or extracting a part of the light emitted by the semiconductor laser 501 and traveling toward optical disk 507. Such a separated light by second optical separator 511 is projected onto the second photodetector 513, which detects it to control the intensity of the light emitted by laser 501. It may therefore be arranged that, while the transmittance of s-polarized component at the first optical separator 504 is substantially zero, the light passed through first optical separator 504 is guided to optical disk 507. After the polarized light component of the light passed through first optical separator 504 is converted into a specifically polarized light having the only one-directionally polarized components, a resultant light component is separated by second optical separator 511. The separated light is then detected by second photodetector 513. With such an arrangement, the light traveling toward optical disk 507 becomes similar in light amount variations to the light being detected for use in the light-output stability control. This may lead to the achievement of an enhanced stability control for the light output of laser 501 at an improved accuracy. In other words, it becomes possible to force variations in the light output of laser 501, which variations may take place due to the fact that the reflected light from optical disk 507 returns to laser 501, to be reduced or suppressed to the extent that such variations no longer affect the information record/playback operations. This ensures that the light-output control for laser 501 can be performed at an enhanced stability and an improved accuracy.

Figure 26:
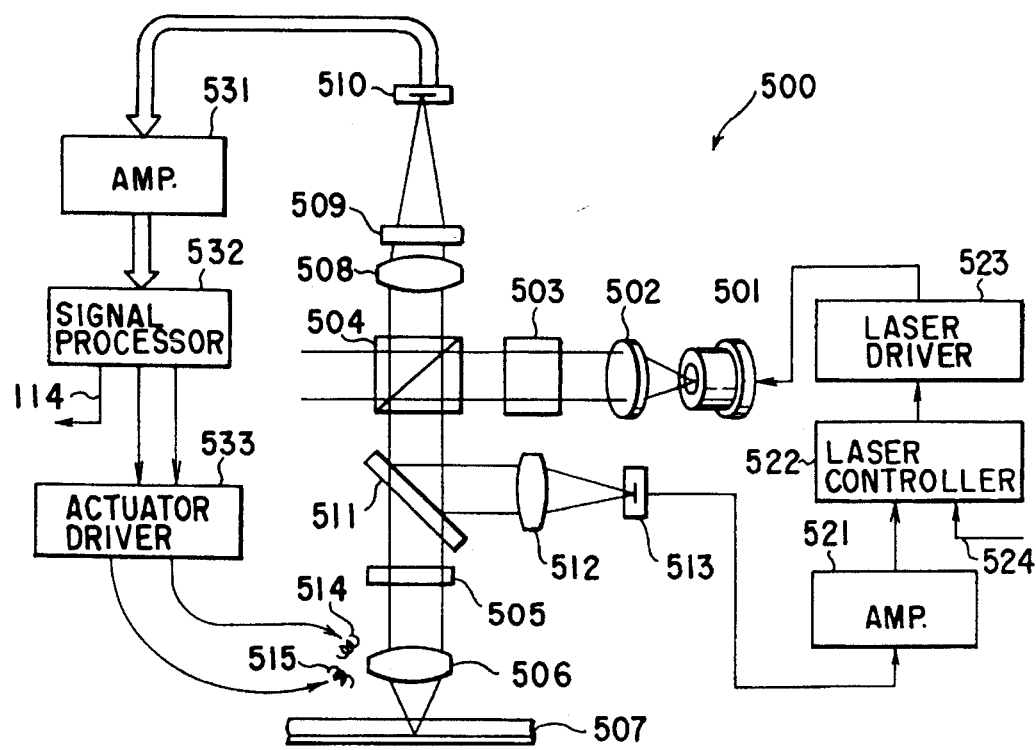
FIGS. 26 to 29 show optical record/playback apparatuses in accordance with other embodiments of the invention.

Another optical record and playback apparatus 500a is shown in FIG. 26. The apparatus is similar in arrangement and operation to that of FIG. 24 with the light that is emitted by the semiconductor laser 501 and reflected from the beam splitter 504 being guided to the optical disk 507. In this embodiment 501a, the light separation characteristic of beam splitter 504 is determined such that it prevents the reflected light from having any p-polarized components. While almost all the s-polarized components are reflected, a part of them is permitted to pass through beam splitter 504 and to send forth as a splitter-transmitted light together with the p-polarized components. The reflected light of beam splitter 504 is processed by the same light-output control system as in the embodiment 500 to be used for the light-output control for the semiconductor laser 501.

Figure 27:
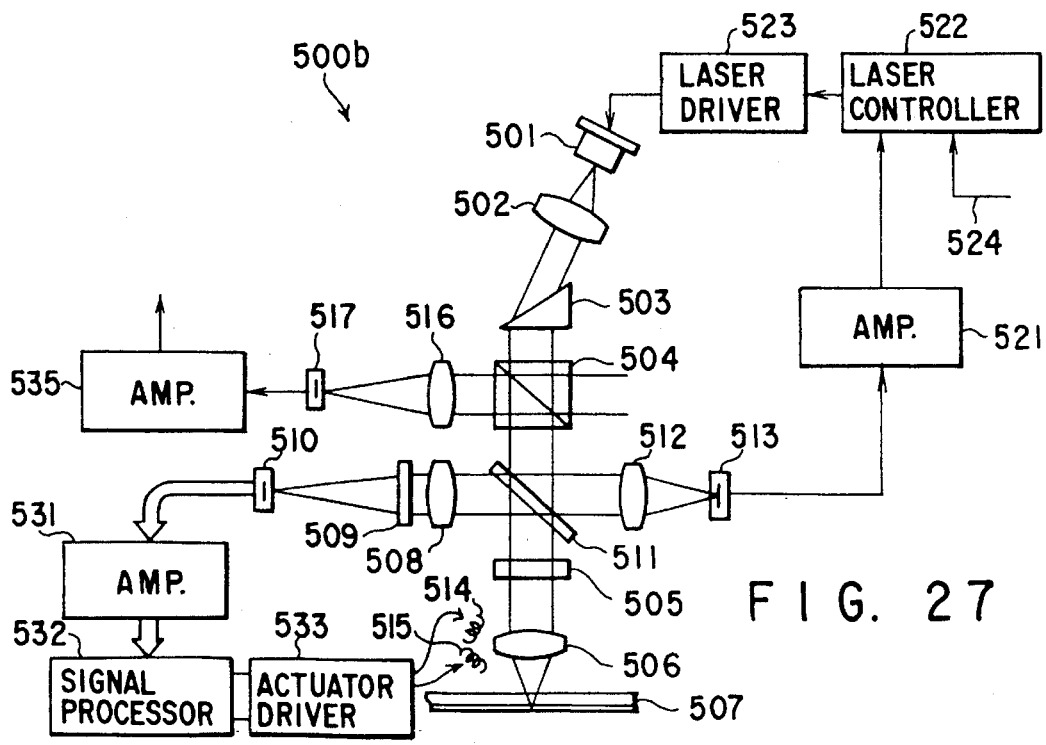

An optical record and playback apparatus 500b shown in FIG. 27 is featured in the specific arrangement concerning the signal detection system for detecting a reflected light from the optical disk 507. Three kinds of signals detected therein are arranged so that they are separately provided for (1) the detection system for a reproduced information signal detection system and (2) the detection system for a focus error signal and a tracking error signal. What is called the divided-photodetector having a plurality of divided sensitive areas is used for the detection of two error signals. Arranging the system to acquire a reproduced information signal of high frequency from such a divided-photodetector may necessitate the employment of a plurality of wide-band amplifiers, which leads to an undesirable enlargement and cost increase of the system. The embodiment 500b can solve the problem.

Figure 28:
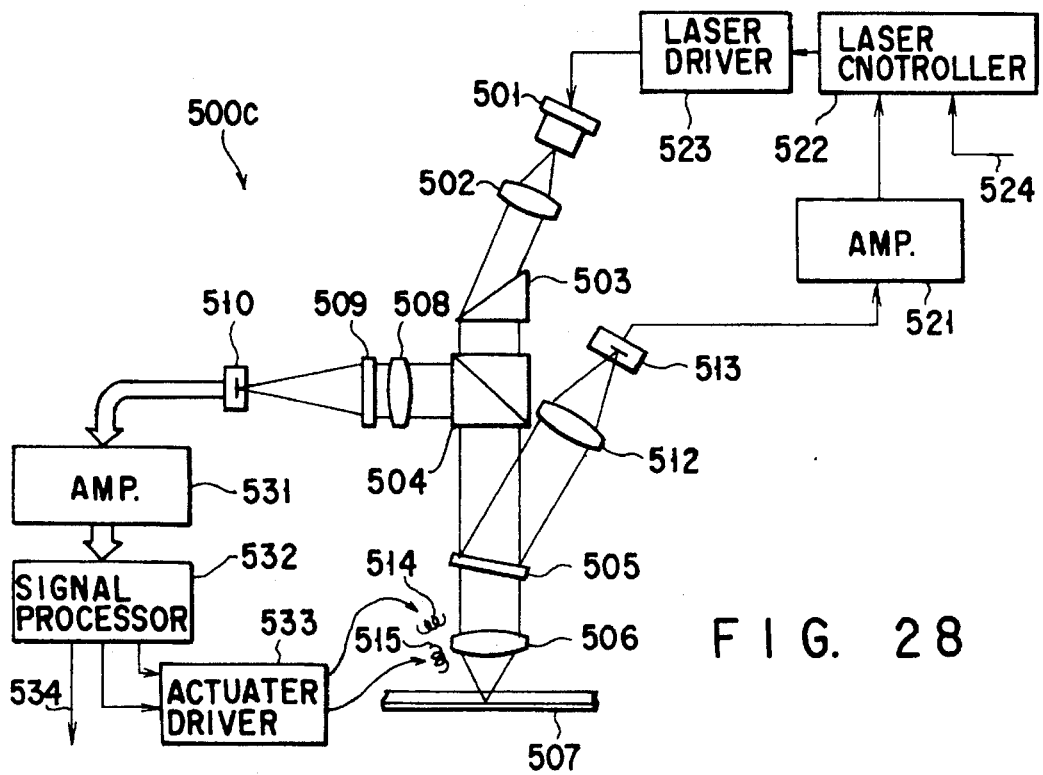

An optical record and playback apparatus 500c shown in FIG. 28 differs from that of FIG. 24 in that the quarter undulation plate 505 is specifically positioned to be slanted with respect to the optical axis, and in that a reflect light from the slanted quarter undulation plate 505 is projected onto the photodetector 513 and detected by the same. With such an arrangement, the second beam splitter 511 can be omitted. Under normal circumstances, a quarter undulation plate is coated with antireflection films on the top and bottom surfaces of it. In contrast, with the embodiment 500c, the quarter undulation plate 505 has no antireflection film on a surface whereat the front light of the semiconductor laser 501 is input, while allowing a reflection film to be arranged on the surface of quarter undulation plate 505, if required, to thereby provide a suitable reflectivity. The amount of reflected light can thus be adjusted successfully so as to ensure that the light-output control system for controlling the amount of light emitted by laser 501 can operate under the maximally optimized condition. The arrangement of this embodiment 500c may also be applied to the embodiment 500a as described previously.

Note here that the above embodiments 500, 500a, 500b and 500c are featured in that, when the light output of laser 501 is stabilized while its polarization characteristic varies with time, (1) the first optical separator (which takes out a reflected light from the optical disk 507 separately from the light traveling toward optical disk 507) is arranged to have a specific characteristic that allows a one-directionally polarized light components to pass through (or reflect) the first optical separator, (2) such light components actually passed through first optical separator is detected in a divided manner, and (3) the light-output of laser 501 is controlled by controlling the drive current supplied thereto on the basis of such a detection output. In the embodiment 500, the element of the separation characteristic that prevents a passed (transmitted) light from having any s-polarized components is used for the beam splitter 504 acting as the first optical separator; however, such an element may be replaced with a different one that prevents the transmitted light from having any p-polarized components, thus causing the transmitted light to be projected onto optical disk 507. Similarly, in the embodiment 500a, an element of the separation characteristic that prevents a reflect light from having s-polarized components, causing the reflected light to introduced onto optical disk 507.

Figure 29:
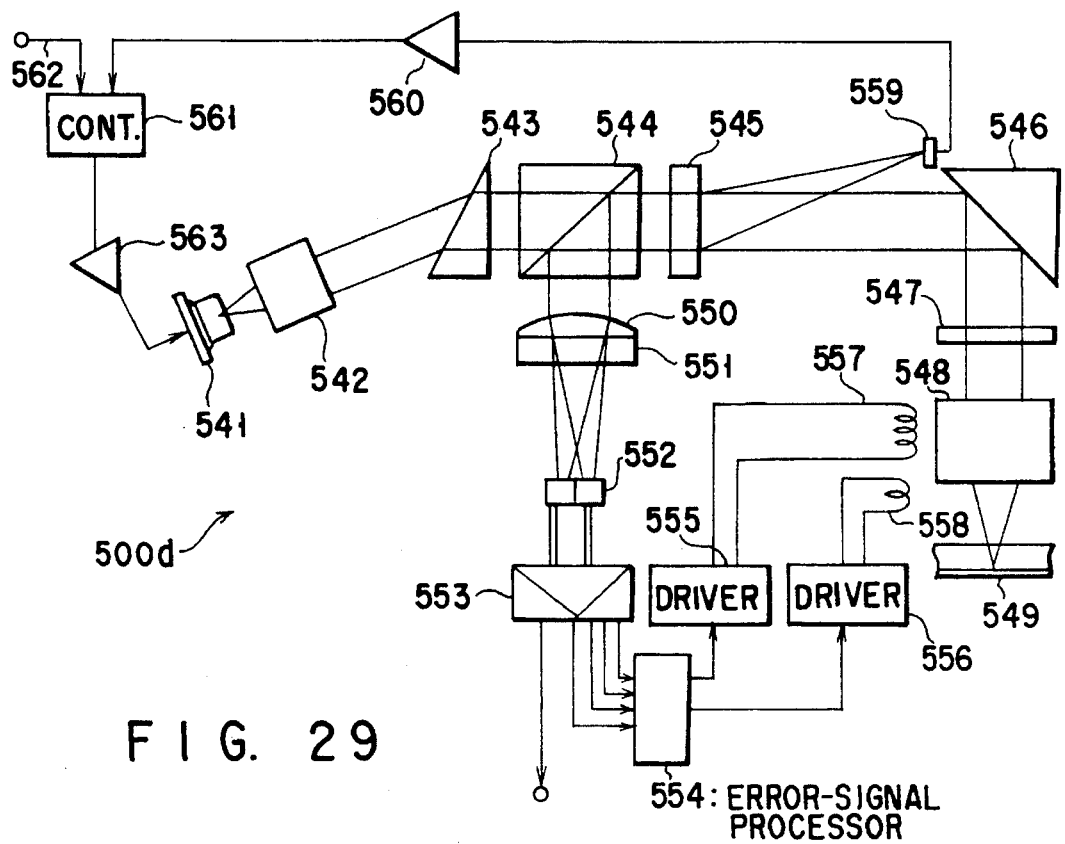

An optical record and playback apparatus 500d shown in FIG. 29 includes a semiconductor laser 541, a collimator lens 542, a beam-reshaping prism 543, a beam splitter 544, a diffraction device 545, a mirror 546, a quarter undulation plate 547, an objective lens 548, a disk-shaped optical recording medium (optical disk) 549, a condenser lens 550, a holographic optical element (HOE) 551, a photodetector 552, an amplifier 553, an error signal processor 554, a focus drive circuit 555, a tracking drive circuit 556, a focus drive coil 557 and a tracking drive coil 558. The position of quarter undulation plate 557 may be modified as far as quarter undulation plate 557 is arranged between beam splitter 544 and objective lens 548 as shown in FIG. 29. Diffraction device 545 may also be positionally modified as far as it is arranged between beam splitter 544 and objective lens 548.

The luminous flux (front light) emitted by the semiconductor laser 541 is converted by the collimator lens 542 into parallel luminous flux, which is then reshaped by beam-reshaping prism 543 so that the anisotropic beam shape is changed to isotropic beam shape. Thereafter, the reshaped beam enters objective lens 548, which causes it to be projected onto the recording surface of the optical disk 549 to form a small beam spot thereon. A reflected light from the recording surface of optical disk 549 passes through objective lens 548 and travels toward beam splitter 544. A reflected light from beam splitter 544 is guided so that it is introduced into a signal detection system consisting of the condenser lens 550, HOE 551 and photodetector 552. Photodetector 552 generates a detection signal, in response to which amplifier 553 and error signal processor 554 generate a focus error signal and a tracking error signal. On the basis of respective error signal, focus and tracking drive circuits 555, 556 electrically drive focus-drive coil 557 and tracking drive coil 558, respectively, in such a manner that objective lens 548 is positionally controlled to move in the optical axis direction and/or in the radius direction, thereby to suitably control the relative position of the small beam spot with respect to information recorded on optical disk 507 so that an information recording/reproduction operation is carried out stably. A reproduced information signal is obtained by amplifier 553.

The light output control of the semiconductor laser 541 is as follows. After passed through the beam splitter 544, a part of the light propagating toward the optical disk 549 is separated and extracted by utilizing a diffracted light at the diffraction device 545. The diffracted light coming from diffraction device 545 is detected by photodetector 559. The output of photodetector 559 is then supplied through amplifier 560 to a laser control section 561, which performs a comparison processing such that the photodetector output signal is compared with an externally supplied light output control signal 562. In responding to the output of laser controller 561, a laser driver 563 provides laser 541 with a current drive signal that varies in accordance with the comparison results of laser controller 561. The amount of light emitted by laser 541 is controlled in response to the current drive signal. When light output control signal 562 is at a constant level (during a playback operation, for example), the output light of laser 507 is controlled so that it remains constant. When control signal 562 potentially varies in accordance with information to be recorded on optical disk 507, the laser output light is controlled so as to vary in amount (intensity) as control signal 562 varies.

Figure 30A:
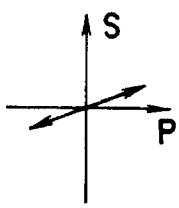
FIGS. 30A, 30B and 30C are diagrams showing different polarization states of input/output luminous flux to/from a beam splitter of FIG. 29.
Figure 30B:
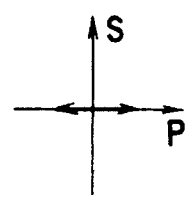
Figure 30C:
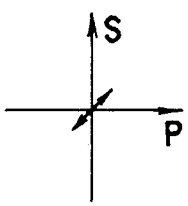

Assuming that the luminous flux (front light) of the semiconductor laser 541 has polarized light components excluding the polarized components parallel with an active layer of laser 507, the optical record/playback apparatus 500d operates as follows. The following explanation will be made with reference to FIGS. 30A to 30C, which show some polarization states of luminous flux input to and output from the beam splitter 544. FIG. 30A indicates the polarization state of light incident onto beam splitter 544, which is substantially the same as that of light emitted by laser 541. FIG. 30B illustrates the polarization state of a transmitted light passing through beam splitter 544, whereas FIG. 30C shows that of a reflected light from it. These illustrations show the light division characteristic of beam splitter 544, which prevents the transmitted light from having any s-polarized components. With such a setting, even when the polarization state of an incident light to beam splitter 544 varies, the transmitted light of this beam splitter is kept unchanged in polarization state. On the other hand, although almost all the p-polarized components pass through beam splitter 544, a part of them is permitted to send forth as a reflected light from beam splitter 544, together with the s-polarized components. The s-polarized component exists as shown in FIG. 30C. Due to this, when the polarization state of the light emitted by the laser, the polarization state of incident light to beam splitter 544 is changed, that of the reflected light changes accordingly. The polarization state of the reflected light is not changed. This means that the reflected light from beam splitter 544 will never be same in polarization state as the transmitted light. Conventionally, since this light is detected to control the light output of a semiconductor laser, variations in the light amount may accelerated undesirably by light-amount control operations due to an influence of the polarized light difference between the light traveling toward an optical disk and the light to be used for the detection for the optical output control.

The transmitted light of the beam splitter 544 is a linearly polarized light having the p-polarized component only. A part of this light is detected on the basis of a diffracted light of the diffractive device 545. Since the light traveling toward the optical disk 549 is essentially equivalent in polarization state to the light propagating toward the photodetector 559, a light amount variation that occurs due to the presence of a return light to laser 541 may exhibit a relative behavior. By taking account of it, if the light output amount of laser 541 is controlled in accordance with the output of photodetector 559, it becomes possible to control the light toward optical disk 549 to have a desired value. For example, during a playback operation for reproducing information out of optical disk 549, a fixed value is input as the optical output control signal 562, while controlling the output of photodetector 559 to be constant. The light projected onto optical disk 549 is thus kept constant.

Figure 31:
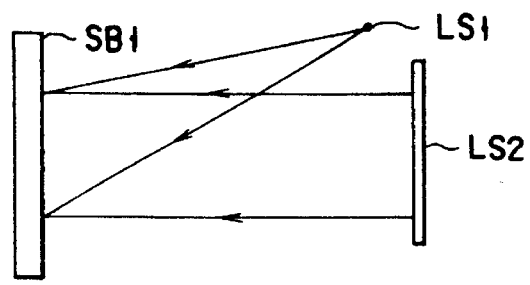
FIG. 31 is a diagram for explaining the arrangement of a diffraction type element of FIG. 29.

The diffractive device 545 is a specific type optical device which causes a diffracted light to become a condensed light. The explanation of diffractive device 545 will be continued with reference to FIG. 31. A transparent substrate SB1 is positioned with respect to a pin-point light source LS1 and a parallel light source LS2 as shown in FIG. 31. When transparent substrate SB1 is illuminated by two light sources LS1, LS2, an interference pattern is created on substrate SB1. By employing a photoresist layer, such a pattern may be fixed and formed on substrate SB1, thereby to manufacture diffractive device 545. When the interference pattern is generated, if a parallel light is incident onto the left side of transparent substrate SB1, the diffracted light becomes a condensed light, whereas a zero-dimensional light becomes a parallel light. Diffractive device 545 may alternatively be manufactured by computing the interference pattern using a numerical computation technique, and by employing a presently available mask process. Preferably, diffractive device 545 is a phase-type element that is high in transmittance.

Figure 32:
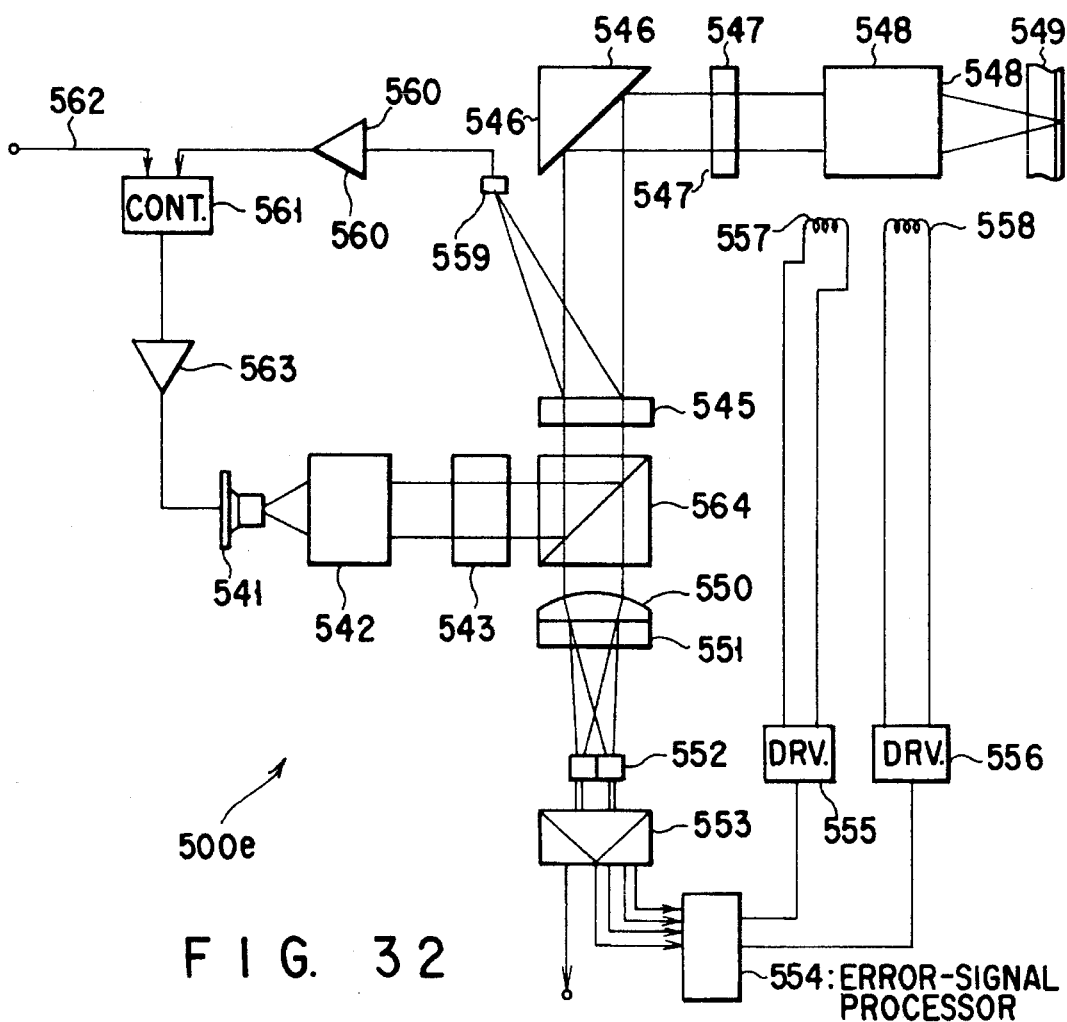

An optical record and playback apparatus 500e shown in FIG. 32 is similar to the embodiment 500d of FIG. 29 with the beam splitter 544 being replaced with a beam splitter 564 which forces a reflected light at itself to be guided to the optical disk 549. Note that beam splitter 564 has the characteristic that permit all the p-polarized components to pass through. This results in that a light to be projected onto optical disk 549 consists of s-polarized components only.

The diffracted light output of the diffractive device 545 is detected in the same manner as in the embodiment 500d, and is then supplied by way of the output control system for the light output control of the semiconductor laser 541. Note here that laser 541 has an active layer which is perpendicular with respect to the beam splitter 564; as a result, an optical system constituted by the beam-reshaping prism 543 and the collimator lens 542 is slanted along the direction perpendicular to the paper of drawing.

Figure 33:
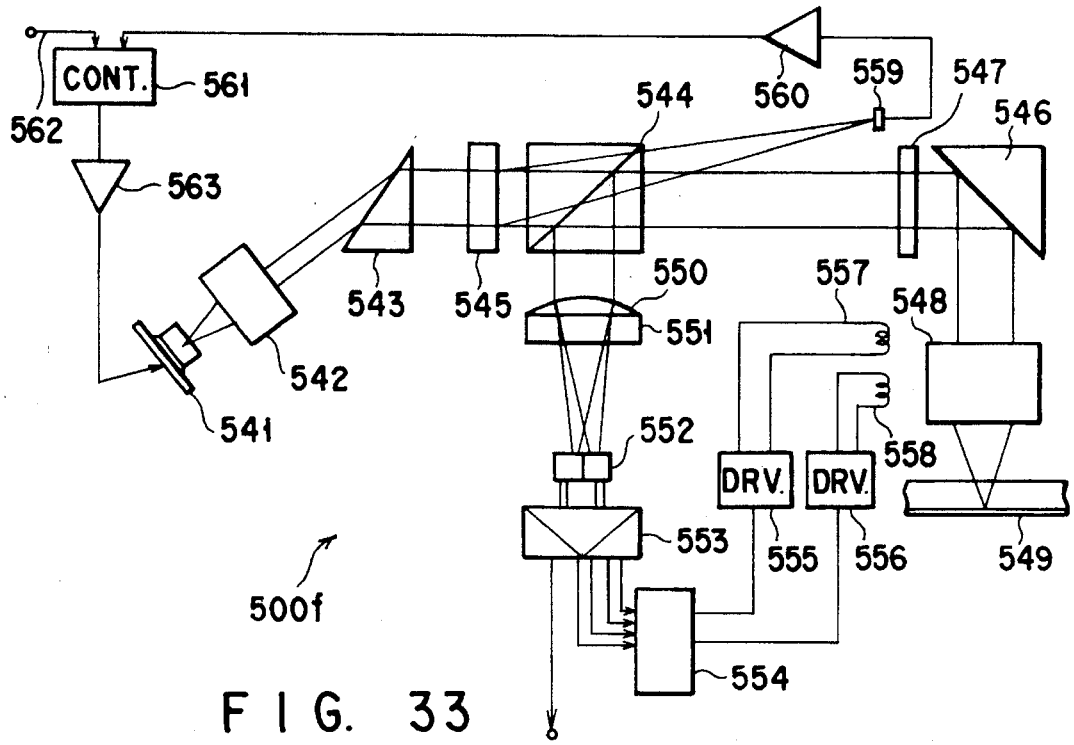

An optical record and playback apparatus 500f shown in FIG. 33 is similar to the embodiment 500d with the diffractive device 545 being positioned differently. More specifically, diffractive device 545 is positioned in front of the beam splitter 544, causing a diffracted light of device 545 to pass through beam splitter 544. After passed through beam splitter 544, the diffracted light is detected by the photodetector 559, thus controlling the light output amount of the semiconductor laser 541. Laser 541 thus changes in polarization state. Even when the polarization state of an incident light onto diffractive device 545 changes, the light being projected onto the optical disk 549 and the diffracted light of diffractive device 545 are equivalent in polarization state to each other due to the fact that the both lights pass through beam splitter 544. Controlling the light output of laser 541 on the basis of the output of photodetector 559 can control the light (luminous flux) traveling toward optical disk 549 to have a desired value. Additionally, the position of diffractive device 545 between laser 541 and beam splitter 544 may be modified as far as its diffracted light is permitted to pass through beam splitter 544.

Figure 34:
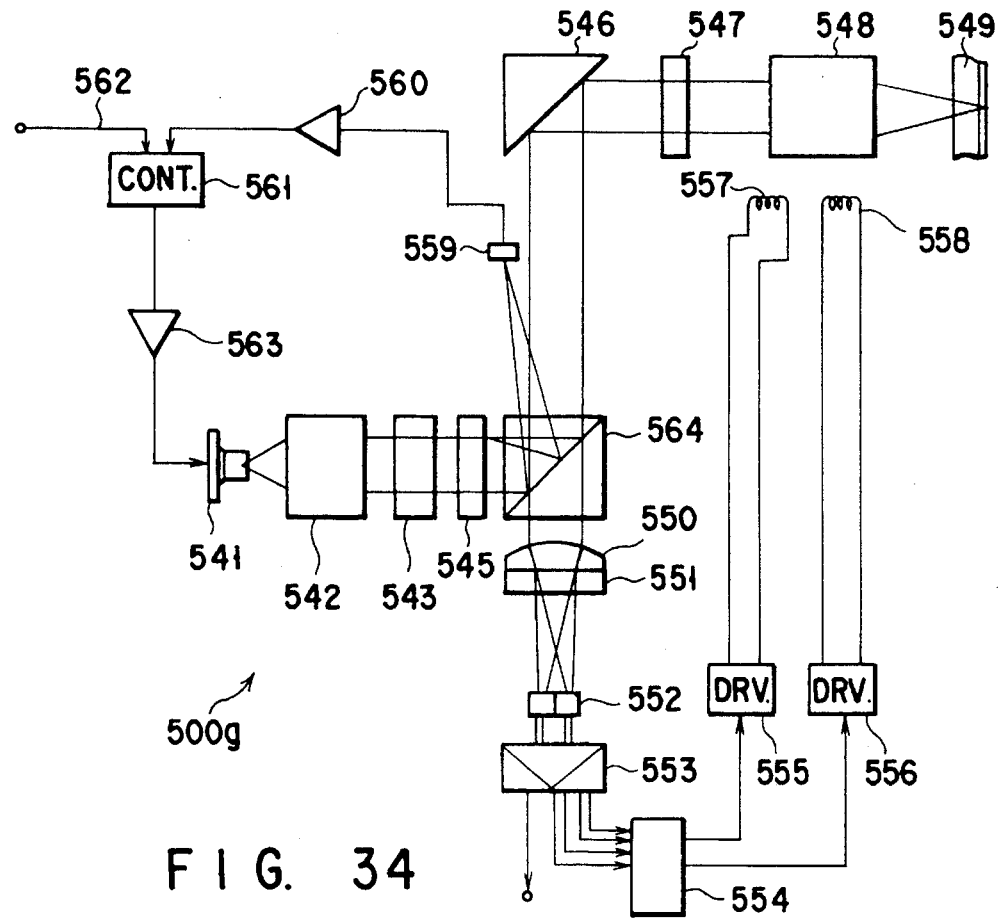

An optical record and playback apparatus 500g is shown in FIG. 34, which is similar to the embodiment 500e of FIG. 32 with the diffractive device 545 being positionally modified. More specifically, diffractive device 545 is arranged to be positioned in front of the beam splitter 564, causing a diffracted light of device 545 to be reflected at beam splitter 564. After reflected from beam splitter 564, the diffracted light of device 545 is then detected by the photodetector 559, thus controlling the light output of the semiconductor laser 541.

Accordingly, even when the polarization state of the laser 541 changes to change that of an incident light onto the diffractive device 545, only the s-polarized components of both the light projecting onto the optical disk 549 and the diffracted light by the diffractive device 545 are reflected at the beam splitter 564; therefore, the both lights become equivalent in polarization state to each other. Controlling the light output of laser 541 on the basis of the output of photodetector 559 makes it possible to control the light traveling toward optical disk 549 so that it has a desired value. The positioning of diffractive device 545 between laser 541 and beam splitter 544 may be modified as far as its diffracted light is permitted to pass through beam splitter 544. The quarter undulation plate used in the embodiments 500d to 500g may be deleted as needed.

Another optical record and playback apparatus 500h is shown in FIG. 35. The apparatus includes a semiconductor laser 571, a collimator lens 572, a beam-reshaping prism 573, a beam splitter 574, a reflection type diffractive element 575, a quarter undulation plate 576, a mirror 577, an objective lens 578, an optical disk 579, a condenser lens 580, an HOE 581, a photodetector 582, an amplifier 583, an error signal processor 584, a focus drive circuit 585, a tracking drive circuit 586, a focus drive coil 587 and a tracking drive coil 588. Quarter undulation plate 576 may be modified in position as far as it is between beam splitter 574 and objective lens 578. Similarly, reflection diffractive device 575 may be positionally modified as far as it positions between beam splitter 574 and objective lens 578. It is not permitted that the positioning order of reflection diffractive device 575 and quarter undulation plate 576 are changed or replaced with each other. Mirror 577 is provided for changing the propagating direction of light, and does not influence the intended function of an optical head section; such a mirror may be omitted when reduced to practice.

A luminous flux (front light) of the semiconductor laser 571 reaches the collimator lens 572, which converts it into parallel luminous flux. This light is reshaped by the prism 573, causing its isotropic beam shape to become isotropic shape. Such a reshaped beam is then projected by the objective lens 578 onto the recording surface of the optical disk 579, thereby to form a small beam spot thereon. A reflected light from the recording surface of optical disk 579 returns to objective lens 578, passes through this lens, and is reflected at the beam splitter 574 toward a signal detection system that is constituted by the condenser lens 580, HOE 581 and photodetector 582.

In responding to a detection signal generated by the photodetector 582, the amplifier 583 and the error signal processor 584 generate a focus error signal and a tracking error signal respectively. The focus drive circuit 585 and tracking drive circuit 586 use these error signals to drive focus drive coil and tracking drive coil 588, respectively, in such a manner that the position of objective lens 578 is adjusted by moving lens 578 in the optical axis direction and/or in the radius direction of optical disk 579, whereby the relative position of beam spot with respect to the information recorded in optical disk 579 is controlled to attain an stable recording/playback operation. A reproduced information signal is generated from amplifier 583.

The light output control for the laser 571 is as follows. After passed through the beam splitter 574, a part of the light traveling toward the optical disk 579 is separately taken out by utilizing a diffracted light of the reflection diffractive device 575. This diffracted light passes through beam splitter 574, again, and is detected by the photodetector 589. The output of photodetector 589 is supplied through an amplifier 590 to a laser control section 591, which performs a comparison operation with a light output control signal 592 to generate a comparison result. A laser drive 593 causes the current value being supplied to laser 571 to vary in response to the comparison result, thereby to control the light output amount of laser 571. When light output control signal 592 is rendered constant (during a playback operation, for example), laser 571 is also controlled to remain constant in the amount of light output. When control signal 592 varies in accordance with the record information, the light output of laser 571 is controlled so as to vary as signal 592 varies.

In the case where the light emitted by the semiconductor laser 571 has a polarized component other than parallel luminous flux with respect to an active layer of laser 571, the apparatus 500h operates as follows. FIGS. 36A to 36C show several polarization states of input and output lights at the beam splitter 574. FIG. 36A illustrates the polarization state of the input light incident to beam splitter 574, which is substantially the same as that of the light emitted by laser 571. FIG. 36B shows the polarization state of a transmitted light passing though beam splitter 574; FIG. 36C shows that of a reflected light from it. These illustrations indicate the luminous flux division characteristic of beam splitter 574, which forces the transmitted light to exclude any s-polarized components. Due to such a setting, even when the incident light onto beam splitter 574 varies in polarization state, the transmitted light of beam splitter 574 will not vary in polarization state. While almost all the p-polarized components pass through, a part of them is reflected and sent forth as a reflected light together with the s-polarized components. The s-polarized component is present as shown in FIG. 36C; accordingly, when the incident light to beam splitter 574 changes in polarization state, the polarization state of the reflected light from beam splitter 574 changes also. The reflected light will not be identical in polarization state with the transmitted light. For this reason, this light cannot be used for a special purpose. Conventionally, since this light is detected to control the light output of a semiconductor laser, variations in the light amount may accelerated undesirably by light-amount control operations due to an influence of the polarized light variations both in the light traveling toward an optical disk and in the light to be used for the detection for the optical output control.

The transmitted light passing through the beam splitter 574 of FIG. 35 is the lineally-polarized light that has the p-polarized components exclusively. A part of this light is detected using the diffracted light of the reflection diffractive device 575. The diffracted light passes through beam splitter 574 again; even in this case, since only the p-polarized components are permitted to pass through, and since the diffracted light traveling toward the photodetector 589 is essentially equivalent in polarization state to the light toward the optical disk 579, variations in the light amount occurred due to a return light to laser 572 may behaves similarly in a relative manner. By taking account of this fact, the light traveling toward optical disk 579 can be controlled at a desired value by controlling the light output amount of laser 571 on the basis of the output of photodetector 589. For example, in the case of reproducing information from optical disk 579, a constant value is supplied as the light output control 592, causing the output of photodetector 589 to be controlled to maintain constant so that the light traveling toward optical disk 579 also becomes constant in the amount of light.

The miniaturization of an optical head section of the apparatus 500h can be accomplished by arranging the laser 571 and the photodetector 589 so that they are packed into a single housing or package 594, although such packaging does not concern the achievement of the aforementioned advantages of the invention. Laser 571 and photodetector 589 may be arranged separately in position.

The manufacture of the reflection diffractive device 575 will be described with reference to FIG. 37. A transparent substrate SB2 and two parallel light sources LS3, LS4 are positioned as shown. When transparent substrate SB2 is illuminate with lights emitted by parallel light sources LS3, LS4, an interference pattern of reflection type is generated. A photoresist layer is used to fix the generated interference pattern on substrate SB2; as a result, the reflection diffractive device 575 of FIG. 35 is obtained. While the reflection-type interference pattern is created on transparent substrate SB2 of FIG. 37, when parallel light is introduced into substrate SB2 on the right side thereof, a diffracted light takes place.

Figure 38:
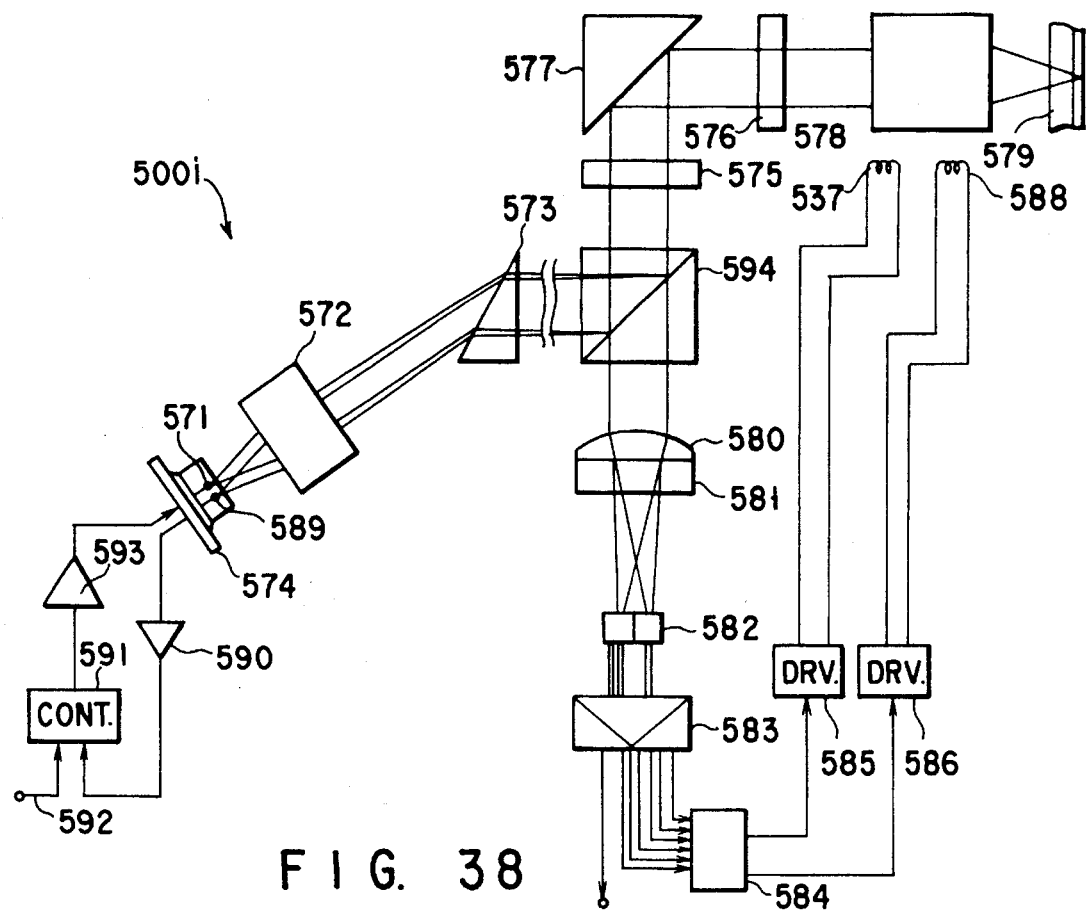
FIGS. 38 to 40 show optical record/playback apparatuses in accordance with other embodiments of the invention.

Another optical record and playback apparatus 500i is shown in FIG. 38. This apparatus differ from the embodiment 500h in that a reflected laser light from the beam splitter 594 is guided to the optical disk 579. Beam splitter 594 of FIG. 38 has an optical characteristic that permits all the p-polarized components to pass through. Laser 571 has an active layer, which is positioned perpendicularly to beam splitter 594. Note in FIG. 38 that the optical system covering from laser 571 to beam reshaping prism 573 and the following optical system are illustrated on the same plane of the drawing for purposes of illustration only; when reduced to practice, either one of such optical systems is rotated by 90 degrees around the optical axis. A diffracted light of the reflection diffractive device 575 is detected for the light output control of laser 571 in substantially the same manner as in the apparatus 500h.

Figure 39:
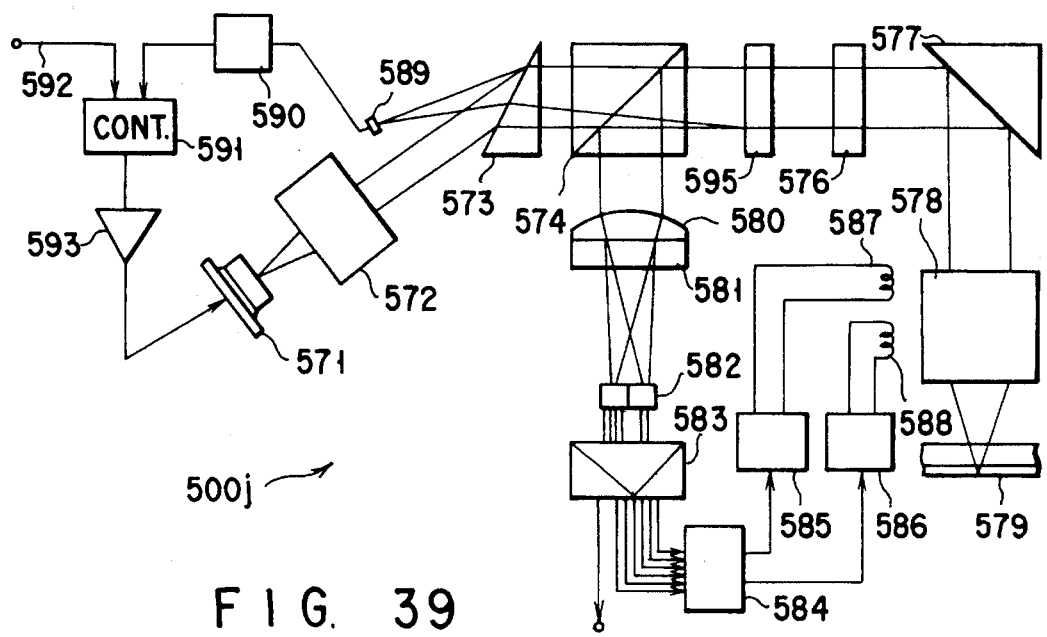

An optical record and playback apparatus 500*j* shown in FIG. 39 differs from the embodiment 500*h* in that (1) the reflection diffractive device 575 being replaced with a reflection diffractive device 595 for generating a diffracted light in the form of a condensed light, and (2) the photodetector 589 is modified in position. More specifically, the diffracted light of reflection diffractive device 595 is arranged to pass through beam splitter 574 again toward photodetector 589. While the diffracted light passes through the beam reshaping prism 573 in FIG. 39, it may alternatively be arranged so that prism 573 is positioned distant from beam splitter 574 causing the diffracted light to bypass prism 573 for the accomplishment of the advantages of the invention. Photodetector 589 detects the diffracted light of reflection diffractive device 595 for the light output control of the semiconductor laser 571.

Figure 40:
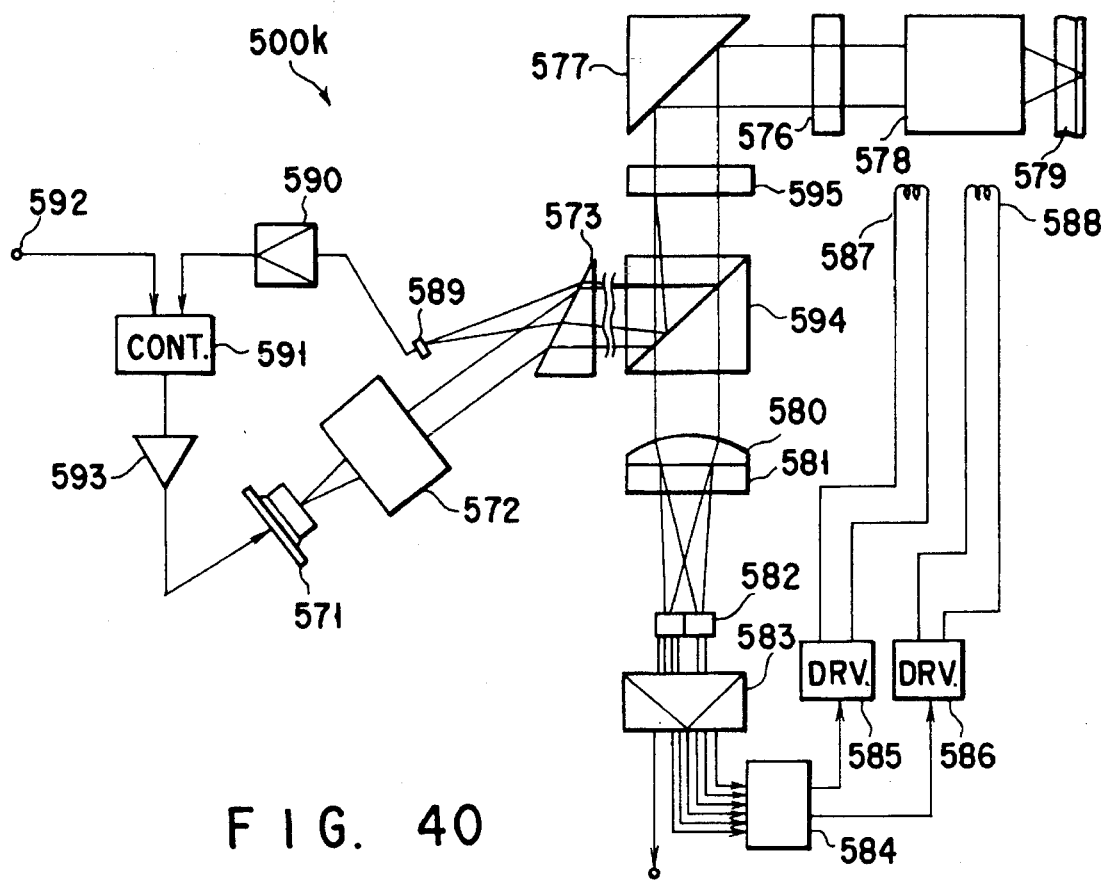

An optical record and playback apparatus 500*k* shown in FIG. 40 differs from the embodiment 500*j* in that the reflected light at the beam splitter 594 is guided to reach the optical disk 579. Beam splitter 594 of FIG. 40 has an optical characteristic that permits all the p-polarized components to transmit. Laser 571 has an active layer that is perpendicular to beam splitter 594. Note in FIG. 40 that the optical system covering from laser 571 to the beam reshaping prism 573 and the following optical system are illustrated on .the same plane of the drawing for purposes of illustration only; when reduced to practice, either one of such optical systems is rotated by 90 degrees around the optical axis. A diffracted light of the reflection diffractive device 595 is detected for the light output control of laser 571 in substantially the same manner as in the apparatus 500*j*. Additionally, in the embodiments 500*h* to 500*k*, the The quarter undulation plate may be omitted as needed.

Figure 41:
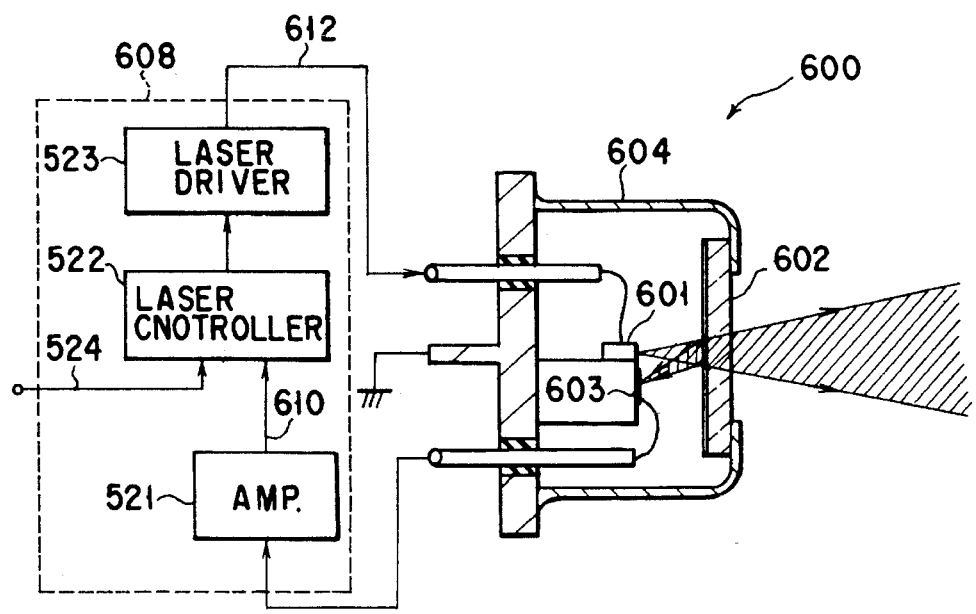
FIG. 41 is a diagram showing an optical output control device in accordance with an embodiment of the invention.

An optical output control device 600 is shown in FIG. 41, which may be preferably applied to the optical record and playback apparatus 500*k* of FIG. 40. The control device 600 includes a semiconductor laser 601, a reflection type diffraction grating device (reflection diffractive element) 602, a photodetector 603, a laser housing or case 604 and a light control section 608. Light controller 608 is provided with an amplifier 521, a laser controller 522 and a laser driver 523 in substantially the same manner as in the embodiment 500 of FIG. 24.

A luminous flux emitted by the semiconductor laser 601 passes through the reflection diffractive element 602 to be divided into a main luminous flux, which will be taken out of the laser case 604, and a reflected/diffracted luminous flux. The main luminous flux is guided from laser case 604 to a well-known optical system for causing the front light of laser to be projected onto an optical disk in substantially the same manner as in the prior art.

On the other hand, the reflected/diffracted light at the reflection diffractive element 602 is condensed onto the photosensitive surface of the photodetector 603 and is detected by photodetector 603. The output of photodetector 603 is amplified by the amplifier 521 up to a suitably selected level. The amplified signal is then supplied to the laser controller 522 as an light output detection signal 610. Laser controller 522 compares this signal 610 with the light output control signal 524 to generate a signal indicative of the difference between the signals, which is supplied to the laser driver 523. Laser driver 523 is arranged to control the drive current for laser 601 in response to the output signal of laser controller 522 by providing laser 601 with a laser drive signal 612.

With such an arrangement, while the semiconductor laser case 604 remains same in size as that of the prior art, it becomes possible to successfully control the light output amount of the laser 601 by detecting, inside case 604, the light that varies similarly as the main luminous flux (which is taken out of case 604 to be used for the actual purpose) varies. This ensures that the optimal adjustment is available for the control system in the independent form of laser 601 being separated from the remaining system components. In addition, the optical path ranging from laser 601 to photodetector 603 is shortened in length while having only one component (i.e., the reflection diffractive element 602) positioned therebetween. This may lead to a reduction in the time delay occurring due to the optical transmission and to a decrease in deviations of device characteristic (which comes from a decrease in the number of required components). Therefore, it is possible to suppress or eliminate the occurrence of variations in the basic control performance among devices actually manufactured. The device is made by causing two light components to be interference with each other, a series of photolithography processes (such as electron-beam pattern generation technique) may alternatively utilized to manufacture the same reflection diffractive device 602, wherein a computation means is employed to generate a pattern equivalent to the interference fringes.

The light controller 608 of FIG. 41 may be modified as shown in FIG. 43. An optical output detection/control section 620 of FIG. 43 has an opto-electric integrated circuit (OEIC) configuration, wherein a light output control section consisting of electric circuits and a photodetector are formed on the same semiconductive substrate. As shown, the main components of the light output controller is arranged in the form of OEIC. Light output detection/control section 620 includes a photodetector 607 coupled to amplifier 521. Photodetector 607 is similar in function to the photodetector 603 of FIG. 41.

An embodiment is shown in FIG. 44, which is an optical output control device using the OEIC of FIG. 43. By causing the optical output detection/control section 620 to be OEIC-arranged and packed in the laser case 604, a resultant optical head section can be decreased in size, improved in usability and enhanced in performance and reliability. In such a case, it is important that, if required, the laser case is provided with output terminals for the gain adjustment and phase compensation for the purposes of optimization of the optical output control system.

Figure 45:
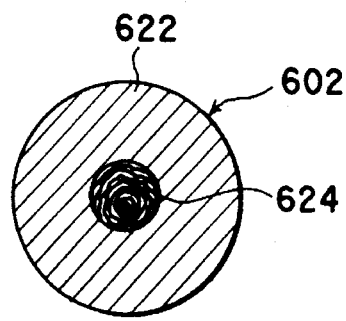
FIG. 45 shows an example of the surface condition of a reflection type diffracting device of FIG. 44.

An exemplary surface condition of the reflection diffractive device 602 is shown in FIG. 45. A light-shielding area 622 is formed in the circular peripheral area of the surface excluding a central area through which the light emitted by the semiconductor laser 601 passes through, thereby to suppress the entrance of an external light onto the photodetector 603 being arranged inside the laser case 604. Light-shielding section 622 is formed on the same surface together with a diffraction grating section 624. Light-shielding section 624 may alternatively be formed a plane externally facing the laser case 604. An opening may also be formed to suitably limit the transmission of light in accordance with the actual usage condition of the semiconductor laser 601.

Figure 46:
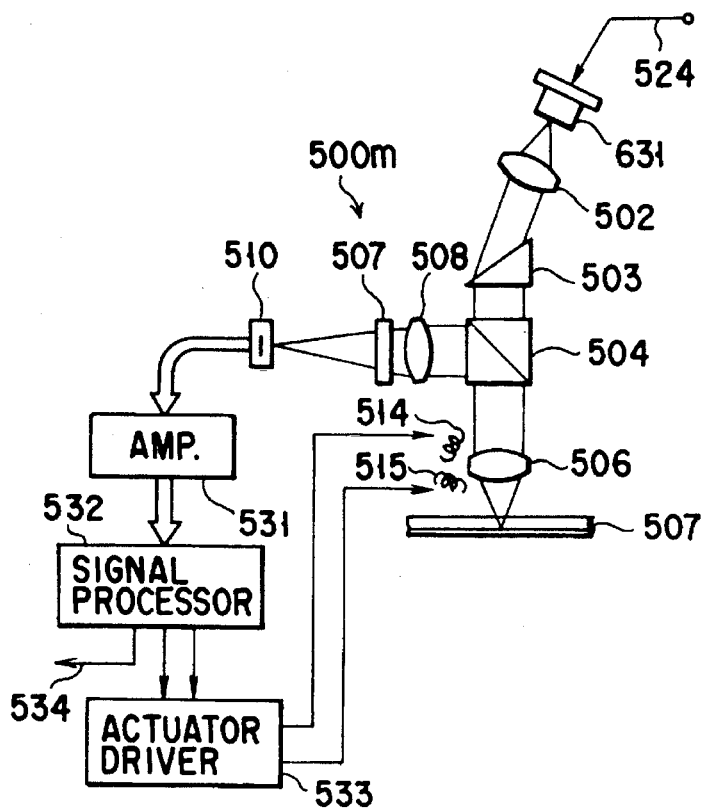
FIG. 46 shows an optical record/playback apparatus using the optical output control device.

Another optical record and playback apparatus 500*m* is shown in FIG. 46, which is arranged employing the light output control device as described above. A semiconductor laser unit 631 contains the light output control device 600 of FIG. 41. A light emitted by laser unit 631 is converted by the collimator lens 502 into a parallel luminous flux, which is then reshaped so that the anisotropic beam shape is changed to isotropic beam shape. After such a beam reshaping, a reshaped light is concentrated by the objective lens 506 to be projected onto the optical disk 507, so that a small beam spot is formed on the recording surface thereof. A reflected light from the recording surface of optical disk 507 passes through objective lens 506 to enter the beam splitter 504. A reflected light at beam splitter 504 is introduced into the signal detection system consisting of the condenser lens 508, HOE 507, photodetector 510. A signal generated by photodetector 510 is supplied through amplifier 532 to the signal processor 532, which generates a reproduced information signal 534, the focus error signal and the tracking error signal. These error signals are supplied through the actuator driver 533 to the focus drive coil 515 and tracking drive coil 514, whereby the position of objective lens 506 is adjusted by moving lens 506 in the optical axis direction and/or in the radius direction of optical disk 507, so that the relative position of beam spot with respect to the information recorded in optical disk 507 is controlled to attain an stable recording/playback operation.

A reflected light from the optical disk 507 returns to the semiconductor laser unit 631 by way of the same optical path along which the light from laser 631 has passed. This return light may influence the light output amount of laser unit 631; however, any variations in the light output amount of laser 631 will not take place by the assistance of the light output control device as arranged as shown in FIG. 41 to operate as described previously. With the light output control device of the present invention being used for the manufacture of an optical equipment, it is possible to extremely reduce variations in the amount of laser light that may occur due to the influence of an externally returned light component. This enables the light output to be well controlled at high accuracy, causing the accuracy of such an optical equipment to be improved successfully.

Figure 47:
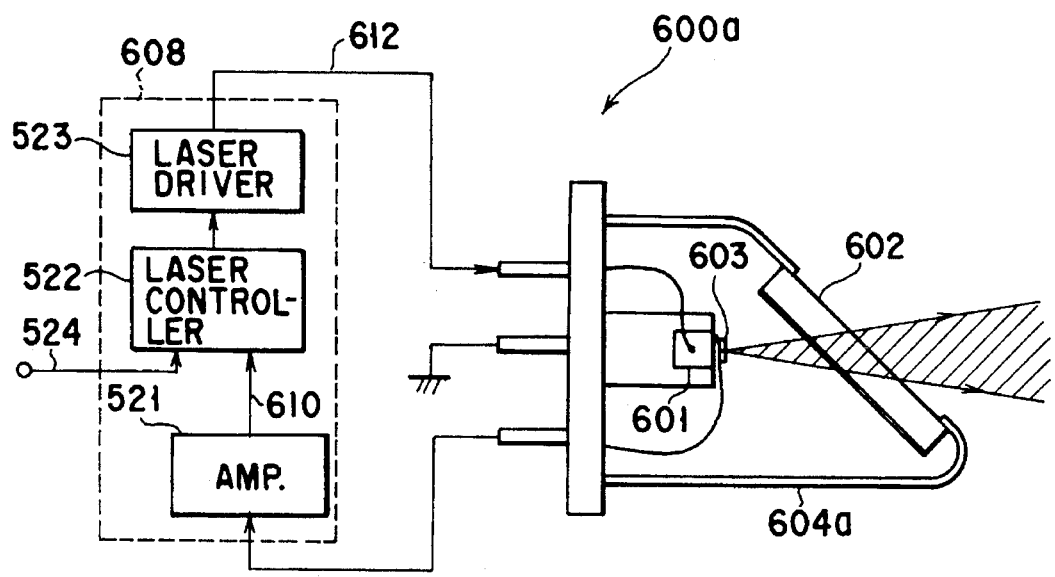
FIG. 47 shows a modification of the embodiment of FIG. 41.
Figure 48:
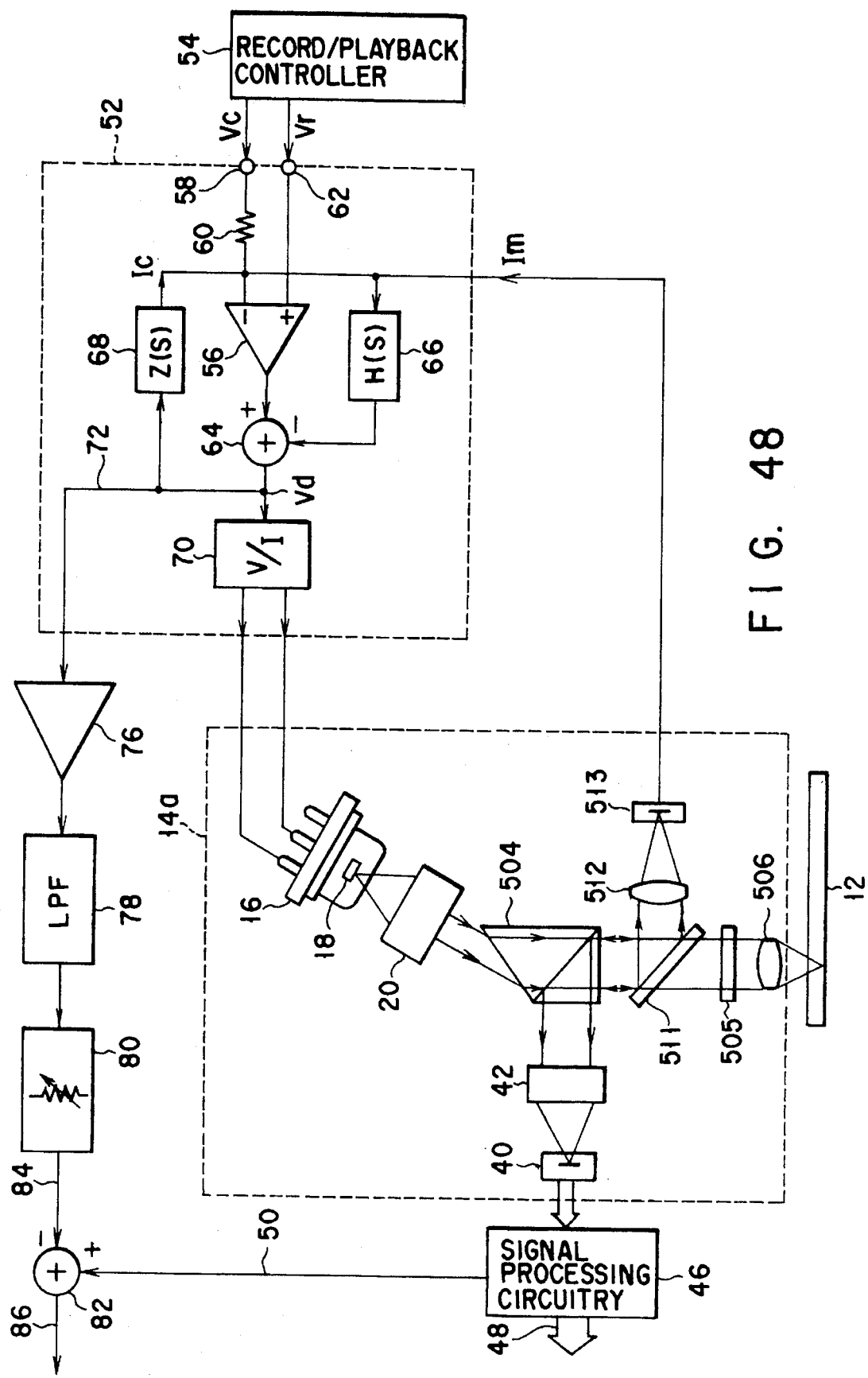
Figure 49:
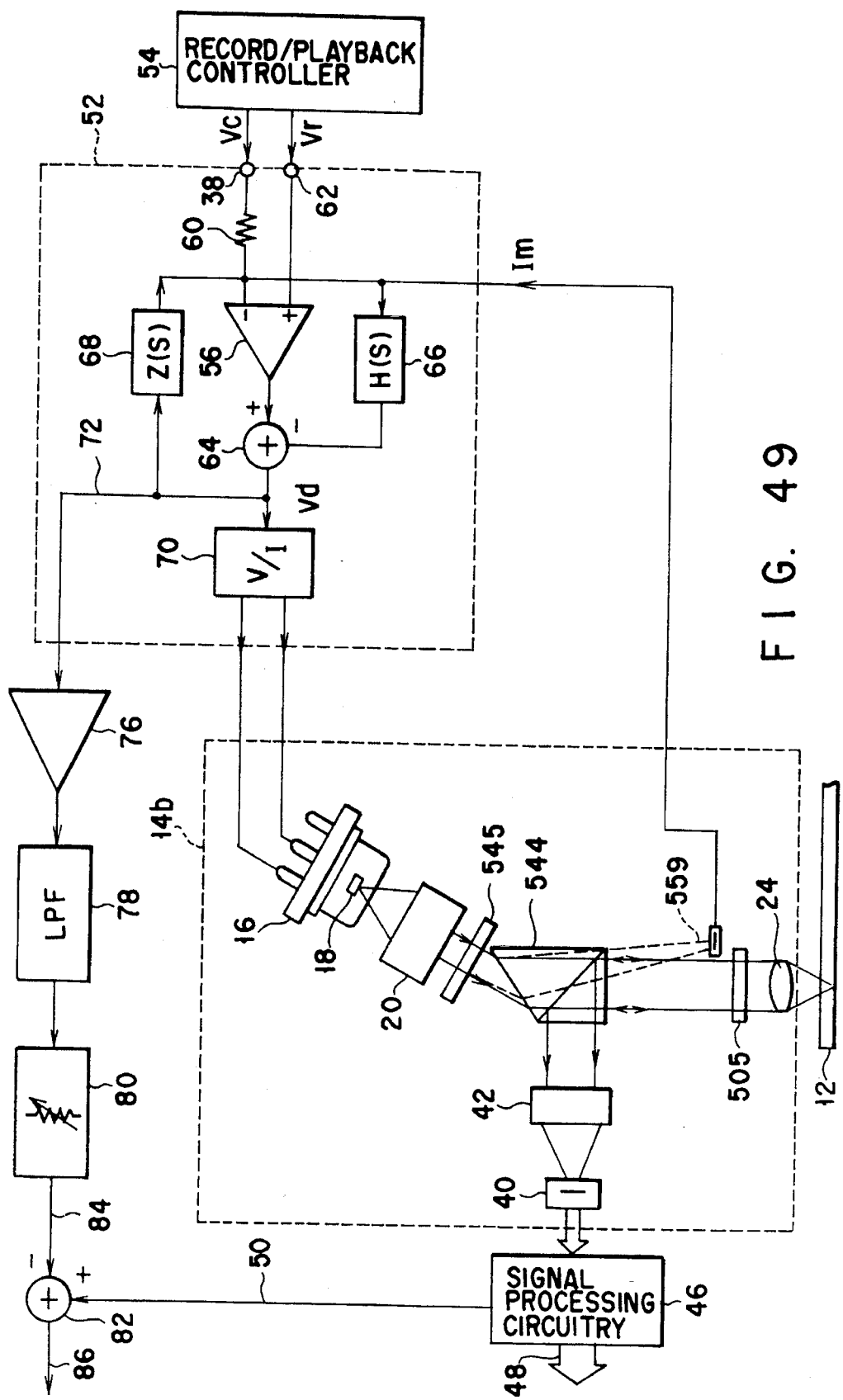
Figure 51:
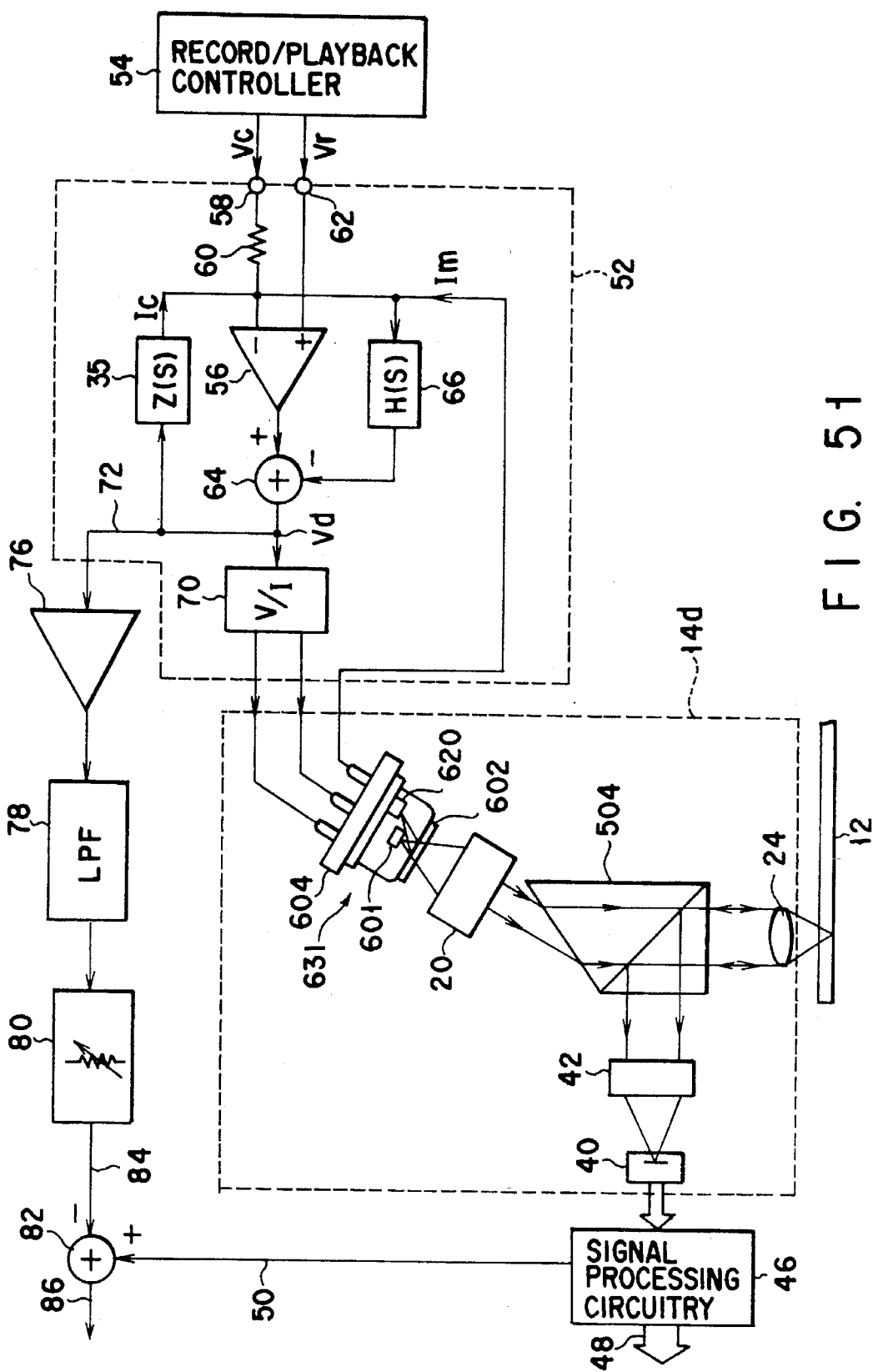

The embodiment 600 of FIG. 41 may be modified as shown in FIG. 47. A light output control device 600a illustrated here is similar to that of FIG. 41 with the laser case 604 being replaced with a laser case 604a, which causes the reflection diffractive device 602 to slant with respect to the semiconductor laser 601. More specifically, reflection type diffraction grating device 602 is specifically positioned so that it is slanted with respect to the optical axis of an optical system along which the main luminous flux externally taken out of the laser case 604a propagates. Diffraction grating 602 is slanted in a specific direction that is parallel with an active layer of laser 601. Such a slanted positioning of diffraction grating 602 can decrease the amount of light that is reflected from the top and bottom surfaces of diffraction grating 602 toward the photosensitive surface of photodetector 603.

Preferably, the slant angle of the reflection type diffraction grating 602 and the thickness of the substrate 614 of FIG. 42 may be determined as follows:

$$\Delta Z = (d/n * \cos i) * (1 - \cos^2 i / \cos^2 i'), \quad (4)$$

where, $\sin i = n * \sin i'$, $\Delta Z$ is the refractive index of the substrate in the oscillation wavelength of semiconductor laser 601, and "d" is the thickness of the substrate. with such an arrangement, the astigmatic difference inherent in the light emitted by laser 601 can be suitably corrected while the light is guided to travel toward an external optical system. The above-described light output control devices may also be used for several optical systems other than the optical record/playback apparatus.

Some system configurations that are resulted from the application of the embodiments 500, 500f, 500j and 500m to optical record and playback apparatus 10b shown in FIG. 4 are illustrated in FIGS. 48 to 51 respectively. An optical head section 14a shown in FIG. 48 employs the corresponding arrangements of FIG. 24 for its main optical system. An optical head section 14b of FIG. 49 uses the corresponding arrangements for its optical system. An optical head section 14c of FIG. 50 uses the main optical system of FIG. 39. An optical head section 14d shown in FIG. 51 employs the arrangements of FIGS. 44 and 46.

Figure 52:
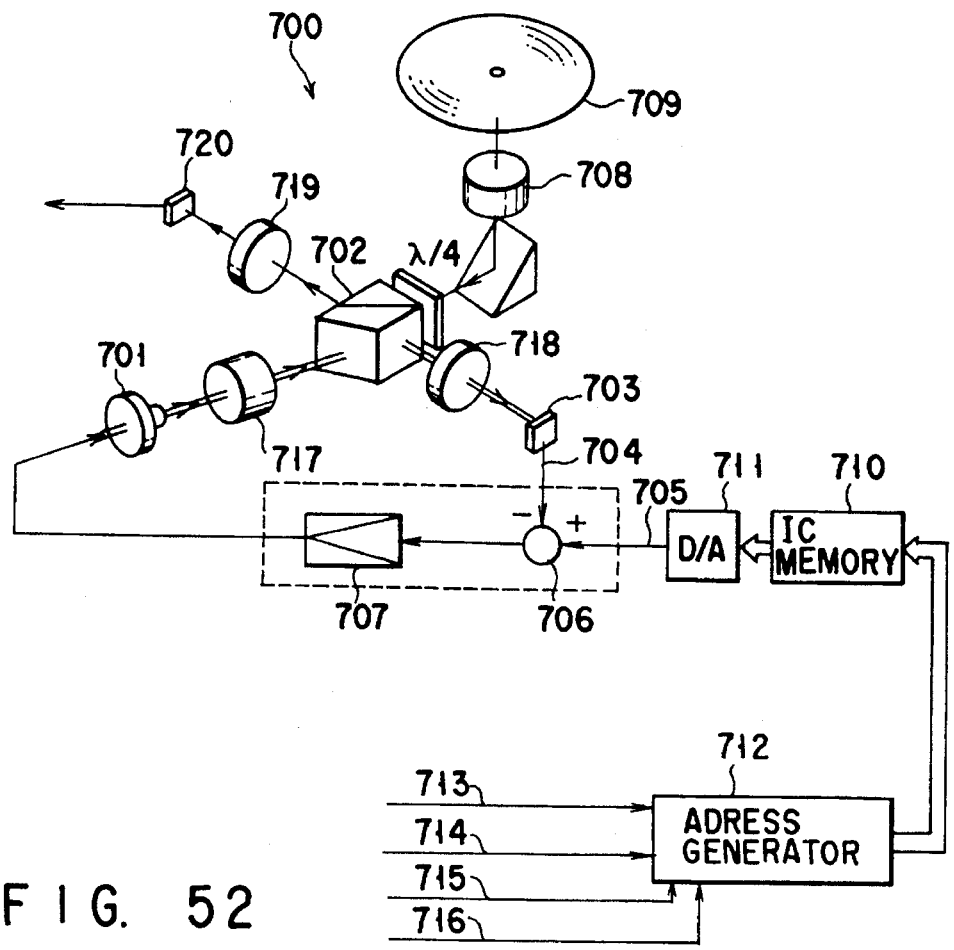
FIG. 52 is a diagram showing an optical disk record/playback system in accordance with an embodiment of the invention.

In an optical disk record/playback apparatus 700 shown in FIG. 52, a light emitted from a semiconductor laser 701 and propagates through a collimator lens 717 toward an object lens 708, is divided by a beam splitter 702. The semiconductor-laser output is sensed at an optical sensor 703. For the semiconductor laser 701, for example, a red laser with a wavelength of 690 nm may be used; a lens of NA=0.6 may be used for the object lens 708, for example.

The difference between the semiconductor laser output sensed signal 704 and the reference optical output signal 705 is sensed at a subtractor 706. The resulting signal is amplified by an compensation amplifier 707 to drive the current in the semiconductor laser 701. The optical output of the semiconductor laser undergoes high-speed feedback control. On the other hand, the light beam passing through the beam splitter 702 and traveling toward the object lens 708 arrives at the optical disk 709 and performs the recording and reproducing of marks there. Because the front laser beam emitted from the semiconductor laser and traveling toward the object lens is divided and sensed to control the optical output of the semiconductor laser, the laser beam output can be controlled accurately.

The waveform of the reference optical output signal 705 is read from a semiconductor memory device 710 and is converted into an analog signal at a D/A converter 711. The semiconductor memory device 710, which stores a plurality of optical output waveforms in the form of digital data, selects the recorded optical output waveform on the basis of various information including the recording radius, the recording linear velocity, the recording signal pattern, and the sensitivity of the recording medium. An address generator 712, based on such information as the recording radius data 713, the recording linear velocity data 714, the recording signal pattern data 715, and the recording medium's sensitivity data 716, determines the recorded optical output waveform to be read and generates the address in which the optical output waveform is recorded. Changing the recorded optical output waveform makes it possible to carry out recording compensation suited for the recorded data pattern.

Figure 53A:
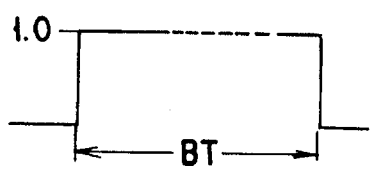
FIGS. 53A and 54A show the waveforms of recording pulse signals.
Figure 53B:
FIGS. 53B and 54B illustrate corresponding mark shapes being associated with temperature distribution patterns.
Figure 54A:
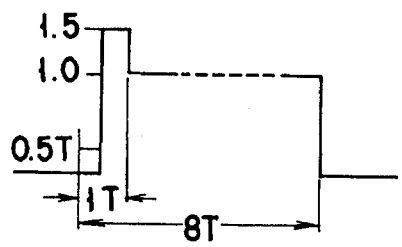
Figure 54B:
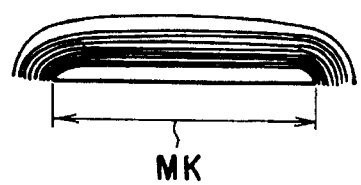

FIGS. 53A and 54A show some recorded optical output waveforms in a case where the thermal conductivity of the optical disk is relatively low, and FIGS. 53B and 54B depict corresponding temperatures (isothermal lines) of the recording medium and the mark shape MK. For an overwrite-type medium whose thermal conductivity is low, such as Ag—TeC, when recording is done with the recording power constant, the temperature gradient at the front of the mark is smaller than that at the back of the mark as shown in FIG. 53B, with the result that jitters at the edge of the mark front are greater. For this reason, the signal-to-noise ratio of the reproduced signal deteriorates. In addition, the recording mark is shaped like a tear. As shown in FIG. 54B, when the recording timing is delayed to increase the recording optical output only during the start of recording, the temperature gradient at the recording mark front becomes greater, which reduces jitters at the mark front, thereby improving the signal-to-noise ration of the reproduced signal. By doing this, the temperature gradient at the mark front can be made greater without changing the mark position. Such a reference optical output waveform as provides the desired recording optical output waveform is recorded in the semiconductor memory device in the form of digital data. If the reading of the digital data takes a long time, the data to be read may be read into a high-speed memory device such as an ECL memory.

Figure 55A:
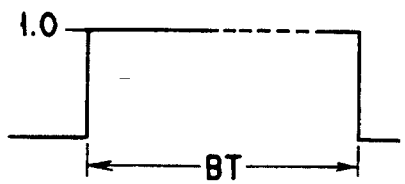
FIGS. 55A and 56A show the waveforms of other recording pulse signals.
Figure 55B:
FIGS. 55B and 56B illustrate corresponding mark shapes being associated with temperature distribution patterns.
Figure 56A:
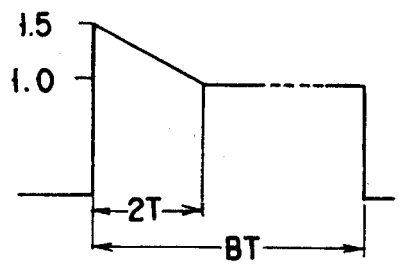
Figure 56B:
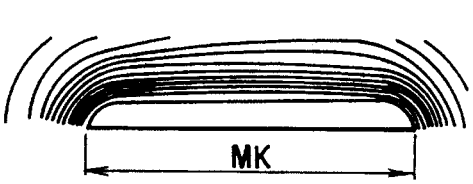

FIGS. 55A and 56A show recorded data pattern in a case where the thermal conductivity of the optical disk is relatively high, and FIGS. 55B and 56B depict corresponding recording mark shapes. When the thermal conductivity is great, for example, when a phase-change medium made of InSbTe is used, the mark is shaped like a teardrop as shown in FIG. 55B. A semiconductor memory device 710 stores such a reference optical output waveform pattern as provides a recording optical output waveform that increases the recording optical output at the start of recording and then decreases it gradually. When the recording optical output is changed as shown in FIG. 56A by reading the reference optical output waveform from the semiconductor memory device 710, the recording mark front is basically identical in shape with the recording mark back, which allows the recording mark to be symmetrical with respect to the recording direction.

With the embodiment 700, recording compensation by the analog change of the recording optical output assures more accurate recording compensation even for a short time recording such as recording on an inner circumference of the optical disk. As a result, a desired accurate recording mark can be obtained. Since the laser optical output is controlled up to the recording signal band at a high speed, laser noise in the recording signal band can be decreased. Further, because the recording laser output waveform is controlled by the reference optical output signal, the recording power can be stabilized against a change in the ambient temperature, with the result that a medium with a small power margin such as an overwrite recording medium can be written into at an improved signal-to-noise ratio.

Figure 57:
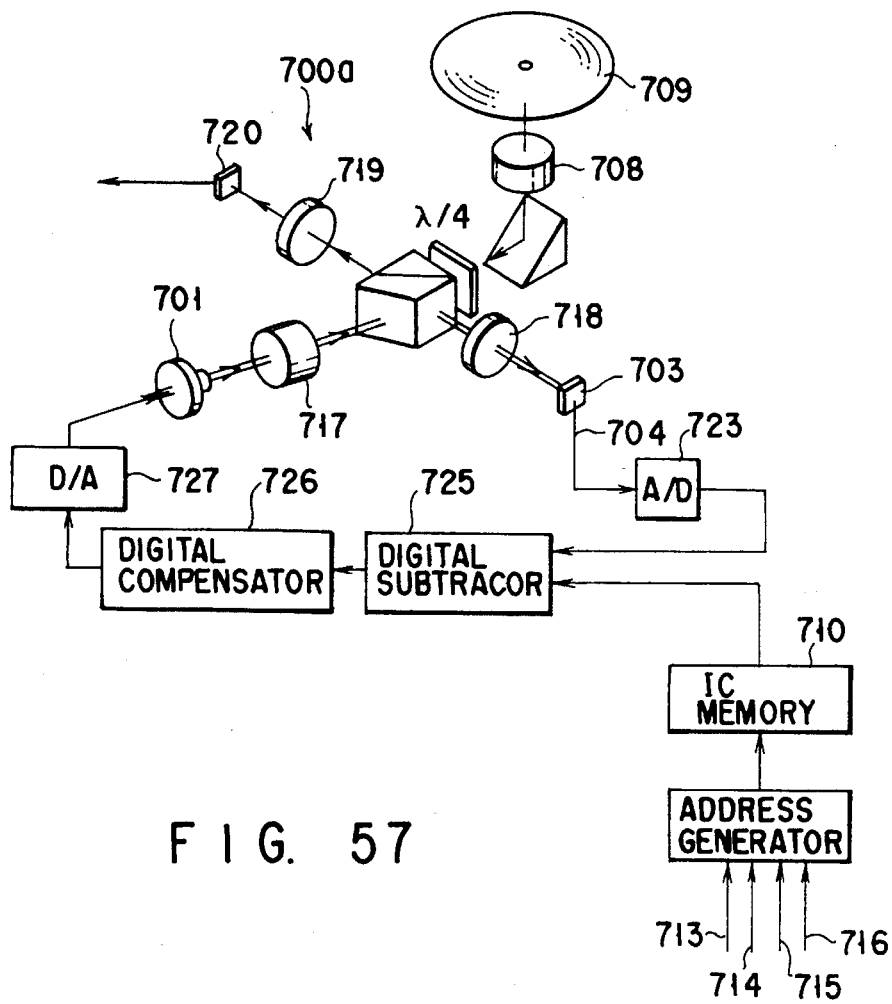

An optical disk record/playback apparatus 700a shown in FIG. 57 is similar to that of FIG. 52 with the subtractor 706, compensation amplifier 707 and digital-to-analog (DA) converter 711 of FIG. 52 being replaced with an analog-to-digital (AD) converter 723, a digital subtractor 725, a digital compensating processor 726 and a DA converter 727. AD converter 723 has an input connected to the photodetector 703 and an output connected to a first input of subtractor 725. A second input of subtractor 725 is connected to the semiconductor IC memory device 710. The output of subtractor 725 is connected to the laser 701 by way of digital compensator 726 and DA converter 727.

The photodetector 703 generates a detection signal 704, which indicative of the actual output of the front light emitted by the laser 701. Detection signal 704 is converted by the AD converter 723 into a corresponding digital data. The subtractor 725 subtracts this digital data from a reference light output waveform data that is generated in response to a presently selected address being supplied from IC memory 710 to the second input of subtractor 725. The output of subtractor 725 is subjected to a compensation processing made by the digital compensator 726. A compensated signal is then converted by the DA converter 727 into a corresponding analog signal. The converted analog signal is used as a drive signal for the laser 701. With such an arrangement, a maximally optimized recording compensation can be attained for an recording data pattern, by causing the recording light output waveform to vary suitably.

An optical disk record/playback apparatus 700b shown in FIG. 58 is similar to that of FIG. 57 with the address generator 712, subtractor 725 and compensator 726 being replaced with a microcomputer 730, which is associated with the IC memory device 710, AD converter 723 and DA converter 727. Microcomputer achieves the compensation function as previously described with respect to the embodiment 700a on the basis of software processing technique.

Figure 59:
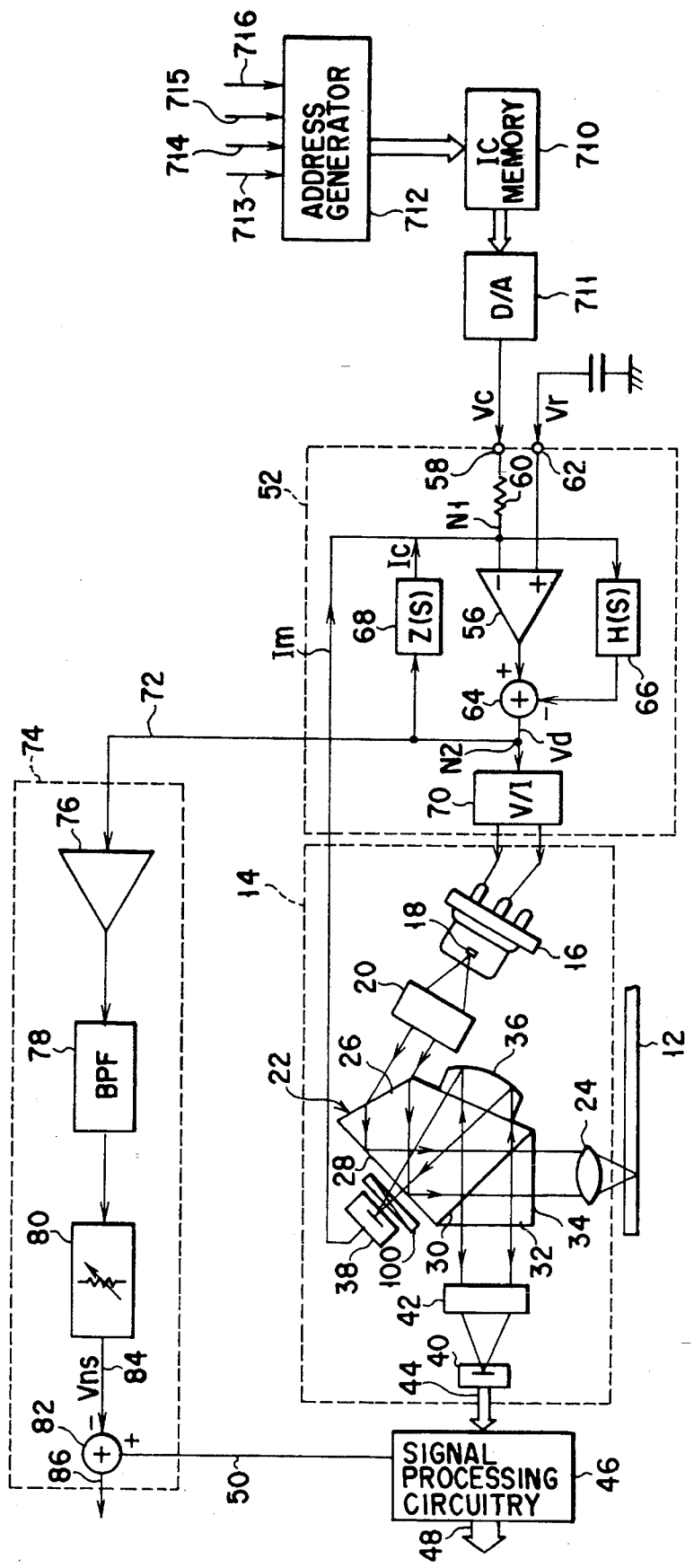
FIG. 59 shows the overall arrangement of an optical record/playback apparatus that employs the recording compensation section typically shown in FIG. 52.

When the recording compensation section shown in FIG. 52 is assembled into the optical record/playback apparatus of FIG. 4, the overall view of a resultant system configuration is shown in FIG. 59. More specifically, the record/playback controller 54 is replaced with the recording compensation section of FIG. 52 including the address generator 712, IC memory device 710 and DA converter 711. With this optical record/playback apparatus, the output of DA converter 711 is supplied as the control signal Vc to the first input terminal 58 of laser control circuit 52. The second input terminal of circuit 52 is capacitively coupled to the ground potential.

What is claimed is:

1. An apparatus for suppressing or eliminating a noise from a reproduced information signal read out of an optical record carrier body using a solid-state light emission device, said apparatus comprising:

driver means for receiving a control voltage signal externally supplied thereto to designate a light emission of said light emission device, and for supplying said light emission device with a corresponding drive current signal in response to the control signal;

optical detector means for partially receiving a light sent forth from said light emission device, and for generating a detection current signal corresponding in magnitude to a detected amount of light;

compensator means coupled to said driver means and said optical detector means, for generating a voltage signal that compensates for a possible variation in the light sent forth from said light emission device, which is supplied to said driver means;

signal processing means connected to said compensator means, for electrically modifying said voltage signal so that it indicates a residual laser noise component in the light sent forth from said light emission device, and for generates an electrical laser-noise extraction signal; and noise reduction means connected to said signal processing means, for receiving the laser-noise extraction signal and the reproduced information signal, for using said laser-noise extraction signal as a noise monitor signal, and for subtracting this noise monitor signal from said reproduced information signal to generate a noise-suppressed reproduction signal.

2. The apparatus according to claim 1, wherein said compensator means comprises:

an operational amplifier having an inverting input at which said detection signal is supplied, a non-inverting input and an output;

feed-forward correction amplifier having an input connected to the inverting input of said operational amplifier, and an output; and adder means connected to the output of said operational amplifier and the output of said correction amplifier, for generating an output signal, which is supplied to said light emission device.

3. The apparatus according to claim 1, wherein said compensator means comprises an amplifier having an input at which said detection signal is supplied and generates an output signal which is supplied to said light emission device, and said signal processing means comprises equalizer means connected to said amplifier, for receiving an output signal of said amplifier, and for processing said output signal using an inverse characteristic of an open-loop transmission characteristic inherent in said amplifier.

4. The apparatus according to claim 3, wherein said equalizer means includes an equalizing filter circuit.

5. The apparatus according to claim 1, wherein said signal processing means comprises:

gain control means for receiving said voltage signal, and for performing a gain adjusting operation with respect to said voltage signal.

6. The apparatus according to claim 5, wherein said signal processing means further comprises:

an equalizing filter circuit connected to said gain control means.

7. The apparatus according to claim 6, wherein said gain control means includes an auto-gain adjustment circuit.

8. The apparatus according to claim 1, wherein said signal processing means comprises:

a delay circuit connected to said compensator means.

9. The apparatus according to claim 5, wherein said signal processing means further comprises:

a current-mirror circuit connected to said gain control means and said optical detector means.

10. An apparatus for suppressing or eliminating a noise from a reproduced information signal read out of an optical record carrier body using a solid-state light emission device, said apparatus comprising:

driver means for receiving a control voltage signal externally supplied thereto to designate a light emission of said light emission device, and for supplying said light emission device with a corresponding drive current signal in response to the control signal;

optical detector means for partially receiving a light sent forth from said light emission device, and for generating a detection current signal corresponding in magnitude to a detected amount of light;

compensator means coupled to said driver means and said optical detector means, for generating a voltage signal that compensates for a possible variation in the light sent forth from said light emission device, which is supplied to said driver means;

noise reduction means for receiving the voltage signal and the reproduced information signal, for using said voltage signal as a noise monitor signal, for subtracting this noise monitor signal from said reproduced information signal to generate a noise-suppressed reproduction signal; and optical means coupled to said optical detector means, for causing a first optical system associated with said optical detector means to be equivalent in optical condition with a second optical system for reproduction of the information signal.

11. The apparatus according to claim 10, wherein said compensator means comprises:

an operational amplifier having an inverting input at which said detection signal is supplied, a non-inverting input and an output;

feed-forward correction amplifier having an input connected to the inverting input of said operational amplifier, and an output; and adder means connected to the output of said operational amplifier and the output of said correction amplifier, for generating an output signal, which is supplied to said light emission device.

12. The apparatus according to claim 10, wherein said optical means comprises:

first optical separator means for allowing the light sent forth from said light emission device to go toward said optical record carrier body, for receiving a light reflected from said optical record carrier body, and for extracting a first light component from the reflected light so that the first light component travels along a first path; and second optical separator means for extracting a second light component from the light sent forth from said light emission device, and for allowing the second light component to travel along a second path so that said extracted light component is incident onto said optical detector means.

13. The apparatus according to claim 12, wherein said second optical separator means is arranged between said first optical separator means and said optical record carrier body.

14. The apparatus according to claim 13, wherein said second optical separator means comprises a beam splitter.

15. The apparatus according to claim 13, wherein said second optical separator means comprises a diffractive element.

16. The apparatus according to claim 15, wherein said diffractive element is a reflection type diffraction grating device.

17. The apparatus according to claim 15, wherein said diffractive element is a transparent type diffraction grating device.

18. The apparatus according to claim 16, wherein said solid-state light emission device and said optical detector means are arranged in a single package.

19. The apparatus according to claim 12, wherein said second optical separator means is arranged between said light emission device and said first optical separator means.

20. The apparatus according to claim 19, wherein said second optical separator means comprises a transparent type diffraction grating device which focuses diffracted light.

21. The apparatus according to claim 12, wherein said second optical separator means is positioned in front of said light emission device.

22. The apparatus according to claim 21, wherein said second optical separator means, said solid-state light emission device, and said optical detector means are arranged in a single package.

23. The apparatus according to claim 21, wherein said solid-state light emission device and said optical detector means are formed as a single integrated circuit.

24. The apparatus according to claim 21, wherein said second optical separator means is inclined to an optical axis of said solid-state emission device.

25. An optical record and reproduction apparatus for recording an information on an optical record carrier body, said apparatus comprising:

a solid-state light emission device;

control means coupled to said light emission device, for controlling said light emission device so that said device sends forth a light beam indicative of information to be recorded;

optical guide means for optically dividing the light beam into a first component and a second component, for causing the first component to be introduced onto said carrier body as a recording beam, and for causing the second component to propagate along a preselected path;

optical detector means for at least partially receiving the second component of said light beam, and for generating a detection signal corresponding in magnitude to a detected amount of light;

reference signal generator means having storage means for storing a plurality of reference signals indicative of preselected optical output data for said light emission device, and selector means for selecting a suitable reference signal from the reference signals stored in said storage means in accordance with the information to be recorded presently; and subtraction means connected to said control means, said optical detector means and said selector means, for providing an electrical difference signal indicative of a difference in magnitude between the reference signal selected by said selector means and the detection signal of said optical detector means, and for causing said difference signal to be supplied to said control means as a light emission control signal.

26. The apparatus according to claim 25, wherein said reference signal generator means comprises:

externally accessible storage means for storing said plurality of reference signals at internal addresses; and selector means connected to said storage means, for receiving external signals specifying some conditions of a recording of the information being presently performed, and for selecting one reference signal that meets these conditions.

27. The apparatus according to claim 26, wherein said storage means includes a semiconductor memory device.

28. The apparatus according to claim 26, wherein said selector means includes a microcomputer.

29. An apparatus for suppressing or eliminating noise from a reproduced information signal read out of an optical record carrier body using a solid-state light emission device, said apparatus comprising:

driver means for receiving a control voltage signal externally supplied thereto to control alight emission of said light emission device, and for supplying said light emission device with a corresponding drive current signal in response to the control voltage signal;

optical detector means for partially receiving light emitted from said light emission device, and for generating a detection current signal corresponding in magnitude to a detected amount of light;

compensator means, coupled to said driver means and said optical detector means, for generating a voltage signal that compensates for a possible variation in the light emitted from said light emission device, which is supplied to said driver means;

noise reduction means for receiving the voltage signal and the reproduced information signal, for using said voltage signal as a noise monitor signal, and for subtracting said noise monitor signal from said reproduced information signal to generate a noise-suppressed reproduction signal; and optical means optically coupled to and positioned in front of said optical detector means, for causing a first optical system associated with said optical detector means to have an equivalent optical condition as a second optical system for reproduction of the information.

30. The apparatus according to claim 29, wherein said optical means, said solid-state light emission device, and said optical detector means are arranged in a single package.

31. The apparatus according to claim 29, wherein said solid-state light emission device and said optical detector means are formed as a single integrated circuit.

32. The apparatus according to claim 29, wherein said optical means is inclined to an optical axis of said solid-state light emission device.

* * * * *